United States Patent
Heo et al.

(10) Patent No.: US 11,997,862 B2
(45) Date of Patent: May 28, 2024

(54) DISPLAY DEVICE

(71) Applicant: LG Display Co., Ltd., Seoul (KR)

(72) Inventors: JoonYoung Heo, Paju-si (KR); Daehee Kim, Paju-si (KR); JiYoung Park, Paju-si (KR); YoungHoon Son, Paju-si (KR); Hyeju Choi, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 1003 days.

(21) Appl. No.: 16/725,529

(22) Filed: Dec. 23, 2019

(65) Prior Publication Data

US 2020/0212336 A1    Jul. 2, 2020

(30) Foreign Application Priority Data

Dec. 27, 2018   (KR) .......................... 10-2018-0171212
Jul. 10, 2019   (KR) .......................... 10-2019-0083106

(51) Int. Cl.
*H10K 50/15* (2023.01)
*G02B 27/01* (2006.01)
(Continued)

(52) U.S. Cl.
CPC ............. *H10K 50/15* (2023.02); *H10K 50/11* (2023.02); *H10K 50/16* (2023.02); *H10K 50/17* (2023.02);
(Continued)

(58) Field of Classification Search
None
See application file for complete search history.

(56) References Cited

U.S. PATENT DOCUMENTS

| 8,896,201 B2 * | 11/2014 | Yoon ....................... B82Y 10/00 |
| | | 313/506 |
| 2009/0179556 A1 * | 7/2009 | Kim ....................... H10K 50/14 |
| | | 313/504 |

(Continued)

FOREIGN PATENT DOCUMENTS

| CN | 10601902 A | * 8/2016 |
| CN | 106019602 A | * 8/2016 |
| KR | 10-2015-0077284 A | 7/2015 |

*Primary Examiner* — Nishath Yasmeen
(74) *Attorney, Agent, or Firm* — POLSINELLI PC

(57) ABSTRACT

A display device comprises a substrate provided with a first subpixel and a second subpixel adjacent to the first subpixel, a first electrode provided on the substrate, including a first sub electrode provided on the first subpixel and a second sub electrode provided on the second subpixel, an organic light emitting layer including a first organic light emitting layer arranged on the first sub electrode and a second organic light emitting layer arranged on the second sub electrode, a second electrode arranged on the organic light emitting layer, and a first bank provided between the first sub electrode and the second sub electrode, partitioning the first subpixel from the second subpixel, wherein the first organic light emitting layer includes a light emitting layer and a first hole transporting layer arranged on the light emitting layer, the first hole transporting layer includes a first sub hole transporting layer and a second sub hole transporting layer, and the first sub hole transporting layer of the first hole transporting layer covers the light emitting layer between the light emitting layer and the second sub hole transporting layer. Therefore, as the first sub hole transporting layer is provided to cover the light emitting layer of the organic light emitting layer, the organic light emitting layer may be prevented from being damaged by an exposure process or a solution process, whereby a defect rate of the complete display device may be reduced.

20 Claims, 43 Drawing Sheets

(51) Int. Cl.
*H10K 50/11* (2023.01)
*H10K 50/16* (2023.01)
*H10K 50/17* (2023.01)
*H10K 50/858* (2023.01)
*H10K 59/122* (2023.01)
*H10K 101/40* (2023.01)

(52) U.S. Cl.
CPC ......... *H10K 50/858* (2023.02); *H10K 59/122* (2023.02); *G02B 27/017* (2013.01); *G02B 2027/0178* (2013.01); *H10K 2101/40* (2023.02)

(56) References Cited

U.S. PATENT DOCUMENTS

| | | | |
|---|---|---|---|
| 2011/0215308 A1* | 9/2011 | Im | H10K 85/636 257/E51.027 |
| 2014/0110687 A1* | 4/2014 | Yamada | C07C 13/62 585/27 |
| 2016/0118597 A1* | 4/2016 | Itoi | C09K 11/025 257/40 |
| 2016/0155943 A1* | 6/2016 | Sasaki | H10K 85/636 |
| 2017/0373251 A1* | 12/2017 | Hummert | H10K 85/654 |
| 2018/0026207 A1* | 1/2018 | Takeda | C07D 209/86 548/444 |

* cited by examiner

DISPLAY DEVICE

CROSS REFERENCE TO RELATED APPLICATION

This application claims the benefit of Korean Patent Application Nos. 10-2018-0171212 and 10-2019-0083106, respectively filed on Dec. 27, 2018 and Jul. 10, 2019, which are hereby incorporated by reference in their entirety.

BACKGROUND

Field of the Disclosure

The present disclosure relates to a display device displaying an image.

Description of the Background

With the advancement of the information age, the demand for a display device for displaying an image has increased with various forms. Therefore, various types of display devices such as a liquid crystal display (LCD) device, a light emitting display device, an organic light emitting display device, a micro light emitting display device, and a quantum dot light emitting display (QLED) device have been recently used.

For an organic light emitting display device, in the case that FMM technology is used to form red, green and blue pixels of an organic light emitting layer, it is possible to manufacture a small-to-medium panel by a mask shadow but it is difficult to apply a large area to this panel for a problem of sagging of a deposition mask. Even in the case that a panel is manufactured using FMM, there is a limitation to reduce a size per pixel and therefore it is difficult to apply ultra-high resolution to the panel.

SUMMARY

The present disclosure has been made in view of the above problems, and the present disclosure provides a display device that can prevent element characteristics of an organic light emitting layer from being deteriorated.

In accordance with an aspect of the present disclosure, the above and other aspects can be accomplished by the provision of a display device comprising a substrate provided with a first subpixel and a second subpixel adjacent to the first subpixel, a first electrode provided on the substrate, including a first sub electrode provided on the first subpixel and a second sub electrode provided on the second subpixel, an organic light emitting layer including a first organic light emitting layer arranged on the first sub electrode and a second organic light emitting layer arranged on the second sub electrode, a second electrode arranged on the organic light emitting layer, and a first bank provided between the first sub electrode and the second sub electrode, partitioning the first subpixel from the second subpixel, wherein the first organic light emitting layer includes a light emitting layer and a first hole transporting layer arranged on the light emitting layer, the first hole transporting layer includes a first sub hole transporting layer and a second sub hole transporting layer, and the first sub hole transporting layer of the first hole transporting layer covers the light emitting layer between the light emitting layer and the second sub hole transporting layer.

In the display device according to the present disclosure, as the first sub hole transporting layer is provided to cover the light emitting layer of the organic light emitting layer, the organic light emitting layer may be prevented from being damaged by an exposure process or a solution process, whereby a defect rate of the complete display device may be reduced.

In addition to the effects of the present disclosure as mentioned above, additional aspects s and features of the present disclosure will be clearly understood by those skilled in the art from the following description of the present disclosure.

BRIEF DESCRIPTION OF THE DRAWINGS

The accompanying drawings, which are included to provide a further understanding of the disclosure and are incorporated in and constitute a part of the disclosure, illustrate aspect(s) of the disclosure and along with the description serve to explain the principle of the disclosure.

In the drawings.

DETAILED DESCRIPTION DISCLOSURE

Figure 1:
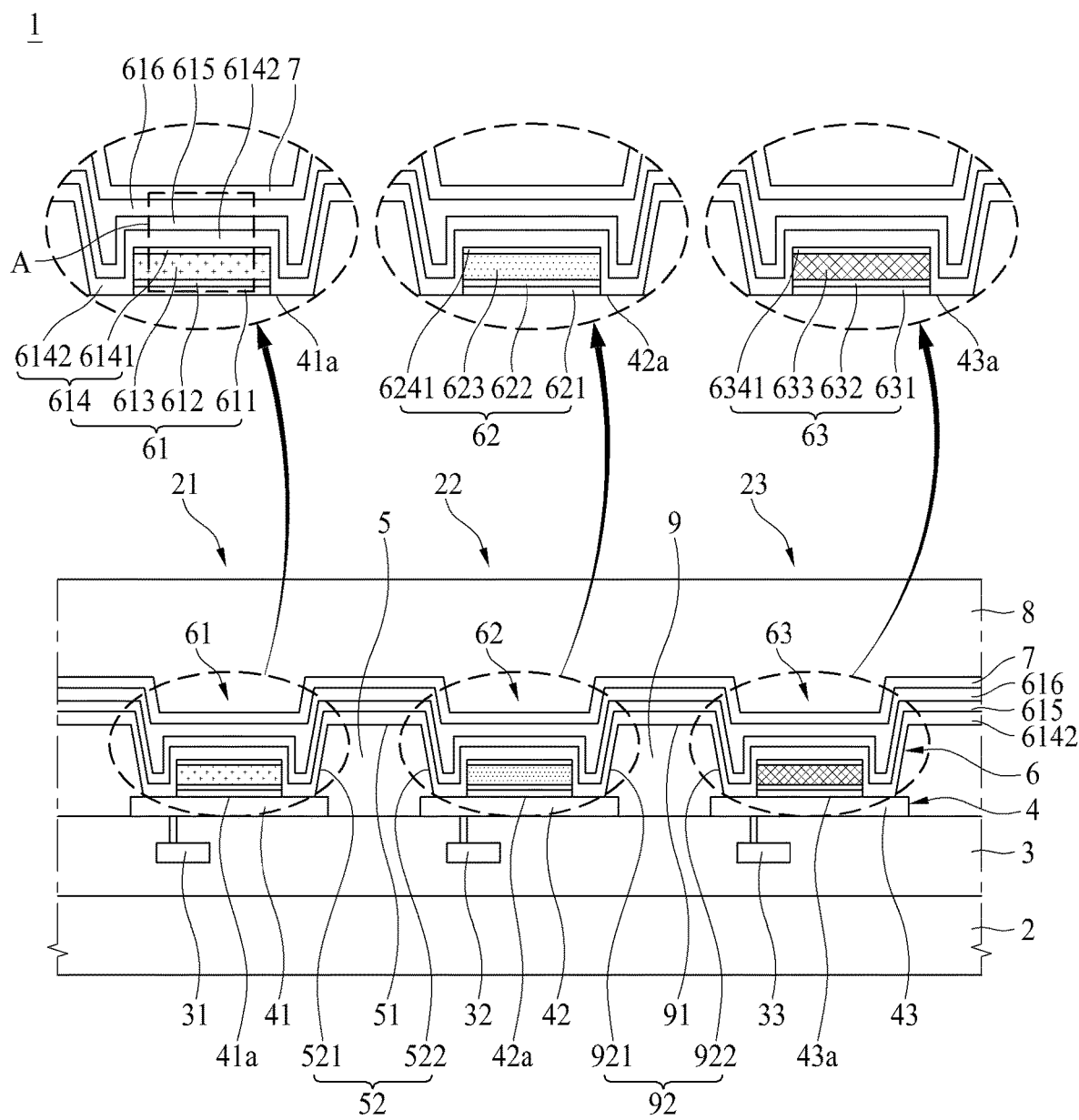
FIG. 1 is a cross-sectional view illustrating a display device according to a first aspect of the present disclosure.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing aspects of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

It will be understood that, although the terms "first", "second", etc. may be used herein to describe various elements, these elements should not be limited by these terms. These terms are only used to partition one element from another. For example, a first element could be termed a second element, and, similarly, a second element could be termed a first element, without departing from the scope of the present disclosure.

In describing elements of the present disclosure, the terms "first", "second", etc. may be used. These terms are intended to identify the corresponding elements from the other elements, and basis, order, or number of the corresponding elements are not limited by these terms. The expression that an element is "connected" or "coupled" to another element should be understood that the element may directly be connected or coupled to another element but may directly be connected or coupled to another element unless specially mentioned, or a third element may be interposed between the corresponding elements.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

Hereinafter, the aspects of the display device according to the present disclosure will be described in detail with reference to the accompanying drawings. Wherever possible, the same reference numbers will be used throughout the drawings to refer to the same or like parts.

Figure 2A:
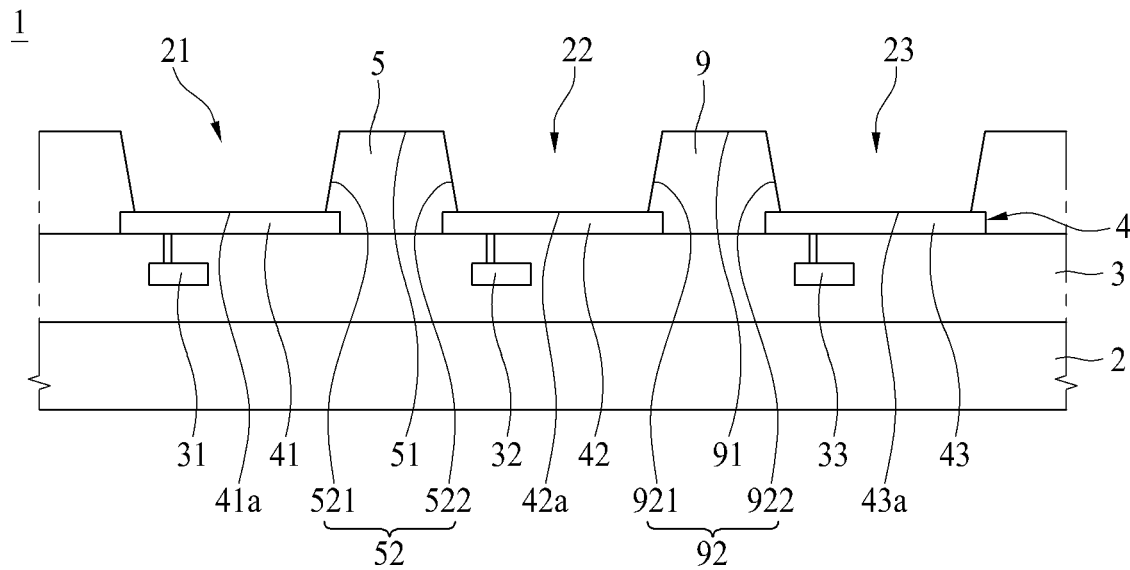
FIGS. 2A to 2P are cross-sectional views illustrating a manufacturing process of a display device according to the first aspect of the present disclosure.
Figure 2B:
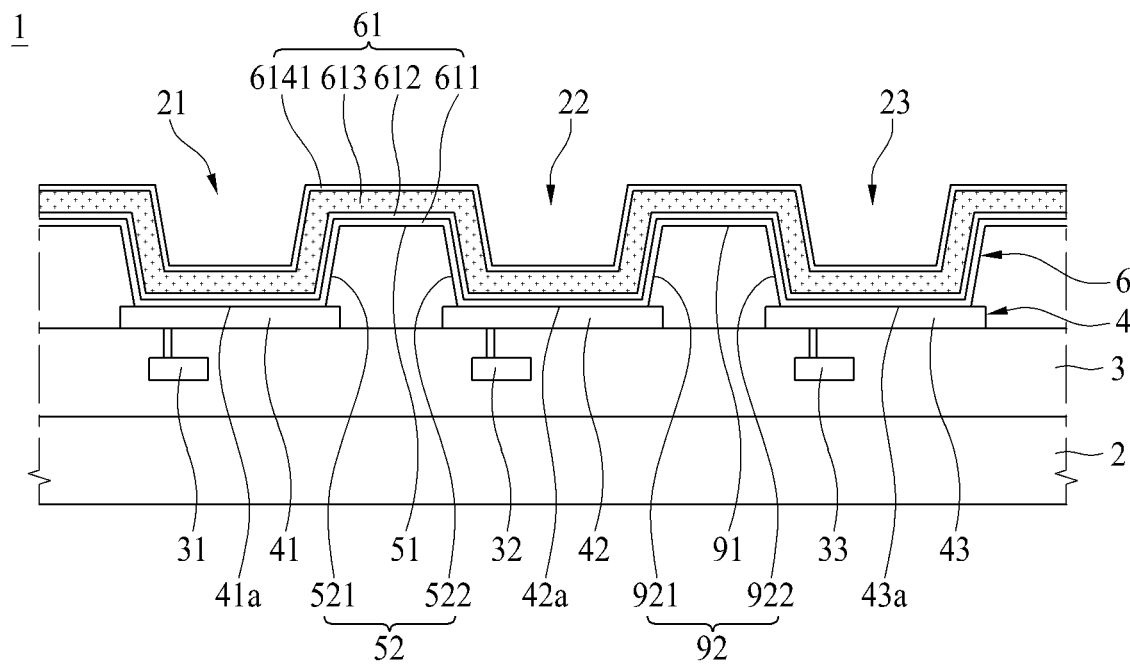
Figure 2C:
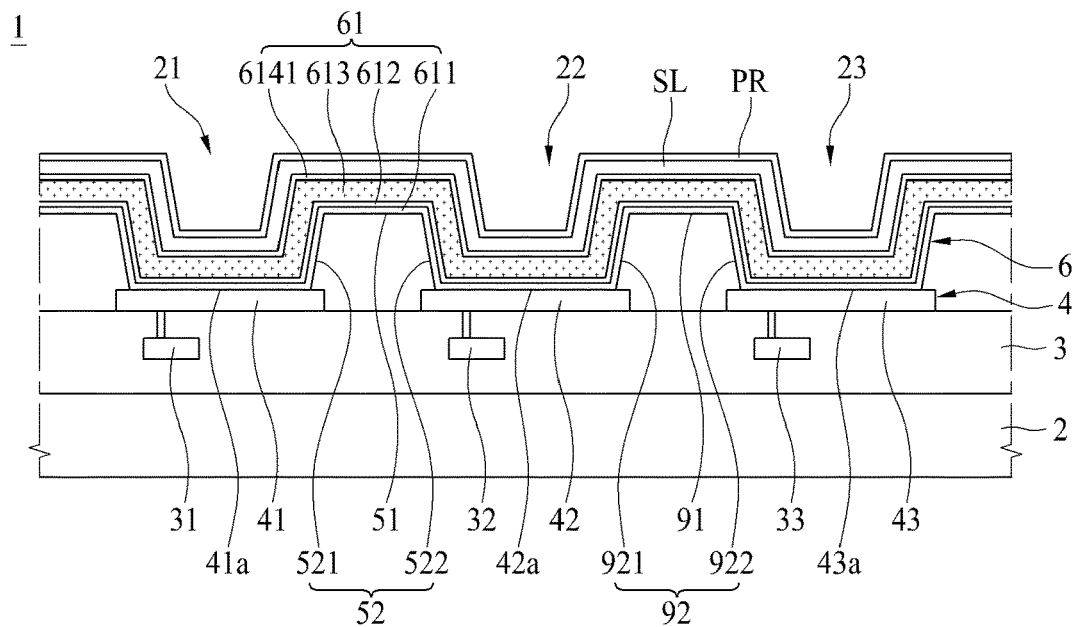
Figure 2D:
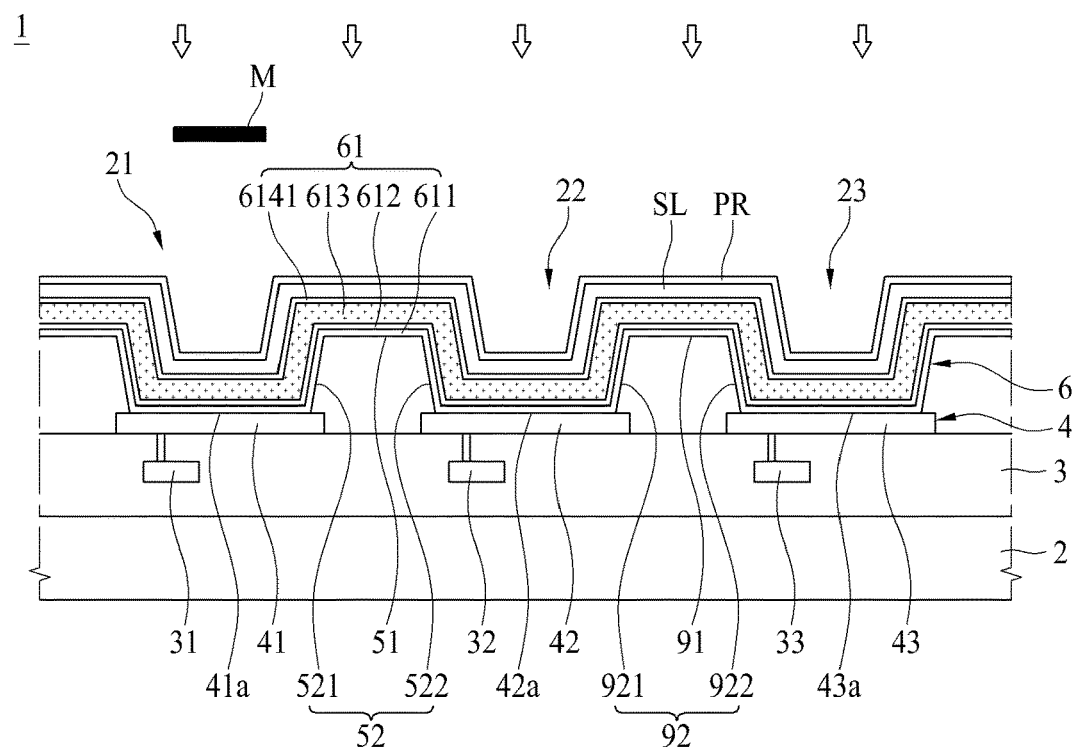
Figure 2E:
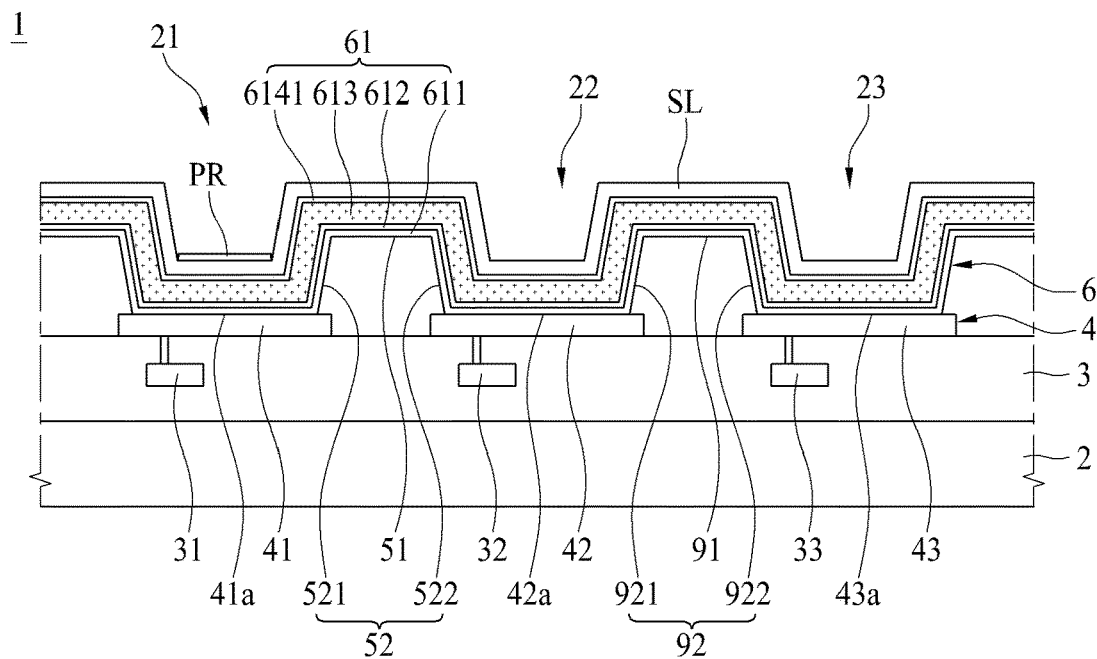
Figure 2F:
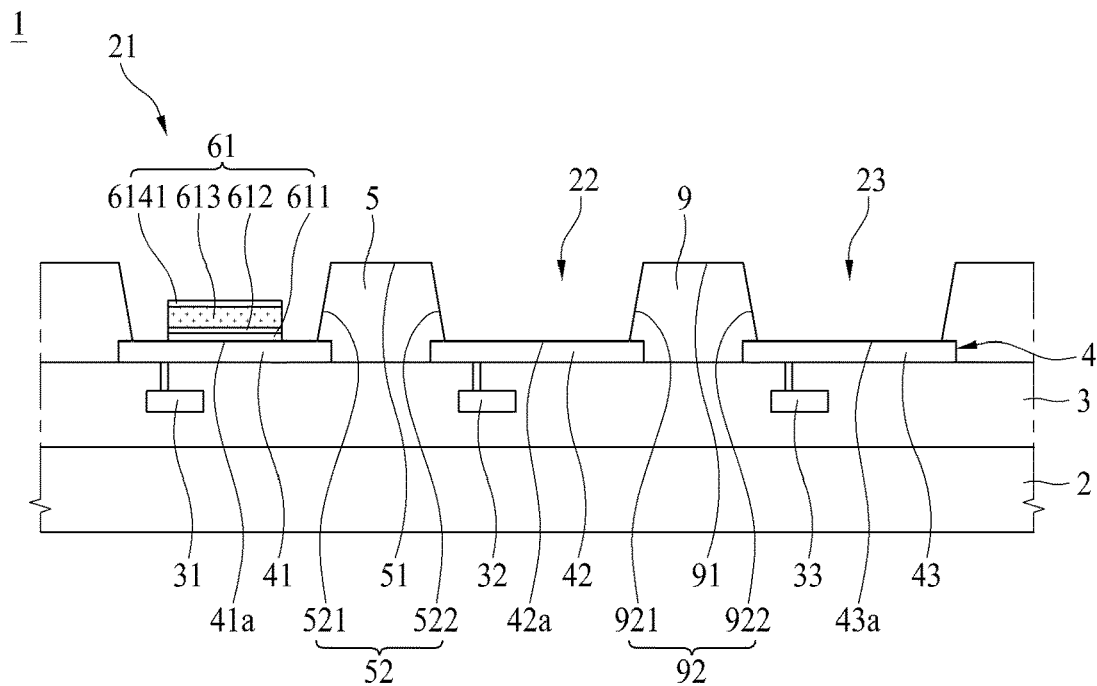
Figure 2G:
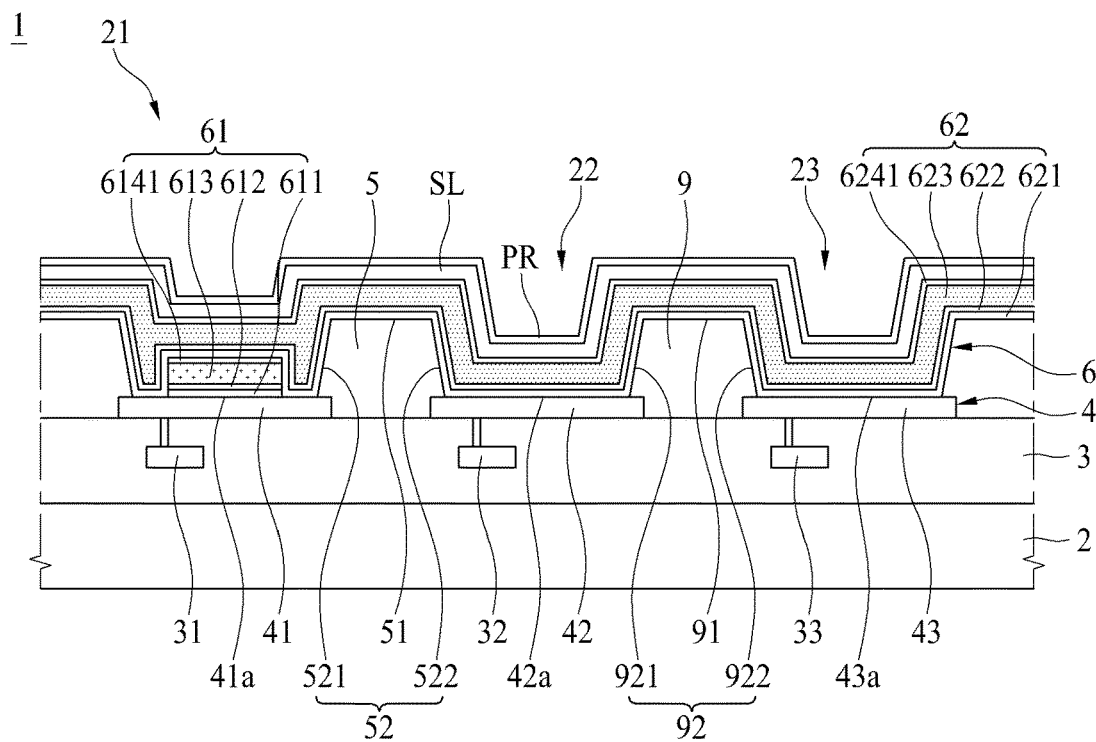
Figure 2H:
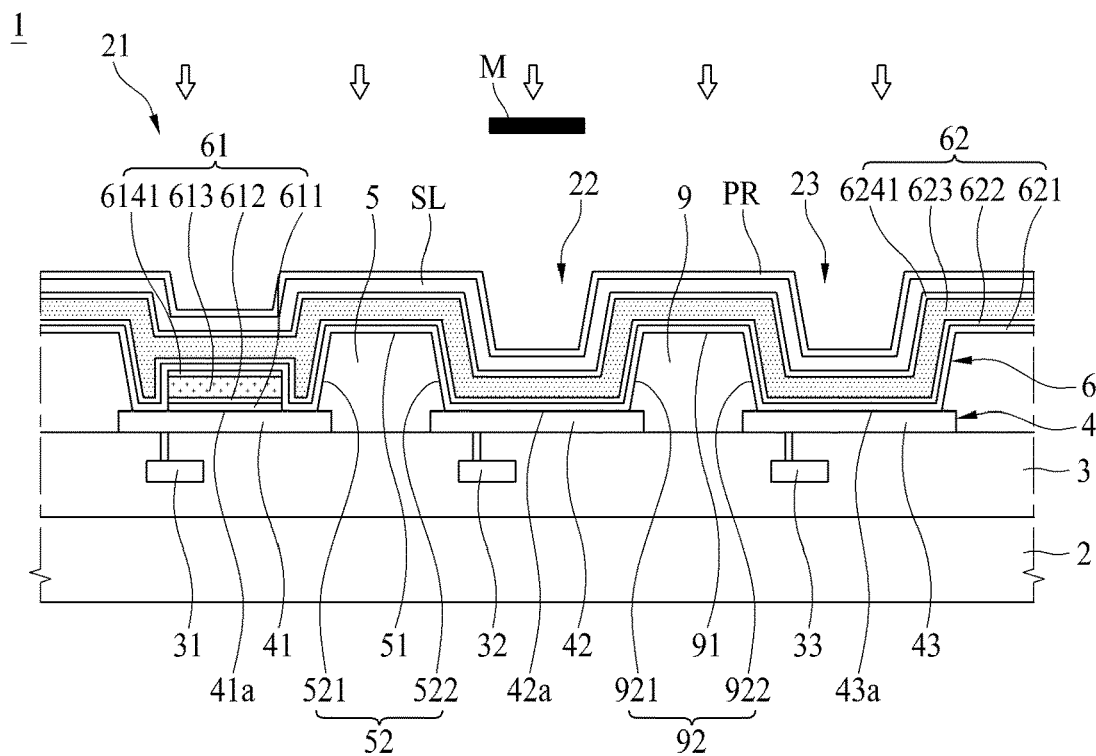
Figure 2I:
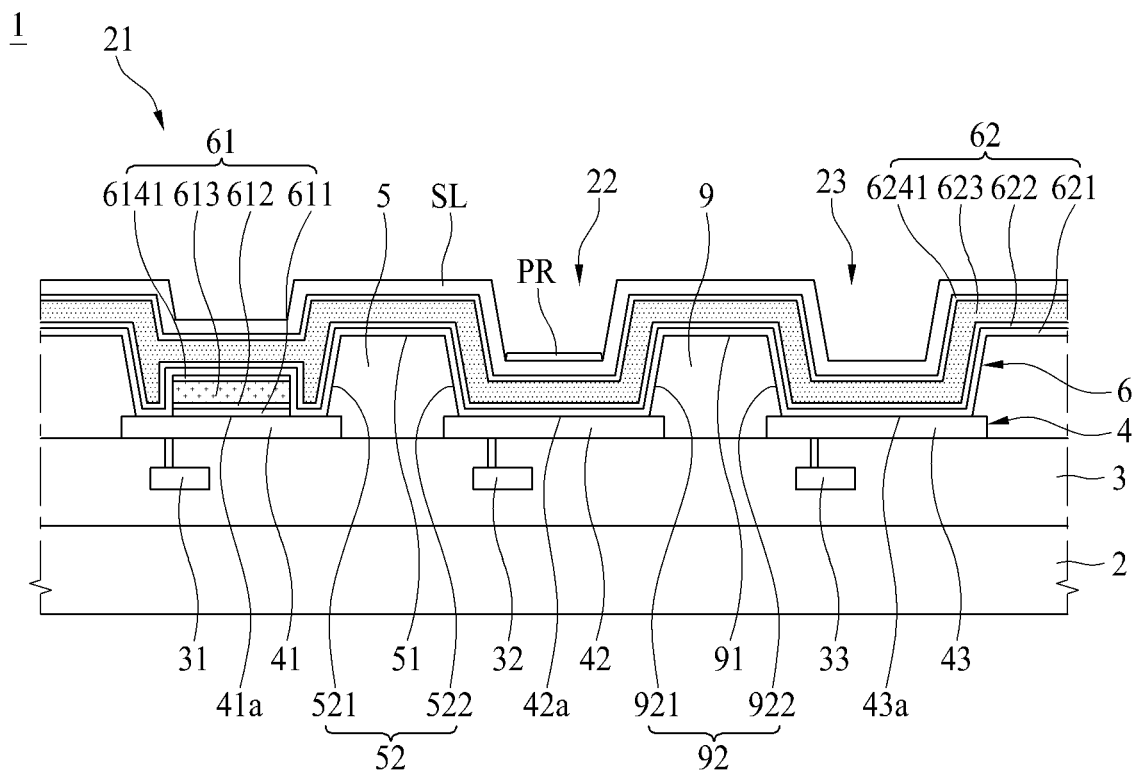
Figure 2J:
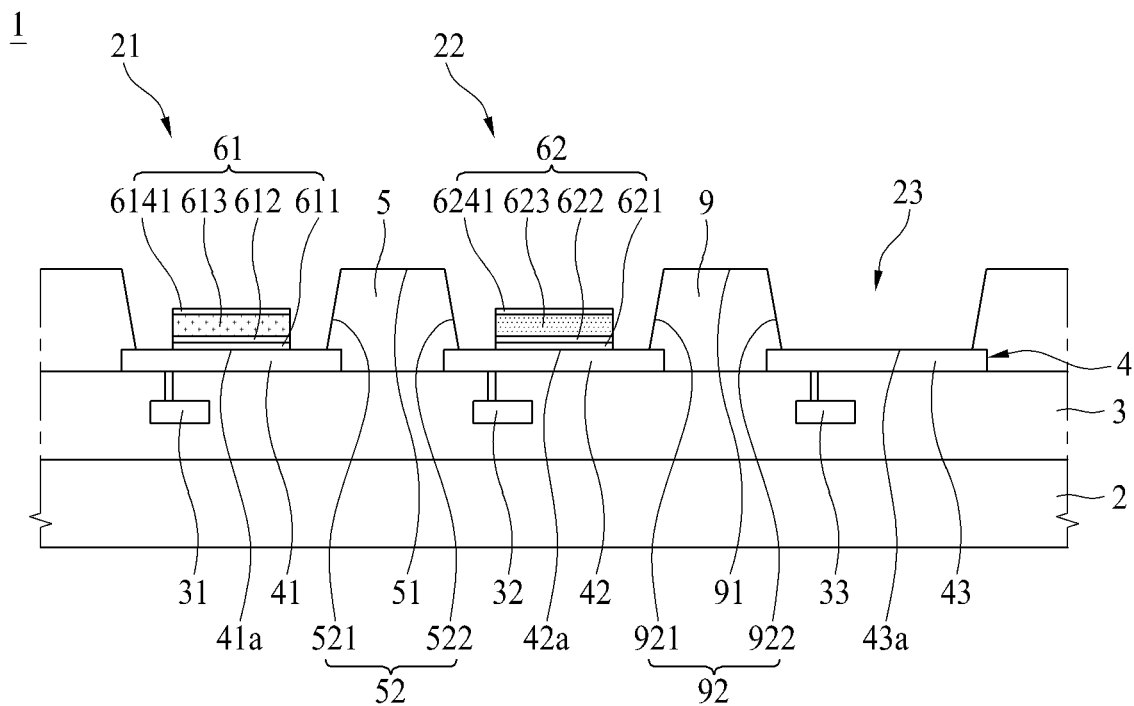
Figure 2K:
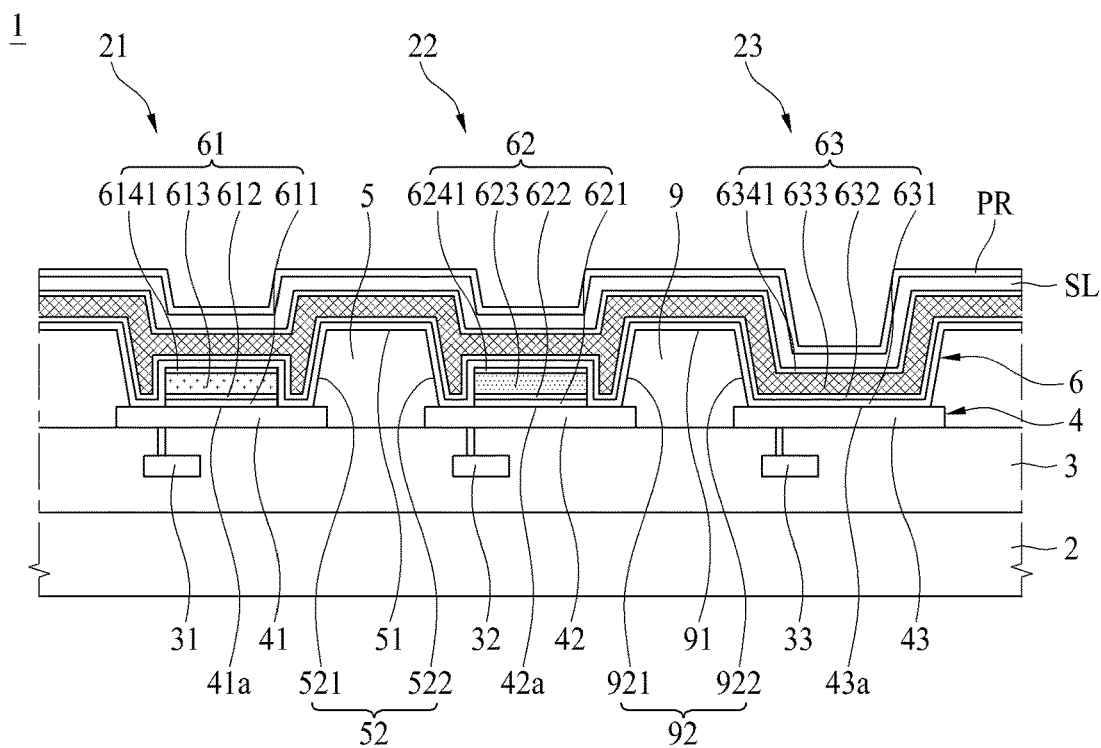
Figure 2L:
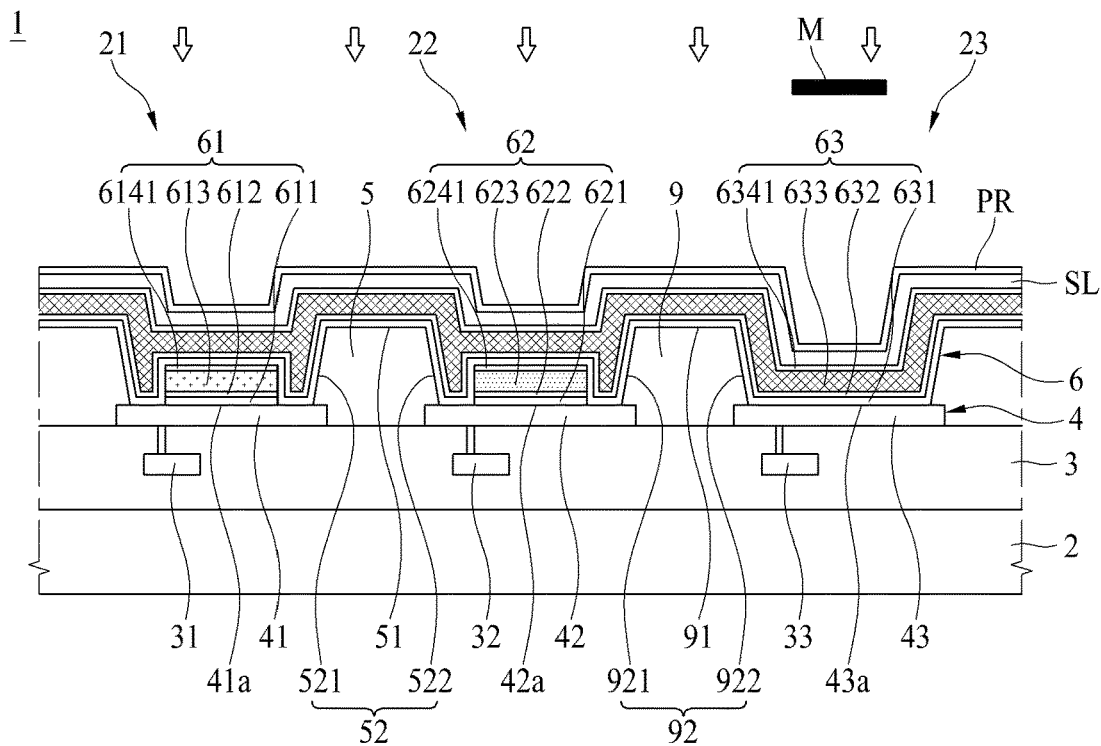
Figure 2M:
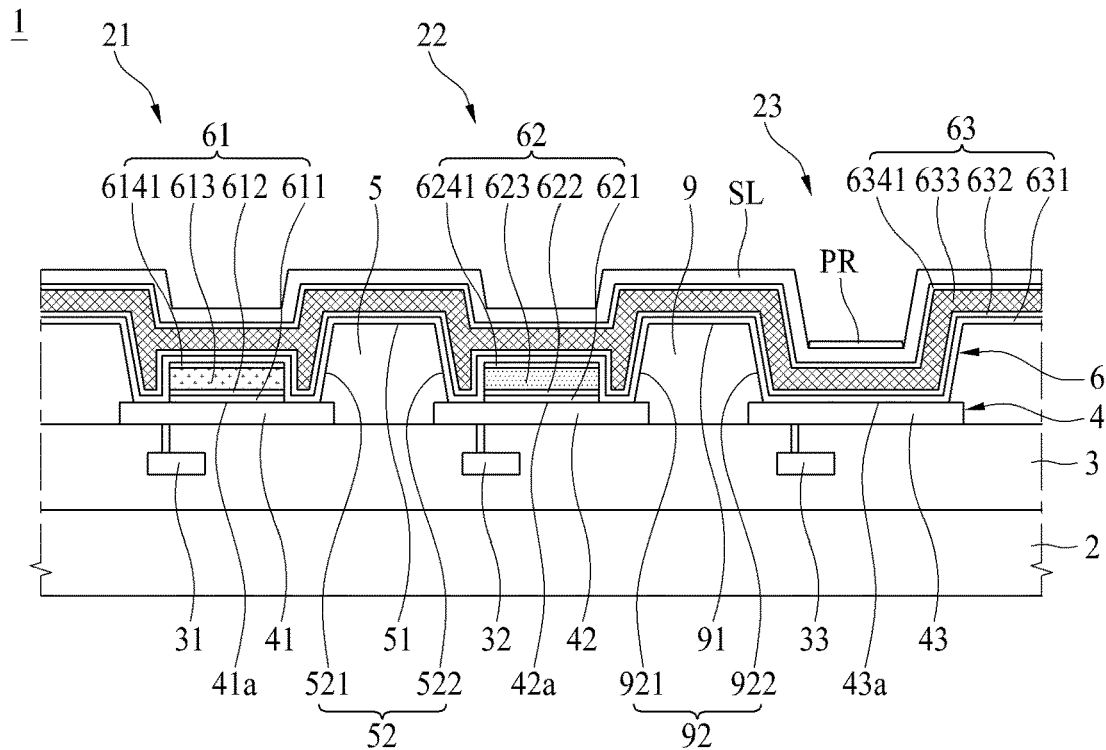
Figure 2N:
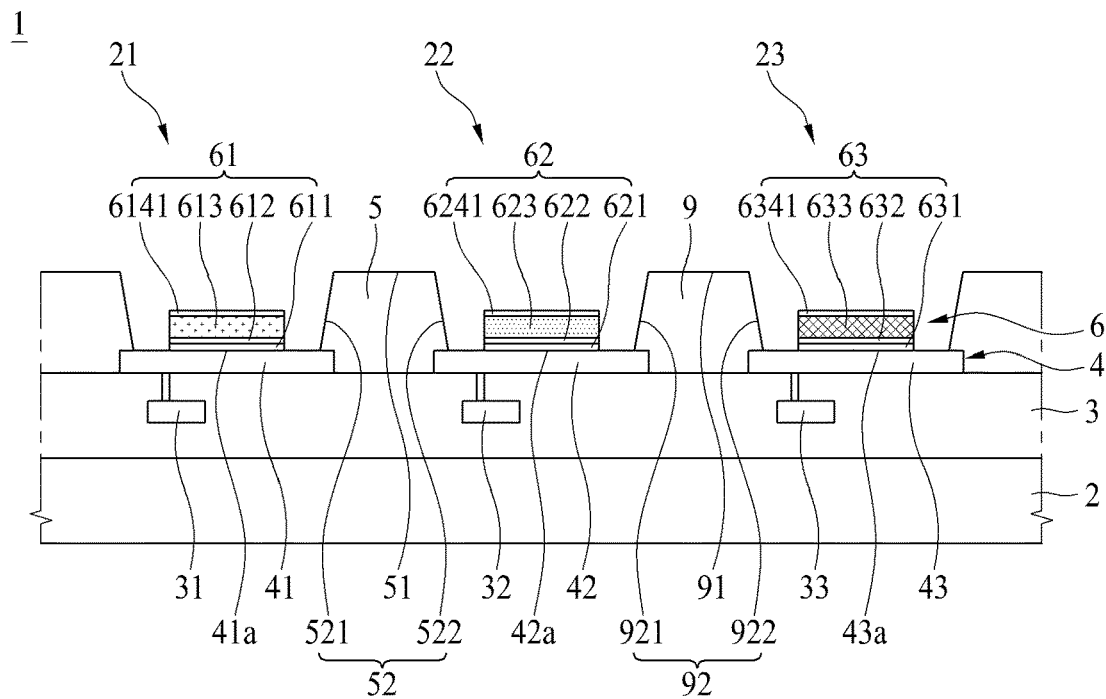
Figure 2O:
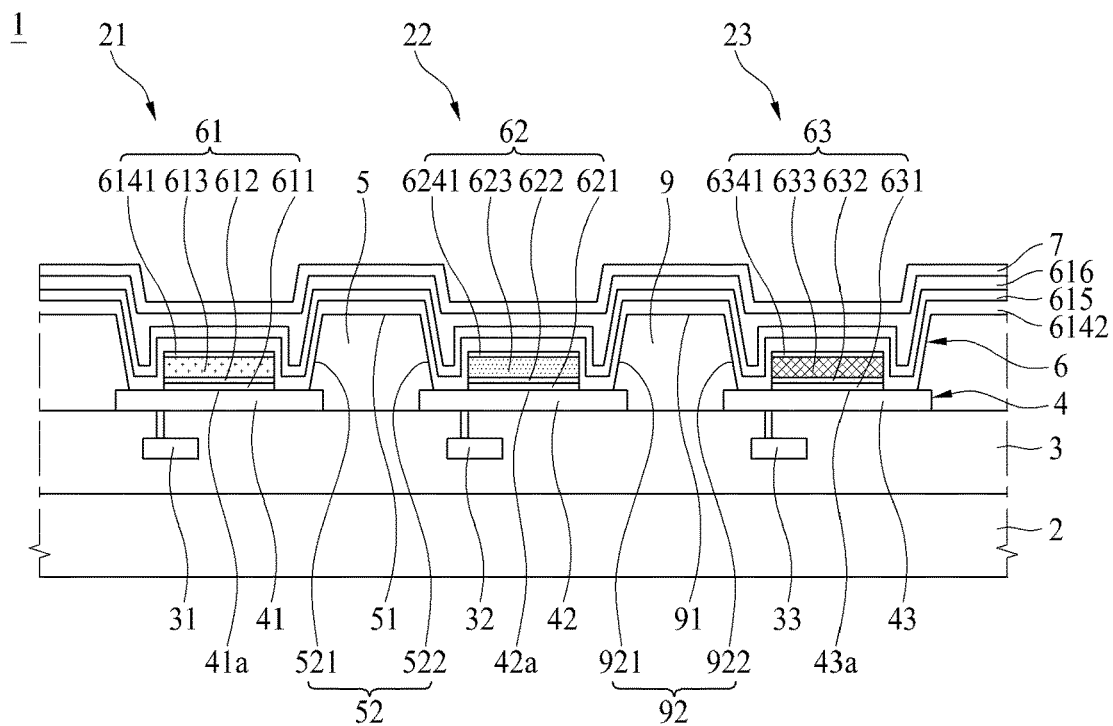
Figure 2P:
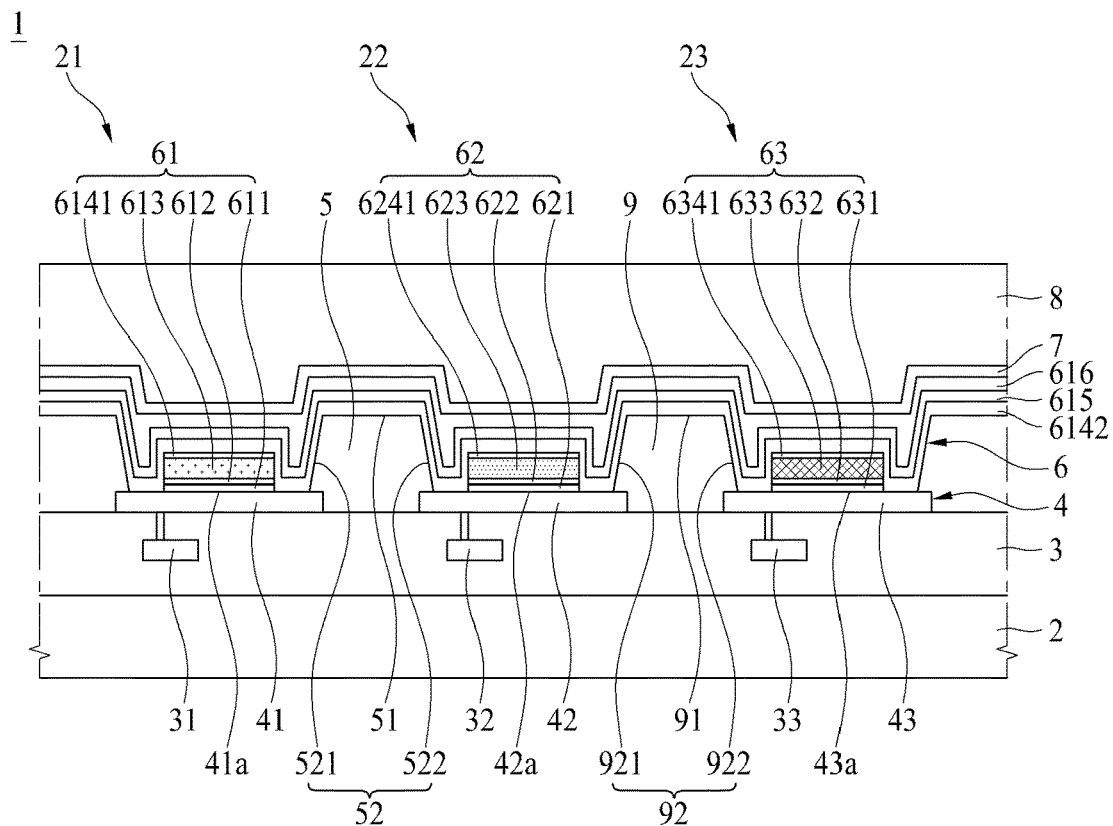

FIG. 1 is a cross-sectional view illustrating a display device according to the first aspect of the present disclosure, and FIGS. 2A to 2P are cross-sectional views illustrating a manufacturing process of a display device according to the first aspect of the present disclosure.

Referring to FIGS. 1 and 2P, the display device 1 according to the first aspect of the present disclosure comprises a substrate 2, a circuit element layer 3, a first electrode 4, a first bank 5, an organic light emitting layer 6, a second electrode 7, an encapsulation layer 8, and a second bank 9. The organic light emitting layer includes a light emitting layer and a first hole transporting layer, the first hole transporting layer includes a first sub hole transporting layer and a second sub hole transporting layer, and the first sub hole transporting layer is arranged between the light emitting layer and the second sub hole transporting layer to cover the light emitting layer.

The substrate 2 may be a semiconductor substrate such as a plastic film, a glass substrate, or silicon. The substrate 2 may be made of a transparent material or an opaque material.

A first subpixel 21, a second subpixel 22, and a third subpixel 23 are provided on the substrate 2. The second subpixel 22 according to one example may be arranged to be adjacent to one side of the first subpixel 21. The third subpixel 23 according to one example may be arranged to be adjacent to one side of the second subpixel 22. Therefore, the first subpixel 21, the second subpixel 22 and the third subpixel 23 may sequentially be arranged on the substrate 2.

The first subpixel 21 may be provided to emit red (R) light, the second subpixel 22 may be provided to emit green (G) light, and the third subpixel 23 may be provided to emit blue (B) light, but these subpixels are not limited to this example and may emit light of various colors including white light. Also, an arrangement sequence of the subpixels 21, 22 and 23 may be changed in various ways.

Each of the first subpixel 21, the second subpixel 22 and the third subpixel 23 may be provided to include the first electrode 4, the organic light emitting layer 6, and the second electrode 10. In this case, the first electrode 4 may be a cathode electrode, and the second electrode 7 may be an anode electrode. Therefore, the display device 1 according to the first aspect of the present disclosure may be provided in a structure that the cathode electrode is arranged at a lower portion and the anode electrode is arranged at a top portion. The first electrode 4 may include a first sub electrode 41, a second sub electrode 42, and a third sub electrode 43.

The display device 1 according to one aspect of the present disclosure is provided in a top emission method in which emitted light is emitted to a top portion, and therefore an opaque material as well as a transparent material may be used as a material of the substrate 2.

The circuit element layer 3 is arranged on one surface of the substrate 2.

A circuit element comprising a plurality of thin film transistors 31, 32 and 33, various types of signal lines, and a capacitor is provided on the circuit element layer 3 per each of the subpixels 21, 22 and 23. The signal lines may include gate lines, data lines, power lines and reference lines, and the thin film transistors 31, 32 and 33 may include a switching thin film transistor, a driving thin film transistor, and a sensing thin film transistor. The subpixels 21, 22 and 23 are defined by a crossing structure of gate lines and data lines.

The switching thin film transistor is switched in accordance with a gate signal supplied to the gate line and serves to supply a data voltage supplied from the data line to the driving thin film transistor.

The driving thin film transistor is switched in accordance with the data voltage supplied from the switching thin film transistor to generate a data current from a power source supplied from the power line and serves to supply the generated data current to the first electrode 4.

The sensing thin film transistor serves to sense a threshold voltage deviation of the driving thin film transistor, which is a cause of image degradation, and supplies a current of the driving thin film transistor to the reference line in response to a sensing control signal supplied from the gate line or a separate sensing line.

The capacitor serves to maintain the data voltage supplied to the driving thin film transistor for one frame and is connected to each of a gate terminal and a source terminal of the driving thin film transistor.

A first thin film transistor 31, a second thin film transistor 32, and a third thin film transistor 33 are arranged in the circuit element layer 3 separately for each of the subpixels 21, 22 and 23. The first thin film transistor 31 according to one example may be connected to the first sub electrode 41 arranged on the first subpixel 21 to apply a driving voltage for emitting light of a color corresponding to the first subpixel 21.

The second thin film transistor 32 according to one example may be connected to a second sub electrode 42 arranged on the second subpixel 22 to apply a driving voltage for emitting light of a color corresponding to the second subpixel 22.

The third thin film transistor 33 according to one example may be connected to a third sub electrode 43 arranged on the third subpixel 23 to apply a driving voltage for emitting light of a color corresponding to the third subpixel 23.

Each of the first subpixel 21, the second subpixel 22 and the third subpixel 23 according to one example supplies a predetermined current to an organic light emitting layer in accordance with the data voltage of the data line when a gate signal from the gate line is input thereto using each of the thin film transistors 31, 32 and 33. For this reason, the organic light emitting layer of each of the first subpixel 21, the second subpixel 22 and the third subpixel 23 may emit light with a predetermined brightness in accordance with the predetermined current.

The first electrode 4 is formed on the circuit element layer 3. The first electrode 4 according to one example may be formed to include a metal material of high reflectivity such as a deposited structure (Ti/Al/Ti) of aluminum and titanium, a deposited structure (ITO/Al/ITO) of aluminum and ITO, an APC alloy, and a deposited structure (ITO/APC/ITO) of APC alloy and ITO. The APC alloy is an alloy of silver (Ag), palladium (Pb), and Copper (Cu). The first electrode 4 may be a cathode. The first electrode 4 may include a first sub electrode 41, a second sub electrode 42 and a third sub electrode 43.

The first sub electrode 41 may be provided on the first subpixel 21. The first sub electrode 41 may be formed on the circuit element layer 3. The first sub electrode 41 is connected to a source electrode of the first thin film transistor 31 through a contact hole that passes through the circuit element layer 3.

The second sub electrode 42 may be provided on the second subpixel 22. The second sub electrode 42 may be formed on the circuit element layer 3. The second sub electrode 42 is connected to a source electrode of the second thin film transistor 32 through a contact hole that passes through the circuit element layer 3.

The third sub electrode 43 may be provided on the third subpixel 23. The third sub electrode 43 may be formed on the circuit element layer 3. The third sub electrode 43 is connected to a source electrode of the third thin film transistor 33 through a contact hole that passes through the circuit element layer 3.

In this case, the first to third transistors 31, 32 and 33 may be N-type TFTs.

If the first to third thin film transistors 31, 32 and 33 are made of P-type TFTs, each of the first to third sub electrodes 41, 42 and 43 may be connected to a drain electrode of each of the first to third thin film transistors 31, 32 and 33.

In other words, each of the first to third sub electrodes 41, 42 and 43 may be connected to a source electrode or a drain electrode in accordance with types of the first to third thin film transistors 31, 32 and 33.

Since the display device 1 according to the first aspect of the present disclosure is provided in a top emission method, the first to third sub electrodes 41, 42 and 43 may be provided to include a reflective material to reflect light emitted from the organic light emitting layer 6 to a top portion. In this case, the first to third sub electrodes 41, 42 and 43 may be made of a deposited structure of a transparent electrode formed of a transparent conductive material and a reflective electrode formed of the reflective material. Although not shown, a separate transparent electrode is additionally provided below the reflective electrode, whereby each of the first to third sub electrodes 41, 42 and 43 may be made of a three-layered structure of the separate transparent electrode, the reflective electrode and the transparent electrode which are deposited in due order.

At this time, the reflective electrode provided in the first subpixel 21, the reflective electrode provided in the second subpixel 22 and the reflective electrode provided in the third subpixel 23 may be formed of the same material to have the same thickness.

Likewise, the transparent electrode provided in the first subpixel 21, the transparent electrode provided in the second subpixel 22 and the transparent electrode provided in the third subpixel 23 may be formed of the same material to have the same thickness. However, without limitation to this example, the transparent electrodes provided in the subpixels 21, 22 and 23 may have their respective thicknesses different from one another to control a spaced distance of the respective sub electrodes 41, 42 and 43 for the second electrode 7. For example, if the display device is embodied using microcavity characteristic, the thicknesses of the transparent electrodes may be different from one another. The microcavity characteristic means that reinforcing interference occurs to amplify light if a distance between the reflective electrode of the first electrode 4 and the second electrode 7 reaches an integer multiple of a half wavelength $\lambda/2$ of light emitted from each of the subpixels 21, 22 and 23 and an amplified level of light is continuously increased to improve external extraction efficiency of light if reflection and re-reflection are repeated. If the display device is embodied to have the microcavity characteristic, the second electrode 7 may include a semi-transparent electrode.

In the display device 1 according to the first aspect of the present disclosure, to embody the microcavity characteristic, the thickness of the first sub hole transporting layer owned by the organic light emitting layer is provided differently for each of the first to third subpixels 21, 22 and 23 to differently control the distance between the first electrode 4 and the second electrode 7. This detailed description will be described in the display device 1 according to the second aspect of the present disclosure, which will be described later.

Referring to FIG. 1 again, the first bank 5 is provided between the first sub electrode 41 and the second sub electrode 42. The first bank 5 according to one example is to partition the first subpixel 21 and the second subpixel 22 from each other. The first bank 5 may be provided to cover edges of the first sub electrode 41 and the second sub electrode 42, thereby partitioning the first subpixel 21 and the second subpixel 22 from each other. The first bank 5 serves to define a subpixel, that is, a light emitting area. Also, an area where the first bank 5 is formed may be defined as a non-light emitting area because the area does not emit light. The first bank 5 may be formed of an organic film such as acryl resin, epoxy resin, phenolic resin, polyamide resin, and polyimide resin. The organic light emitting layer 6 is formed on the first electrode 4 and the first bank 5.

Referring to FIG. 1, the first bank 5 may include an upper surface 51 and an inclined surface 52. The inclined surface 52 may include a first inclined surface 521 and a second inclined surface 522.

The upper surface 51 of the first bank 5 is a surface placed on the top of the first bank 5.

The first inclined surface 521 of the first bank 5 is a surface extended from the upper surface 51 to an upper surface 41*a* of the first sub electrode 41. Therefore, the first inclined surface 521 may have a predetermined angle with the upper surface 41*a* of the first sub electrode 41. The predetermined angle may be greater than 50° and less than 90° as a width of the bank becomes narrow in accordance with high resolution of the display device. A width of the bank may become narrow as the distance between subpixels becomes narrow.

The second inclined surface 522 of the first bank 5 is a surface extended from the upper surface 51 to an upper surface 42*a* of the second sub electrode 42. Therefore, the second inclined surface 522 may have a predetermined angle with the upper surface 42*a* of the second sub electrode 42. An angle between the second inclined surface 522 and the upper surface 42*a* of the second sub electrode 42 may be equal to that between the first inclined surface 521 and the upper surface 41*a* of the first sub electrode 41.

Referring to FIG. 1, the display device 1 according to the first aspect of the present disclosure may further include a second bank 9.

The second bank 9 is provided between the second sub electrode 42 and the third sub electrode 43. The second bank 9 according to one example may be provided to cover edges of the second sub electrode 42 and the third sub electrode 43, thereby partitioning the second subpixel 22 from the third subpixel 23 from each other. The second bank 9 serves to define a subpixel, that is, a light emitting area. Also, an area where the second bank 9 is formed may be defined as a non-light emitting area because the area does not emit light. The second bank 9 may be formed of the same material as that of the first bank 5. The organic light emitting layer 6 is formed on the first electrode 4 and the second bank 9.

Referring to FIG. 1, the second bank 9 may include an upper surface 91 and an inclined surface 92. The inclined surface 92 may include a first inclined surface 921 and a second inclined surface 922.

The upper surface 91 of the second bank 9 is a surface placed on the top of the second bank 9.

The first inclined surface 921 of the second bank 9 is a surface extended from the upper surface 91 to the upper surface 42*a* of the second sub electrode 42. Therefore, the first inclined surface 921 may have a predetermined angle with the upper surface 42*a* of the second sub electrode 42. The predetermined angle may be greater than 50° and less than 90° as a width of the bank becomes narrow in accordance with high resolution of the display device.

The second inclined surface 922 of the second bank 9 is a surface extended from the upper surface 91 to an upper surface 43*a* of the third sub electrode 43. Therefore, the second inclined surface 922 may have a predetermined angle with the upper surface 43*a* of the third sub electrode 43. An angle between the second inclined surface 922 and the upper surface 43*a* of the third sub electrode 43 may be equal to that between the first inclined surface 921 and the upper surface 42*a* of the second sub electrode 42.

The organic light emitting layer 6 is arranged on the first electrode 4. The organic light emitting layer 6 according to one example may include an electron injecting layer EIL, an electron transporting layer ETL, a light emitting layer EML, a hole transporting layer HTL, and a hole injecting layer HIL. The hole transporting layer HTL may include a first hole transporting layer including a first sub hole transporting layer arranged on the light emitting layer EML and a second sub transporting layer arranged on the first sub hole transporting layer, and a second hole transporting layer arranged on the first hole transporting layer. The electron injecting layer EIL may include a layer made of an EIL material, and a layer doped on the ETL, having electron injecting characteristic. The layer doped on the ETL, having electron injecting characteristic may be an N-doped electron transporting layer. The N-doped electron transporting layer is formed by plating a metal material such as lithium (Li), Cesium (Cs) and magnesium (Mg) on the electron transporting layer. The N-doped electron transporting layer may serve as the electron injecting layer EIL. Therefore, in the display device 1 according to the first aspect of the present disclosure, the N-doped electron transporting layer may be provided instead of the electron injecting layer EIL.

The hole injecting layer HIL, the hole transporting layer HTL, the electron transporting layer ETL, and the electron injecting layer EIL of the organic light emitting layer 6 are intended to improve emission efficiency of the light emitting layer EML. The hole transporting layer HTL and the electron transporting layer ETL are intended to balance between electrons and holes, and the hole injecting layer HIL and the electron injecting layer EIL are intended to enhance injection of electrons and holes.

In more detail, the hole injecting layer HIL may facilitate injection of holes by lowering an injection energy barrier of holes injected from an anode material, that is, the second electrode 7. The hole transporting layer HTL serves to transport the holes injected from an anode to the light emitting layer without loss.

The light emitting layer EML is a layer for emitting light through recombination of holes injected from an anode and electrons injected from a cathode, and may emit light of red, blue and green colors in accordance with combination energy inside the light emitting layer and form a white light emitting layer by configuring a plurality of light emitting layers. The electron injecting layer EIL serves to facilitate injection of the electrons from the cathode, that is, the first electrode 4 by lowering a potential barrier during injection of the electrons. The electron transporting layer ETL serves to transport the electrons injected from the electron injecting layer EIL to the light emitting layer.

If a high potential voltage is applied to the first electrode 4 and a low potential voltage is applied to the second electrode 7, holes and electrons are moved to the light emitting layer through the hole transporting layer and the electron transporting layer, respectively and combined with each other in the light emitting layer to emit light. In this case, since the first electrode 4 is the cathode electrode, a minus voltage may be applied to the first electrode 4.

The organic light emitting layer 6 may include a first organic light emitting layer 61, a second organic light emitting layer 62 and a third organic light emitting layer 63.

The first organic light emitting layer 61 may be arranged on the first sub electrode 41. The first organic light emitting layer 61 may be formed on the first sub electrode 41 after the first electrode 4, the first bank 5 and the second bank 9 are formed.

The first organic light emitting layer 61, as shown in FIG. 1, may include an electron injecting layer 611, an electron transporting layer 612, a light emitting layer 613, a first hole transporting layer 614 including a first sub hole transporting layer 6141 and a second sub hole transporting layer 6142, a second hole transporting layer 615, and a hole injecting layer 616. The electron injecting layer 611, the electron transporting layer 612, the light emitting layer 613, the first hole transporting layer 614 including the first sub hole transporting layer 6141 and the second sub hole transporting layer 6142, the second hole transporting layer 615, and the hole injecting layer 616 may sequentially be formed on the first subpixel 21.

In this case, in the display device 1 according to the first aspect of the present disclosure, the first sub hole transporting layer 6141 of the first hole transporting layer 614 owned by the first organic light emitting layer 61 may be provided between the light emitting layer 613 and the second sub hole transporting layer 6142 to cover the light emitting layer 613.

In a state that the first sub hole transporting layer 6141 covers the light emitting layer 613, since a patterning process is performed such that the first sub hole transporting layer 6141 and the light emitting layer 613 are arranged on only the first subpixel 21, the first sub hole transporting layer 6141 may prevent the light emitting layer 613 from being damaged from UV light used for an exposure process of the patterning process, an etching gas used for a dry etching process, a stripper solution used for a strip process, and the like.

In the display device 1 according to the first aspect of the present disclosure, another layer not the first sub hole transporting layer 6141 may be arranged between the light emitting layer 613 and the second sub hole transporting layer 6142 or between the light emitting layer 613 and the second hole transporting layer 615. However, in this case, an energy level difference becomes greater than the case that the first sub hole transporting layer 6141 is arranged, whereby light emission efficiency of the light emitting layer 613 may be more lowered.

Meanwhile, in the display device 1 according to the first aspect of the present disclosure, the second sub hole transporting layer 6142, the second hole transporting layer 615 and the hole injecting layer 616 of the first organic light emitting layer 61 may be deposited on the entire surface over the second subpixel 22 and the third subpixel 23 as well as the first subpixel 21. That is, the second sub hole transporting layer 6142, the second hole transporting layer 615 and the hole injecting layer 616 of the first organic light emitting layer 61 may respectively be connected with a second sub hole transporting layer, a second hole transporting layer and a hole injecting layer of the second organic light emitting layer 62, and the second sub hole transporting layer, the second hole transporting layer and the hole injecting layer of the second organic light emitting layer 62 may respectively be connected with a second sub hole transporting layer, a second hole transporting layer and a hole injecting layer of the third organic light emitting layer 63.

Therefore, the second sub hole transporting layer 6142, the second hole transporting layer 615 and the hole injecting layer 616 of the first organic light emitting layer 61, as shown in FIG. 1, may respectively become the second sub hole transporting layer, the second hole transporting layer and the hole injecting layer of the second organic light emitting layer 62, and the second sub hole transporting layer, the second hole transporting layer and the hole injecting layer of the second organic light emitting layer 62 may respectively become the second sub hole transporting layer, the second hole transporting layer and the hole injecting layer of the third organic light emitting layer 63. As a result, the second sub hole transporting layer 6142, the second hole transporting layer 615 and the hole injecting layer 616 of the first organic light emitting layer 61 may be arranged as common layers in the display device 1 according to the first aspect of the present disclosure.

As the second sub hole transporting layer 6142, the second hole transporting layer 615 and the hole injecting layer 616 of the first organic light emitting layer 61 are arranged as common layers, the layers may cover the upper surface 91 and the inclined surface 92 of the second bank 9 arranged between the second subpixel 22 and the third subpixel 23 as well as the upper surface 51 and the inclined surface 52 of the first bank 5 arranged between the first subpixel 21 and the second subpixel 22.

As a result, the display device 1 according to the first aspect of the present disclosure may be provided to reduce the number of manufacturing processes as compared with the case that the second sub hole transporting layer, the second hole transporting layer and the hole injecting layer of each of the first to third organic light emitting layers 61, 62 and 63 are patterned for each of the first to third subpixels 21, 22 and 23.

Meanwhile, the electron injecting layer 611, the electron transporting layer 612, the light emitting layer 613 and the first sub hole transporting layer 6141, which are arranged on the first subpixel 21, may be provided such that both ends may be matched with each other.

In more detail, the light emitting layer 613 of the first organic light emitting layer 61 may be deposited on the entire surface over the first to third subpixels 21, 22 and 23 after the electron injecting layer 611 and the electron transporting layer 612 of the first organic light emitting layer 61 are deposited on the entire surface as common layers. Then, after the first sub hole transporting layer 6141 is entirely deposited on the light emitting layer 613 of the first organic light emitting layer 61, the electron injecting layer 611, the electron transporting layer 612, the light emitting layer 613 and the first sub hole transporting layer 6141 of the first organic light emitting layer 61 may be patterned to be arranged only on the first subpixel 21.

In this way, since the electron injecting layer 611, the electron transporting layer 612, the light emitting layer 613 and the first sub hole transporting layer 6141 of the first organic light emitting layer 61 are patterned at the same time, both ends of each of the electron injecting layer 611, the electron transporting layer 612, the light emitting layer 613 and the first sub hole transporting layer 6141 of the first organic light emitting layer 61 may be embodied to be matched with each other as shown in FIG. 1. Therefore, in the display device 1 according to the first aspect of the present disclosure, as the electron injecting layer 611, the electron transporting layer 612, the light emitting layer 613 and the first sub hole transporting layer 6141 of the first organic light emitting layer 61 are patterned at the same time, the number of manufacturing processes may be reduced as compared with the case that the electron injecting layer, the electron transporting layer, the light emitting layer and the first sub hole transporting layer are respectively patterned, and a level of each layer exposed to exposure, etching gas and strip solution, which are used for the patterning process, may be reduced to prevent light emission efficiency of the first organic light emitting layer 61 from being deteriorated.

Then, the second sub hole transporting layer 6142, the second hole transporting layer 615 and the hole transporting layer 616 of the first organic light emitting layer 61 may sequentially be deposited as common layers to cover the electron injecting layer 611, the electron transporting layer 612, the light emitting layer 613 and the first sub hole transporting layer 6141 of the first organic light emitting layer 61 patterned on the first subpixel 21. Therefore, the second sub hole transporting layer 6142 of the first organic light emitting layer 61 may cover an upper surface and both sides of the first sub hole transporting layer 6141, both sides of the light emitting layer 613, both sides of the electron transporting layer 612 and both sides of the electron injecting layer 611.

The second sub hole transporting layer 6142 of the first organic light emitting layer 61 may be made of the same material as that of the first sub hole transporting layer 6141 arranged at the uppermost one of the layers subjected to the patterning process, whereby the first sub hole transporting layer 6141 lost by the patterning process may be compensated. In this case, the expression 'compensated' means that the second sub hole transporting layer 6142 is formed as much as the thickness of the first sub hole transporting layer 6141 lost by the patterning process, or may mean that an energy level difference between the second sub hole transporting layer 6142 and the first sub hole transporting layer 6141 of which energy level is changed by the patterning process is reduced.

Referring to FIG. 1 again, the second organic light emitting layer 62 may be arranged on the second sub electrode 42. The second organic light emitting layer 62 may be formed on the second sub electrode 42 after the first electrode 4, the first bank 5 and the second bank 9 are formed in the same manner as the first organic light emitting layer 61. The second organic light emitting layer 62 may be formed after the first organic light emitting layer 61 is formed, but is not limited to this example.

The second organic light emitting layer 62 may include an electron injecting layer 621, an electron transporting layer 622, a light emitting layer 623, a first hole transporting layer including a first sub hole transporting layer 6241 and a second sub hole transporting layer, a second hole transporting layer, and a hole injecting layer. The electron injecting layer 621, the electron transporting layer 622, the light emitting layer 623, the first hole transporting layer including the first sub hole transporting layer 6241 and the second sub hole transporting layer, the second hole transporting layer, and the hole injecting layer may sequentially be formed on the second subpixel 22. As described above, the second sub hole transporting layer, the second hole transporting layer and the hole injecting layer of the second organic light emitting layer 62 may respectively be connected with the second sub hole transporting layer 6142, the second hole transporting layer 615 and the hole injecting layer 616 of the first organic light emitting layer 61 and arranged as common layers. Therefore, as shown in FIG. 1, the second sub hole transporting layer 6142, the second hole transporting layer 615 and the hole injecting layer 616 of the first organic light emitting layer 61 may be arranged on the second subpixel 22 as common layers to serve as the second sub hole transporting layer, the second hole transporting layer and the hole injecting layer of the second organic light emitting layer 62.

The electron injecting layer 621, the electron transporting layer 622, the light emitting layer 623 and the first sub hole transporting layer 6241, which are arranged on the second subpixel 22, may be provided such that both ends may be matched with each other.

In more detail, the light emitting layer 623 of the second organic light emitting layer 62 may be deposited on the entire surface over the first to third subpixels 21, 22 and 23 after the electron injecting layer 621 and the electron transporting layer 622 of the second organic light emitting layer 62 may be deposited on the entire surface as common layers. Then, after the first sub hole transporting layer 6241 is entirely deposited on the light emitting layer 623 of the second organic light emitting layer 62, the electron injecting layer 621, the electron transporting layer 622, the light emitting layer 623 and the first sub hole transporting layer 6241 of the second organic light emitting layer 62 may be patterned to be arranged only on the second subpixel 22.

In this way, since the electron injecting layer 621, the electron transporting layer 622, the light emitting layer 623 and the first sub hole transporting layer 6241 of the second organic light emitting layer 62 are patterned at the same time, both ends of each of the electron injecting layer 621, the electron transporting layer 622, the light emitting layer 623 and the first sub hole transporting layer 6241 of the second organic light emitting layer 62 may be embodied to be matched with each other as shown in FIG. 1. Therefore, in the display device 1 according to the first aspect of the present disclosure, as the electron injecting layer 621, the electron transporting layer 622, the light emitting layer 623 and the first sub hole transporting layer 6241 of the second organic light emitting layer 62 are patterned at the same time, the number of manufacturing processes may be reduced as compared with the case that the electron injecting layer, the electron transporting layer, the light emitting layer and the first sub hole transporting layer are respectively patterned, and a level of each layer exposed to exposure, etching gas and strip solution, which are used for the patterning process, may be reduced to prevent light emission efficiency of the second organic light emitting layer 62 from being deteriorated.

Then, the second sub hole transporting layer, the second hole transporting layer and the hole transporting layer of the second organic light emitting layer 62 may sequentially be deposited to cover the electron injecting layer 621, the electron transporting layer 622, the light emitting layer 623 and the first sub hole transporting layer 6241 of the second organic light emitting layer 62 patterned on the second subpixel 22. In this case, since the second sub hole transporting layer, the second hole transporting layer and the hole transporting layer of the second organic light emitting layer 62 are connected with the second sub hole transporting layer 6142, the second hole transporting layer 615, and the hole injecting layer 616 of the first organic light emitting layer 61 as described above, the second sub hole transporting layer 6142, the second hole transporting layer 615 and the hole injecting layer 616 of the first organic light emitting layer 61 may be arranged on the second subpixel 22. Therefore, the second sub hole transporting layer 6142 of the first organic light emitting layer 61 may be provided to cover an upper surface and both sides of the first sub hole transporting layer 6241, both sides of the light emitting layer 623, both sides of the electron transporting layer 622 and both sides of the electron injecting layer 621 of the second organic light emitting layer 62.

The second sub hole transporting layer 6142 of the first organic light emitting layer 61 may be made of the same material as that of the first sub hole transporting layer 6241 of the second organic light emitting layer 62, which is arranged at the uppermost one of the layers subjected to the patterning process on the second subpixel 22, whereby the first sub hole transporting layer 6241 lost by the patterning process may be compensated. In this case, the expression 'compensated' means that the second sub hole transporting layer 6142 of the first organic light emitting layer 61 is formed as much as the thickness of the first sub hole transporting layer 6241 of the second organic light emitting layer 62, which is lost by the patterning process, or may mean that an energy level difference between the second sub hole transporting layer 6142 and the first sub hole transporting layer 6241 of which energy level is changed by the patterning process is reduced.

The third organic light emitting layer 63 may be arranged on the third sub electrode 43. The third organic light emitting layer 63 may be formed on the third sub electrode 43 after the first electrode 4, the first bank 5 and the second bank 9 are formed in the same manner as the first organic light emitting layer 61 and the second organic light emitting layer 62. The third organic light emitting layer 63 may be formed after the first organic light emitting layer 61 and the second organic light emitting layer 62 are formed, but is not limited to this example.

The third organic light emitting layer 63 may include an electron injecting layer 631, an electron transporting layer 632, a light emitting layer 633, a first hole transporting layer including a first sub hole transporting layer 6341 and a second sub hole transporting layer, a second hole transporting layer, and a hole injecting layer. The electron injecting layer 631, the electron transporting layer 632, the light emitting layer 633, the first hole transporting layer including the first sub hole transporting layer 6341 and the second sub hole transporting layer, the second hole transporting layer, and the hole injecting layer may sequentially be formed on the third subpixel 23. In this case, the second sub hole transporting layer, the second hole transporting layer and the hole injecting layer of the third organic light emitting layer 63 may respectively be connected with the second sub hole transporting layer, the second hole transporting layer and the hole injecting layer of the second organic light emitting layer 62. As a result, as shown in FIG. 1, the second sub hole transporting layer 6142, the second hole transporting layer 615 and the hole injecting layer 616 of the first organic light emitting layer 61 may be arranged on the third subpixel 23 as common layers to serve as the second sub hole transporting layer, the second hole transporting layer and the hole injecting layer of the third organic light emitting layer 63.

The electron injecting layer 631, the electron transporting layer 632, the light emitting layer 633 and the first sub hole transporting layer 6341, which are arranged on the third subpixel 23, may be provided such that both ends may be matched with each other.

In more detail, the light emitting layer 633 of the third organic light emitting layer 63 may be deposited on the entire surface over the first to third subpixels 21, 22 and 23 after the electron injecting layer 631 and the electron transporting layer 632 of the third organic light emitting layer 63 are deposited on the entire surface as common layers. Then, after the first sub hole transporting layer 6341 is entirely deposited on the light emitting layer 633 of the third organic light emitting layer 63, the electron injecting layer 631, the electron transporting layer 632, the light emitting layer 633 and the first sub hole transporting layer 6341 of the third organic light emitting layer 63 may be patterned to be arranged only on the third subpixel 23.

In this way, since the electron injecting layer 631, the electron transporting layer 632, the light emitting layer 633 and the first sub hole transporting layer 6341 of the third organic light emitting layer 63 are patterned at the same time, both ends of each of the electron injecting layer 631, the electron transporting layer 632, the light emitting layer 633 and the first sub hole transporting layer 6341 of the third organic light emitting layer 63 may be embodied to be matched with each other as shown in FIG. 1. Therefore, in the display device 1 according to the first aspect of the present disclosure, as the electron injecting layer 631, the electron transporting layer 632, the light emitting layer 633 and the first sub hole transporting layer 6341 of the third organic light emitting layer 63 are patterned at the same time, the number of manufacturing processes may be reduced as compared with the case that the electron injecting layer, the electron transporting layer, the light emitting layer and the first sub hole transporting layer are respectively patterned, and a level of each layer exposed to exposure, etching gas and strip solution, which are used for the patterning process, may be reduced to prevent light emission efficiency of the third organic light emitting layer 63 from being deteriorated.

Then, the second sub hole transporting layer, the second hole transporting layer and the hole transporting layer of the third organic light emitting layer 63 may sequentially be deposited to cover the electron injecting layer 631, the electron transporting layer 632, the light emitting layer 633 and the first sub hole transporting layer 6341 of the third organic light emitting layer 63 patterned on the third subpixel 23. In this case, since the second sub hole transporting layer, the second hole transporting layer and the hole transporting layer of the third organic light emitting layer 63 are connected with the second sub hole transporting layer, the second hole transporting layer, and the hole injecting layer of the second organic light emitting layer 62 as described above, the second sub hole transporting layer 6142, the second hole transporting layer 615 and the hole injecting layer 616 of the first organic light emitting layer 61 may be arranged on the third subpixel 23. Therefore, the second sub hole transporting layer 6142 of the first organic light emitting layer 61 may cover an upper surface and both sides of the first sub hole transporting layer 6341, both sides of the light emitting layer 633, both sides of the electron transporting layer 632 and both sides of the electron injecting layer 631 of the third organic light emitting layer 63.

The second sub hole transporting layer of the third organic light emitting layer 63, that is, the second sub hole transporting layer 6142 of the first organic light emitting layer 61 may be made of the same material as that of the first sub hole transporting layer 6341 of the third organic light emitting layer 63, which is arranged at the uppermost one of the layers subjected to the patterning process on the third subpixel 23, whereby the first sub hole transporting layer 6341 lost by the patterning process may be compensated. In this case, the expression 'compensated' means that the second sub hole transporting layer 6142 of the first organic light emitting layer 61 is formed as much as the thickness of the first sub hole transporting layer 6341 of the third organic light emitting layer 63, which is lost by the patterning process, or may mean that an energy level difference between the second sub hole transporting layer 6142 and the first sub hole transporting layer 6341 of which energy level is changed by the patterning process is reduced.

Consequently, the display device 1 according to the first aspect of the present disclosure may be provided in such a manner that the second sub hole transporting layer 6142, the second hole transporting layer 615 and the hole injecting layer 616 of the first organic light emitting layer 61 are sequentially deposited as common layers after the electron injecting layer 611, the electron transporting layer 612, the light emitting layer 613 and the first sub hole transporting layer 6141 of the first organic light emitting layer 61 are formed to be patterned on the first subpixel 21, the electron injecting layer 621, the electron transporting layer 622, the light emitting layer 623 and the first sub hole transporting layer 6241 of the second organic light emitting layer 62 are formed to be patterned on the second subpixel 22, and the electron injecting layer 631, the electron transporting layer 632, the light emitting layer 633 and the first sub hole transporting layer 6341 of the third organic light emitting layer 63 are formed to be patterned on the third subpixel 23.

Therefore, in the display device 1 according to the first aspect of the present disclosure, as the electron injecting layers 611, 621 and 631, the electron transporting layers 612, 622 and 632, the light emitting layers 613, 623 and 633 and the first sub hole transporting layers 6141, 6241 and 6341, which are respectively arranged to be patterned on the first to third subpixels 21, 22 and 23, are spaced apart from one another, even though the second sub hole transporting layer, the second hole transporting layer and the hole injecting layer are provided as common layers connected among the subpixels 21, 22 and 23, light of different colors for each of the first to third subpixels 21, 22 and 23 may be emitted. For example, the first subpixel 21 may be provided to emit red (R) light, the second subpixel 22 may be provided to emit green (G) light, and the third subpixel 23 may be provided to emit blue (B) light. However, without limitation to this example, the first to third subpixels 21, 22 and 23 may be provided to emit light of various colors.

If the first organic light emitting layer 61, the second light emitting layer 62 and the third light emitting layer 63 are provided to respectively emit red (R) light, green (G) light, and blue (B) light, an arrangement sequence of the first to third organic light emitting layers 61, 62 and 63 for the sub electrodes 41, 42 and 43 may be combined in various ways. As the first organic light emitting layer 61, the second light emitting layer 62 and the third light emitting layer 63 respectively emit red (R) light, green (G) light, and blue (B) light, the display device 1 according to the first aspect of the present disclosure may not use a color filter, whereby the manufacturing cost may be reduced.

As described above, the electron injecting layers 611, 621 and 631, the electron transporting layers 612, 622 and 632, the light emitting layers 613, 623 and 633 and the first sub hole transporting layers 6141, 6241 and 6341 of the first to third organic light emitting layers 61, 62 and 63 may be formed to be patterned for each of the first to third subpixels 21, 22 and 23. In more detail, after the electron injecting layers 611, 621 and 631, the electron transporting layers 612, 622 and 632, the light emitting layers 613, 623 and 633 and the first sub hole transporting layers 6141, 6241 and 6341 are deposited on the entire surface of the first to third subpixels 21, 22 and 23, a shield layer SL and a photoresist PR may sequentially be deposited on the first sub hole transporting layers 6141, 6241 and 6341 and then patterned for each of the subpixels 21, 22 and 23 through an exposure process, a dry etching process and a strip process using a stripper solution.

In this case, a problem may occur in that each of the light emitting layers 613, 623 and 633 is damaged by heat of UV light during an exposure process for exposing the photoresist PR arranged above the light emitting layers 613, 623 and 633 of the first to third organic light emitting layers 61, 62 and 63 to UV light. In the display device 1 according to the first aspect of the present disclosure, each of the first sub hole transporting layers 6141, 6241 and 6341 is provided to be in contact with an upper surface of each of the light emitting layers 613, 623 and 633, whereby the first sub hole transporting layers 6141, 6241 and 6341 may be provided to protect the light emitting layers 613, 623 and 633 from the UV light. Therefore, in the display device 1 according to the first aspect of the present disclosure, since the light emitting layers 613, 623 and 633 may be prevented from being damaged by the UV light, a defect rate of the complete display device may be reduced.

Also, in the display device 1 according to the first aspect of the present disclosure, as each of the first sub hole transporting layers 6141, 6241 and 6341 is arranged on the upper surface of each of the light emitting layers 613, 623 and 633, an etching gas or a stripper solution for removing the shield layer SL may be prevented from being permeated into the light emitting layers 613, 623 and 633 to prevent the light emitting layers 613, 623 and 633 from being damaged by the etching gas or the stripper solution. In this case, the stripper solution may be at least one of a fluorine based stripper solution and a water system stripper solution.

Referring to FIG. 1 again, the second electrode 7 is arranged on the organic light emitting layer 6. The second electrode 7 according to one aspect may be an anode electrode, and is a common layer commonly formed on the first subpixel 21, the second subpixel 22 and the third subpixel 23. The second electrode 7 may be formed of a transparent conductive material (TCO) such as ITO and IZO, which can transmit light, or may be formed of a semi-transmissive conductive material such as Mg and Ag, or an alloy of Mg and Ag.

The encapsulation layer 8 may be formed on the second electrode 7. The encapsulation layer 8 serves to prevent oxygen or water from being permeated into the organic light emitting layer 8 and the second electrode 7. To this end, the encapsulation layer 8 may include at least one inorganic film and at least one organic film.

For example, the encapsulation layer 8 may include a first inorganic film, an organic film, and a second inorganic film. In this case, the first inorganic film is formed to cover the second electrode 7. The organic film is formed to cover the first inorganic film. The organic film is formed at a length long enough to prevent particles from being permeated into the organic light emitting layer 6 and the second electrode 7 by passing through the first inorganic film. The second inorganic film is formed to cover the organic film.

For convenience of description, up to the encapsulation layer 8 arranged on the second electrode 7 is shown in FIG. 1. If the organic light emitting layer includes red, green and blue organic light emitting layers respectively emitting red (R), green (G) and blue (B) lights, red, green and blue color filters may not be arranged on the encapsulation layer 8.

FIGS. 2A to 2P are cross-sectional views illustrating a manufacturing process of a display device according to the first aspect of the present disclosure. In the display device 1 according to the first aspect of the present disclosure, through the following manufacturing process, both ends of the electron injecting layers 611, 621 and 631, the electron transporting layers 612, 622 and 632, the light emitting layers 613, 623 and 633 and the first sub hole transporting layers 6141, 6241 and 6341 of the first to third organic light emitting layers 61, 62 and 63 may be matched with each other, and the first sub hole transporting layers 6141, 6241 and 6341 may respectively be arranged on the upper surfaces of the light emitting layers 613, 623 and 633, whereby the first sub hole transporting layers 6141, 6241 and 6341 may be provided to protect each of the light emitting layers 613, 623 and 633 from the UV light, the etching gas and the stripper solution.

Referring to FIGS. 2A to 2D, in a state that the first electrode 4 which is the cathode electrode, the first bank 5 and the second bank 9 are formed on the substrate 2 and the circuit element layer 3, after the electron injecting layer 611, the electron transporting layer 612, the light emitting layer 613 and the first sub hole transporting layer 6141 of the first organic light emitting layer 61 are sequentially deposited on the entire surface over the first to third subpixels 21, 22 and 23 and then the shield layer SL and a PR layer are sequentially coated on the first sub hole transporting layer 6141. Afterwards, a mask M is arranged on an area of the first organic light emitting layer 61 and then an exposure process for exposing the PR layer of the other area to UV light is performed. Therefore, property of the other area except the area of the first organic light emitting layer 61 in the PR layer may be changed such that the corresponding area may be etched with a developing solution. The area of the first organic light emitting layer 61 is an area for forming the electron injecting layer 611, the electron transporting layer 612, the light emitting layer 613 and the first sub hole transporting layer 6141 of the first organic light emitting layer 61 on only the upper surface 41a of the first sub electrode 41, and may be smaller than a width of the first sub electrode 41. The light emitting layer 613 of the first organic light emitting layer 61 may emit red (R) light, but is not limited to this case.

During the exposure process of exposing the PR layer, the first sub hole transporting layer 6141 arranged on the upper surface of the light emitting layer 613 may shield the UV light to prevent the UV light from being permeated into the light emitting layer 613. Therefore, the display device 1 according to the first aspect of the present disclosure may prevent the light emitting layer 613 from being damaged by the UV light used for the exposure process.

Then, referring to FIGS. 23 and 2F, a primary removing process for removing the other PR layer except the area of first organic light emitting layer 61 and a secondary removing process for removing the shield layer SL of the other area except the area of the first organic light emitting layer 61, the electron injecting layer 611, the electron transporting layer 612, the light emitting layer 613 and the first sub hole transporting layer 6141 are performed. The primary removing process and the secondary removing process may be performed using at least one of the etching gas, the developing solution and the striper solution. The PR layer may be corroded by being put in the developing solution and then removed.

The secondary removing process may remove the first organic light emitting layer 61 of the other area including the PR layer on the area of the first organic light emitting layer 61 and the shield layer SL by using the etching gas or the stripper solution. The secondary removing process may remove the organic material including the shield layer SL having the amount more than that in the primary removing process by increasing the time exposed to the etching gas or the stripper solution as compared with the primary removing process. Through such processes, the electron injecting layer 611, the electron transporting layer 612, the light emitting layer 613 and the first sub hole transporting layer 6141 of the first organic light emitting layer 61 remain on only the upper surface 41a of the first sub electrode 41, and the electron injecting layer 611, the electron transporting layer 612, the light emitting layer 613 and the first sub hole transporting layer 6141 of the first organic light emitting layer 61 and the shield layer SL and the PR layer may be removed from the other area. The other area is the area except the portion where the electron injecting layer 611, the electron transporting layer 612, the light emitting layer 613 and the first sub hole transporting layer 6141 of the first organic light emitting layer 61 are patterned on the upper surface 41a of the first sub electrode 41, and may be the area including the first bank 5, the second subpixel 2, the second bank 9, and the third subpixel 23.

In the manufacturing process of the display device 1 according to the first aspect of the present disclosure, after the first sub hole transporting layer 6141 is arranged on the upper surface of the light emitting layer 613, since the exposure process and the removing process, that is, the patterning process are performed, the first sub hole transporting layer 6141 may protect the light emitting layer 613 from the UV light, the etching gas and the stripper solution to prevent the light emitting layer 613 of the display device 1 from being damaged.

Then, referring to FIGS. 2G to 2J, the process of FIGS. 2B to 2F a may be repeated to partially form the second organic light emitting layer 62 on the second subpixel 22.

In more detail, after the electron injecting layer 621, the electron transporting layer 622, the light emitting layer 623 and the first sub hole transporting layer 6241 of the second organic light emitting layer 62 are sequentially deposited on the entire surface over the first to third subpixels 21, 22 and 23 and then the shield layer SL and the PR layer are sequentially coated on the first sub hole transporting layer 6241. Afterwards, a mask M is arranged on an area of the second organic light emitting layer 62 and then an exposure process for exposing the PR layer of the other area to UV light is performed. Therefore, property of the other area except the area of the second organic light emitting layer 62 in the PR layer may be changed such that the corresponding area may be etched with a developing solution. The area of the second organic light emitting layer 62 is an area for forming the electron injecting layer 621, the electron transporting layer 622, the light emitting layer 623 and the first sub hole transporting layer 6241 of the second organic light emitting layer 62 on only the upper surface 42a of the second sub electrode 42, and may be smaller than a width of the second sub electrode 42. The light emitting layer 623 of the second organic light emitting layer 62 may emit green (G) light, but is not limited to this case.

During the exposure process of exposing the PR layer, the case that the first sub hole transporting layer 6241 arranged on the upper surface of the light emitting layer 623 shields the UV light to protect the light emitting layer 623 is the same as that the first sub hole transporting layer 6141 of the first organic light emitting layer 61 protects the light emitting layer 613 from the UV light. Therefore, the display device 1 according to the first aspect of the present disclosure may prevent the light emitting layer 623 of the second organic light emitting layer 62 from being damaged by the UV light used for the exposure process.

In this state, as shown in FIG. 2i, the PR layer except the other area of the PR layer on the area of the second organic light emitting layer 62 is removed using the developing solution, and as shown in FIG. 2j, a third removing process for removing the other except the electron injecting layer 621, the electron transporting layer 622, the light emitting layer 623 and the first sub hole transporting layer 6241 deposited on the area of the second organic light emitting layer 62, that is, the upper surface 42a of the second sub electrode 42 through the dry etching process or the strip process is performed. The electron injecting layer 621, the electron transporting layer 622, the light emitting layer 623 and the first sub hole transporting layer 6241 of the second organic light emitting layer 62, which are arranged on the first sub hole transporting layer 6141 of the first organic light emitting layer 61 on the first subpixel 21, may be removed by the third removing process. In this case, the electron injecting layer 611, the electron transporting layer 612, the light emitting layer 613 and the first sub hole transporting layer 6141 of the first organic light emitting layer 61, which are already formed on the first subpixel 21, may remain without being etched as shown in FIG. 2j because the dry etching process is entirely performed in a state that the PR layer remains only in the second subpixel 22 and the shield layer SL and the electron injecting layer 621, the electron transporting layer 622, the light emitting layer 623 and the first sub hole transporting layer 6241 of the second organic light emitting layer 62 are deposited at the same thickness on the other portion except the second subpixel 22 in which the PR layer remains and then etched at the same thickness in case of the same dry etching process time.

Meanwhile, in the manufacturing process of the display device 1 according to the first aspect of the present disclosure, after the first sub hole transporting layer 6241 is arranged on the upper surface of the light emitting layer 623 of the second organic light emitting layer 62, since the exposure process and the removing process, that is, the patterning process are performed, the first sub hole transporting layer 6241 may protect the light emitting layer 623 from the UV light, the etching gas and the stripper solution to prevent the light emitting layer 623 of the display device 1 from being damaged.

Then, referring to FIGS. 2k to 2n, the process of FIGS. 2b to 2f a may be repeated to partially form the third organic light emitting layer 63 on the third subpixel 23.

In more detail, after the electron injecting layer 631, the electron transporting layer 632, the light emitting layer 633 and the first sub hole transporting layer 6341 of the third organic light emitting layer 63 are sequentially deposited on the entire surface over the first to third subpixels 21, 22 and 23 and then the shield layer SL and the PR layer are sequentially coated on the first sub hole transporting layer 6341. Afterwards, a mask M is arranged on an area of the third organic light emitting layer 63 and then an exposure process for exposing the PR layer of the other area to UV light is performed. Therefore, property of the other area except the area of the third organic light emitting layer 63 in the PR layer may be changed such that the corresponding area may be etched with a developing solution. The area of the third organic light emitting layer 63 is an area for forming the electron injecting layer 631, the electron transporting layer 632, the light emitting layer 633 and the first sub hole transporting layer 6341 of the third organic light emitting layer 63 on only the upper surface 43a of the third sub electrode 43, and may be smaller than a width of the third sub electrode 43. The light emitting layer 633 of the third organic light emitting layer 63 may emit blue (B) light, but is not limited to this case.

During the exposure process of exposing the PR layer, the case that the first sub hole transporting layer 6341 arranged on the upper surface of the light emitting layer 633 shields the UV light to protect the light emitting layer 633 is the same as that the first sub hole transporting layers 6141 and 6241 of the first and second organic light emitting layers 61 and 62 protect the light emitting layers 613 and 623 from the UV light. Therefore, the display device 1 according to the first aspect of the present disclosure may prevent the light emitting layer 633 of the third organic light emitting layer 63 from being damaged by the UV light used for the exposure process.

In this state, as shown in FIG. 2m, the PR layer except the other area of the PR layer on the area of the third organic light emitting layer 63 is removed using the developing solution, and as shown in FIG. 2n, a fourth removing process for removing the other except the electron injecting layer 631, the electron transporting layer 632, the light emitting layer 633 and the first sub hole transporting layer 6341 deposited on the area of the third organic light emitting layer 63, that is, the upper surface 43a of the third sub electrode 43 through the dry etching process or the strip process is performed. The electron injecting layer 631, the electron transporting layer 632, the light emitting layer 633 and the first sub hole transporting layer 6341 of the third organic light emitting layer 63, which are arranged on the first sub hole transporting layer 6141 of the first organic light emitting layer 61 on the first subpixel 21, may be removed by the fourth removing process. Likewise, the electron injecting layer 631, the electron transporting layer 632, the light emitting layer 633 and the first sub hole transporting layer 6341 of the third organic light emitting layer 63, which are arranged on the first sub hole transporting layer 6241 of the second organic light emitting layer 62 on the second subpixel 22, may simultaneously be removed by the fourth removing process.

In the manufacturing process of the display device 1 according to the first aspect of the present disclosure, after the first sub hole transporting layer 6341 is arranged on the upper surface of the light emitting layer 633 of the third organic light emitting layer 63, since the exposure process and the removing process, that is, the patterning process are performed, the first sub hole transporting layer 6341 may protect the light emitting layer 633 from the UV light, the etching gas and the stripper solution to prevent the light emitting layer 633 of the display device 1 from being damaged.

Consequently, in the display device 1 according to the first aspect of the present disclosure, as each of the first sub hole transporting layers 6141, 6241 and 6341 is arranged on the upper surface of each of the light emitting layers 613, 623 and 633 of the first to third organic light emitting layers 61, 62 and 63, the light emitting layers 613, 623 and 633 may be protected from the UV light, the etching gas and the stripper solution, which are used for the patterning process of each of the organic light emitting layers 61, 62 and 63, whereby element characteristic of the light emitting layers 613, 623 and 633 may be prevented from being deteriorated.

Then, referring to FIGS. 2o to 2p, the second sub hole transporting layer 6142, the second hole transporting layer 615 and the hole injecting layer 616 of the first organic light emitting layer 61, the second electrode 7, and the encapsulation layer 8 may sequentially be deposited on the entire surface to cover the electron injecting layer 611, the electron transporting layer 612, the light emitting layer 613 and the first sub hole transporting layer 6141 of the first organic light emitting layer 61, which are respectively patterned for each of the first to third subpixels 21, 22 and 23, the electron injecting layer 621, the electron transporting layer 622, the light emitting layer 623 and the first sub hole transporting layer 6241 of the second organic light emitting layer 62, and the electron injecting layer 631, the electron transporting layer 632, the light emitting layer 633 and the first sub hole transporting layer 6341 of the third organic light emitting layer 63, whereby the manufacturing process may partially be completed.

In this case, since the second sub hole transporting layer 6142, the second hole transporting layer 615 and the hole injecting layer 616 of the first organic light emitting layer 61 are common layers deposited on the entire surface over the first subpixel 21, the second subpixel 22 and the third subpixel 23, the second sub hole transporting layer 6142, the second hole transporting layer 615 and the hole injecting layer 616 of the first organic light emitting layer 61 may be the second sub hole transporting layer, the second hole transporting layer and the hole injecting layer of the second organic light emitting layer 62, and may be the second sub hole transporting layer, the second hole transporting layer and the hole injecting layer of the third organic light emitting layer 63.

Therefore, the second sub hole transporting layer 6142 deposited on the entire surface over the first to third subpixels 21, 22 and 23 may cover upper surfaces and sides of the first sub hole transporting layers 6141, 6241 and 6341, sides of the light emitting layers 613, 623 and 633, sides of the electron transporting layers 612, 622 and 632, and sides of the electron injecting layers 611, 621 and 631.

In the display device 1 according to the first aspect of the present disclosure, as the second sub hole transporting layer 6142, the second hole transporting layer 615 and the hole injecting layer 616 of the organic light emitting layer 6 are arranged as common layers covering all of the first to third subpixels 21, 22 and 23, the number of manufacturing processes may be reduced as compared with the case that the second sub hole transporting layer, the second hole transporting layer and the hole injecting layer are formed for each of the subpixels, whereby a tact time of the complete display device may be reduced.

Meanwhile, as shown in FIG. 2p, the electron injecting layer 611, the electron transporting layer 612, the light emitting layer 613 and the first sub hole transporting layer 6141 of the first organic light emitting layer 61 may be arranged to be respectively spaced apart from the electron injecting layer 621, the electron transporting layer 622, the light emitting layer 623 and the first sub hole transporting layer 6241 of the second organic light emitting layer 62. Therefore, a leakage current does not occur toward the second subpixel 22 even though an electric field is formed between the first sub electrode 41 and the second electrode 7, whereby the second subpixel 22 may not emit light. Likewise, a leakage current does not occur toward the first subpixel 21 even though an electric field is formed between the second sub electrode 42 and the second electrode 7, whereby the first subpixel 21 may not emit light.

Also, the electron injecting layer 631, the electron transporting layer 63, the light emitting layer 63 and the first sub hole transporting layer 631 of the third organic light emitting layer 63 may be arranged to be respectively spaced apart from the electron injecting layer 621, the electron transporting layer 622, the light emitting layer 623 and the first sub hole transporting layer 6241 of the second organic light emitting layer 62. Therefore, a leakage current does not occur toward the second subpixel 22 even though an electric field is formed between the third sub electrode 43 and the second electrode 7, whereby the second subpixel 22 may not emit light.

Consequently, in the display device 1 according to the first aspect of the present disclosure, the electron injecting layers 611, 621 and 631, the electron transporting layers 612, 622 and 632, the light emitting layers 613, 623 and 633 and the first sub hole transporting layers 6141, 6241 and 6341 of the first to third organic light emitting layers 61, 62 and 63 may be provided to be spaced apart from each other, whereby a color mixture may be prevented from being generated between adjacent subpixels emitting light of different colors.

Figure 3:
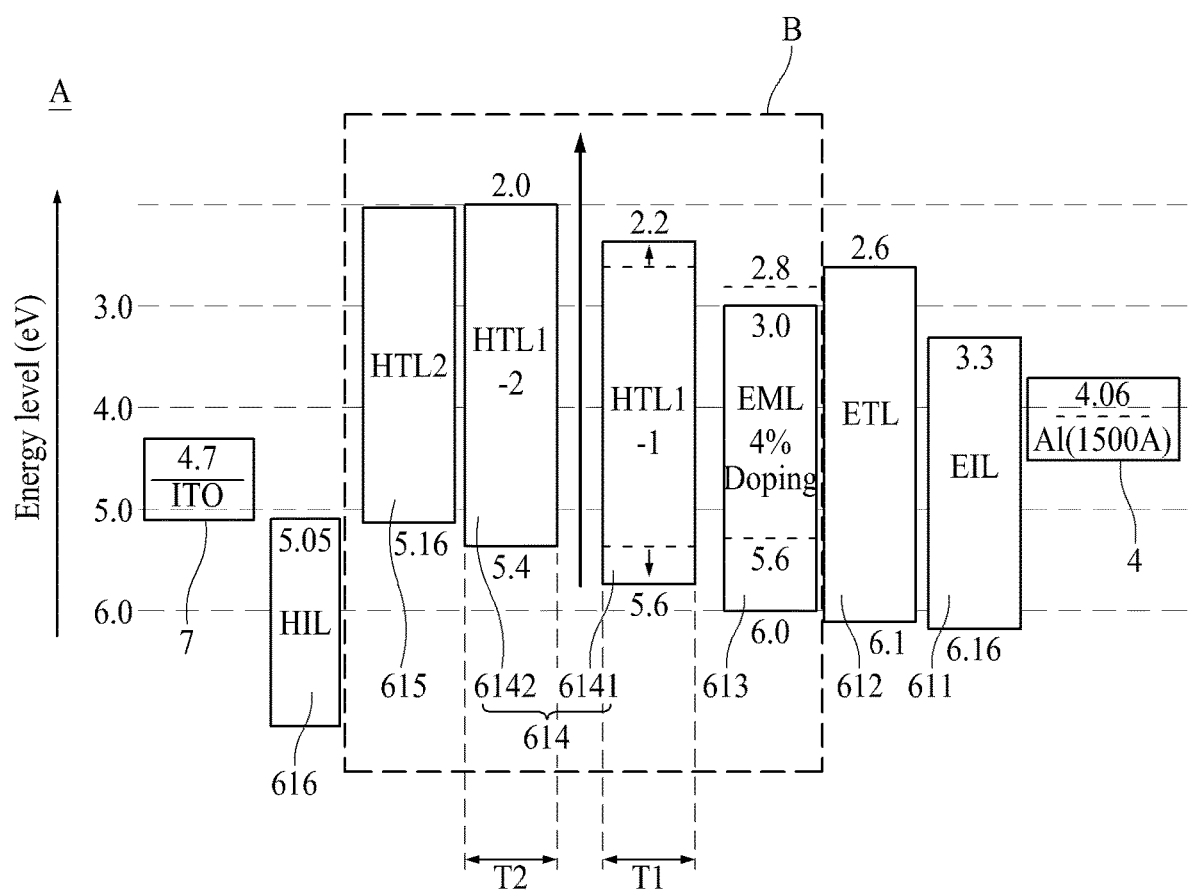
FIG. 3 is a schematic structural view illustrating a portion A of FIG. 1.
Figure 4:
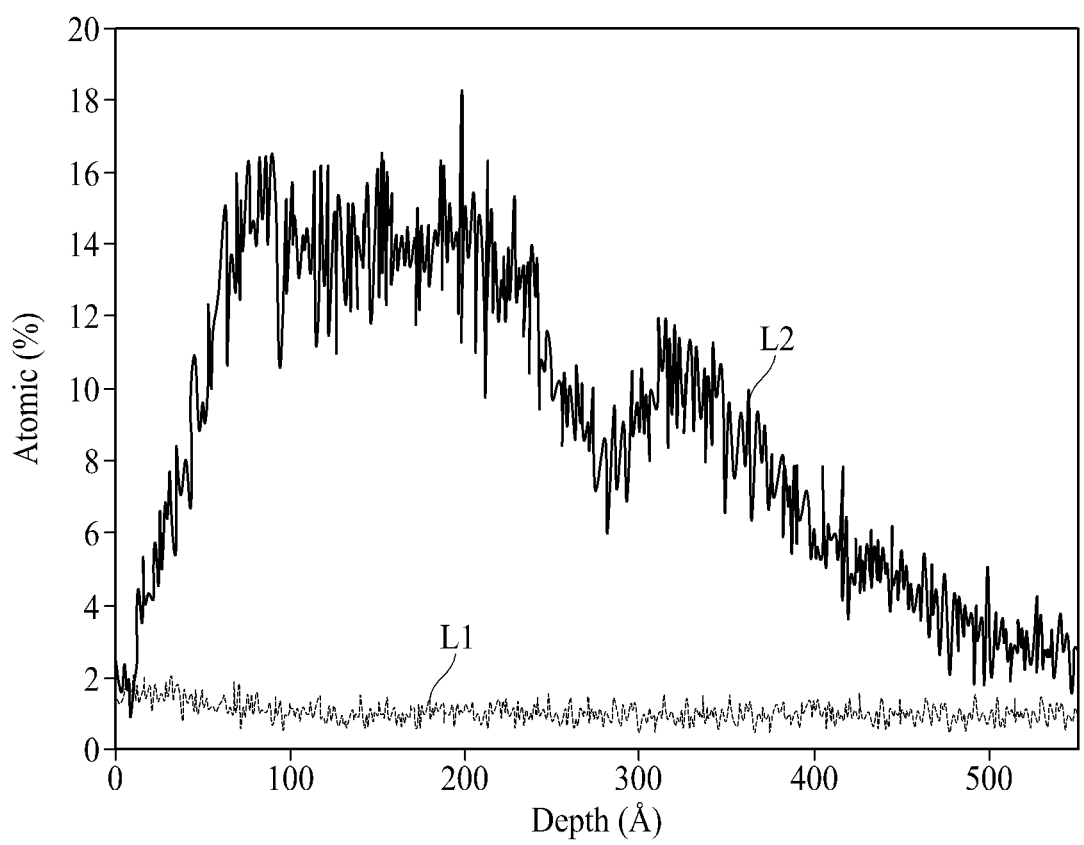
FIG. 4 is a graph illustrating a ratio of oxygen contained in a first sub hole transporting layer and a second sub hole transporting layer in FIG. 3.
Figure 5:
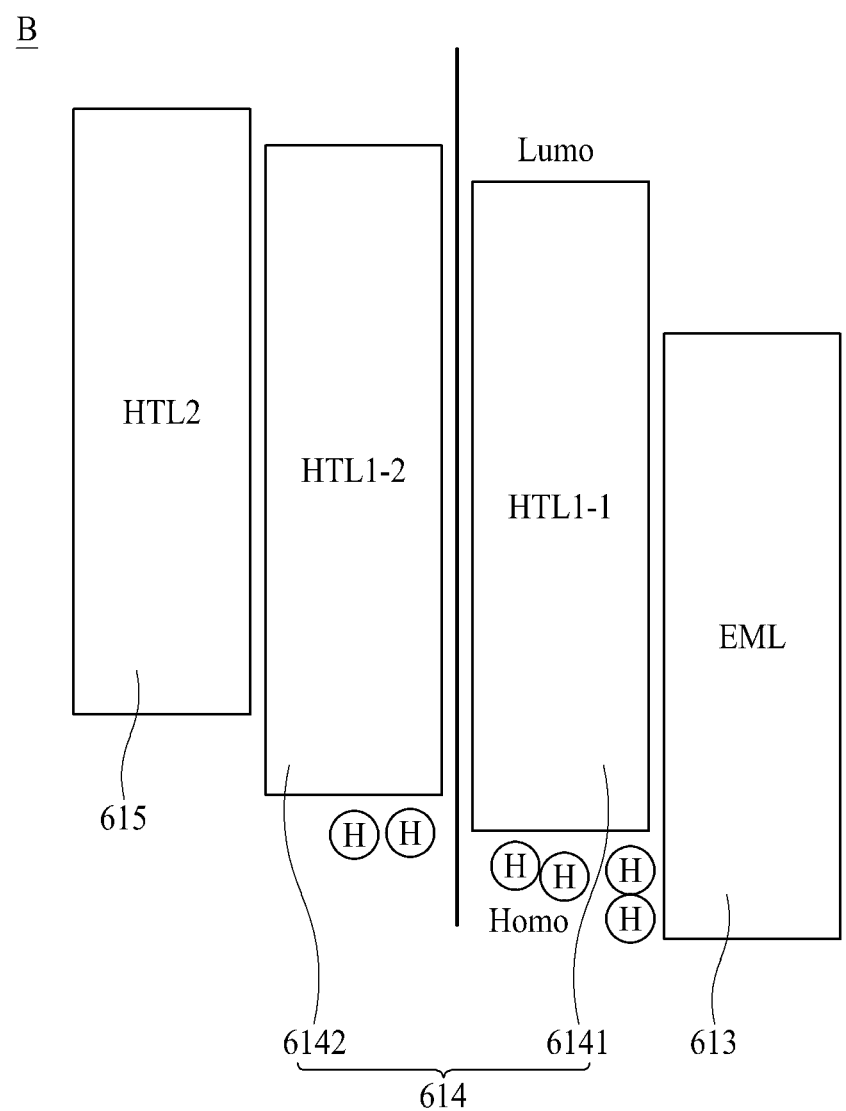
FIG. 5 is a schematic structural view illustrating a portion B of FIG. 3.
Figure 6:
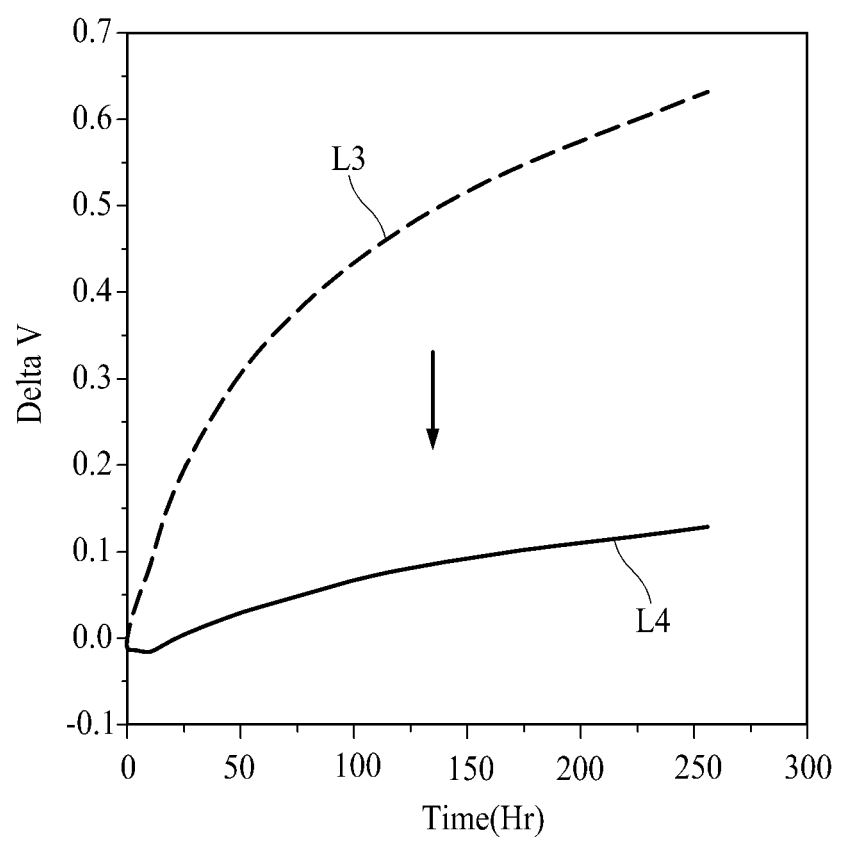
FIG. 6 is a graph illustrating a voltage change according to driving of an organic light emitting layer of a display device according to the first aspect of the present disclosure.

FIG. 3 is a schematic structural view illustrating a portion A of FIG. 1, FIG. 4 is a graph illustrating a ratio of oxygen contained in a first sub hole transporting layer and a second sub hole transporting layer in FIG. 3, FIG. 5 is a schematic structural view illustrating a portion B of FIG. 3, and FIG. 6 is a graph illustrating a voltage change according to driving of an organic light emitting layer of a display device according to the first aspect of the present disclosure.

Referring to FIGS. 3 to 6, in the display device 1 according to the first aspect of the present disclosure, since the patterning process including exposure and etching processes is performed in a state that each of the first sub hole transporting layers 6141, 6241 and 6341 covers an upper surface of each of the light emitting layers 613, 623 and 633, an energy level of the second sub hole transporting layer 6142 arranged as a common layer with the first sub hole transporting layers 6141, 6241 and 6341, that is, an energy level difference may occur.

FIG. 3 illustrates the electron injecting layer 611, the electron transporting layer 612, the light emitting layer 613, the first hole transporting layer 614 including the first sub hole transporting layer 6141 and the second sub hole transporting layer 6142, the second hole transporting layer 615 and the hole injecting layer 616 of the first organic light emitting layer 61 arranged on the first subpixel 21 to emit red (R) light, and their energy levels. As shown in FIG. 3, the electron injecting layer 611, the electron transporting layer 612, the light emitting layer 613, the first sub hole transporting layer 6141, the second sub hole transporting layer 6142, the second hole transporting layer 615 and the hole injecting layer 616, which constitute the first organic light emitting layer 61, have their respective energy levels different from one another.

In more detail, LUMO energy level of the electron transporting layer 612 may be greater than LUMO energy level of the electron injecting layer 611, and HOMO energy level of the electron transporting layer 612 may be greater than HOMO energy level of the electron injecting layer 611. LUMO energy level of the light emitting layer 613 may be smaller than LUMO energy level of the electron transporting layer 612, and HOMO energy level of the light emitting layer 613 may be greater than LUMO energy level of the electron transporting layer 612. LUMO energy level of the first sub hole transporting layer 6141 may be greater than LUMO energy level of the light emitting layer 613, and HOMO energy level of the first sub hole transporting layer 6141 may be greater than HOMO energy level of the light emitting layer 613. LUMO energy level of the second sub hole transporting layer 6142 may be greater than LUMO energy level of the first sub hole transporting layer 6141, and HOMO energy level of the second sub hole transporting layer 6142 may be greater than HOMO energy level of the first sub hole transporting layer 6141. LUMO energy level of the second hole transporting layer 615 may be smaller than LUMO energy level of the second sub hole transporting layer 6142, and HOMO energy level of the second hole transporting layer 615 may be greater than HOMO energy level of the second sub hole transporting layer 6142. LUMO energy level of the hole injecting layer 616 may be smaller than LUMO energy level of the second hole transporting layer 615, and HOMO energy level of the hole injecting layer 616 may be smaller than HOMO energy level of the second hole transporting layer 615.

A LUMO energy level difference at a boundary of the respective layers in the electron injecting layer 611, the electron transporting layer 612 and the light emitting layer 613, which correspond to electron transporting portions, may affect a driving voltage, and a HOMO energy level difference at a boundary of the respective layers in the hole injecting layer 616, the second hole transporting layer 615, the second sub hole transporting layer 6142, the first sub hole transporting layer 6141 and the light emitting layer 613, which correspond to hole transporting portions, may affect a driving voltage. Therefore, if the LUMO energy level difference of the respective layers in the electron transporting portions is great, since the electrons cannot actively move to the light emitting layer 613, the driving voltage may become high. If the LUMO energy level difference of the respective layers in the electron transporting portions is small, since the electrons can actively move to the light emitting layer 613, the driving voltage may become low. Likewise, if the HOMO energy level difference of the respective layers in the hole transporting portions is great, since the holes cannot actively move to the light emitting layer 613, the driving voltage may become high. If the HOMO energy level difference of the respective layers in the hole transporting portions is small, since the holes can actively move to the light emitting layer 613, the driving voltage may become low.

In the display device 1 according to the first aspect of the present disclosure, since the patterning process such as the exposure process and the dry etching process is performed after up to the first sub hole transporting layer 6141 is arranged on the light emitting layer 613, the first sub hole transporting layer 6141 may shield UV light to prevent the light emitting layer 613 from being degraded, thereby preventing the light emitting layer 613 from being damaged and also preventing the light emitting layer 613 from being damaged from the etching gas or the stripper solution as described in the aforementioned manufacturing process.

Meanwhile, since the exposure process is performed on the first sub hole transporting layer 6141, the first sub hole transporting layer 6141 may be degraded. Therefore, the LUMO energy level of the first sub hole transporting layer 6141 may become great and the HOMO energy level of the first sub hole transporting layer 6141 may become small. That is, as shown in FIG. 3, the first sub hole transporting layer 6141 may be expanded upwardly and downwardly. Therefore, an energy level difference between the first sub hole transporting layer 6141 and the layer arranged on the first sub hole transporting layer 6141 becomes great.

However, in the display device 1 according to the first aspect of the present disclosure, as the second sub hole transporting layer 6142 made of the same material as that of the first sub hole transporting layer 6141 subjected to the patterning process is arranged on the first sub hole transporting layer 6141, an energy gap between the first sub hole transporting layer 6141 and the second sub hole transporting layer 6142 may be reduced as compared with the case that the layer made of a material different from that of the first sub hole transporting layer 6141 is arranged on the first sub hole transporting layer 6141.

In more detail, a difference between the LUMO energy level of the first sub hole transporting layer 6141 and the LUMO energy level of the second sub hole transporting layer 6142 may be 0.2 eV or more and 0.5 eV or less. And, a difference between the HOMO energy level of the first sub hole transporting layer 6141 and the HOMO energy level of the second sub hole transporting layer 6142 may be 0.2 eV or more and 0.5 eV or less.

Also, in the display device 1 according to the first aspect of the present disclosure, as the second sub hole transporting layer 6142 made of the same material as that of the first sub hole transporting layer 6141 is arranged on the first sub hole transporting layer 6141, the first sub hole transporting layer 6141 lost by the patterning process may be compensated to prevent light emission efficiency of the first organic light emitting layer 61 from being deteriorated.

Referring to FIG. 3 again, the second hole transporting layer 615 arranged to cover the second sub hole transporting layer 6142 may be made of a material different from that of the second sub hole transporting layer 6142. The second hole transporting layer 615 may be made of a material, which can inject holes into the second sub hole transporting layer 6142 well, as a material required for element characteristic.

In more detail, as shown in FIG. 3, the second hole transporting layer 615 is arranged between the hole injecting layer 616 and the second sub hole transporting layer 6142 and thus arranged on the second sub hole transporting layer 6142. In this case, it is noted that the HOMO energy level of the second hole transporting layer 615 has a difference of about 0.11 eV with the LUMO energy level of the hole injecting layer 616, and the HOMO energy level of the second sub hole transporting layer 6142 has a difference of about 0.35 eV with the LUMO energy level of the hole injecting layer 616. That is, if the second hole transporting layer 615 is made of the same material as that of the second sub hole transporting layer 6142, the second hole transporting layer 615 has an energy level difference of about 0.35 eV with the hole injecting layer 616 as described above. This energy level difference is greater than 0.11 eV which is an energy level difference when the second hole transporting layer 615 is made of a material different from that of the second sub hole transporting layer 6142. If the energy level difference is great, holes fail to actively move from the hole injecting layer to the second hole transporting layer, whereby holes are accumulated between an interface between the hole injecting layer and the second hole injecting layer. This may make the driving voltage of the organic light emitting layer high. If the driving voltage of the organic light emitting layer becomes high, a problem may occur in that lifetime of the light emitting diode is shortened.

As a result, in the display device 1 according to the first aspect of the present disclosure, since the second hole transporting layer 615 is arranged to have a material different from that of the second sub hole transporting layer 6142, the energy level difference with the hole injecting layer 616 may be reduced to move the holes from the hole injecting layer 616 to the second sub hole transporting layer 6142 through the second hole transporting layer 615, whereby lifetime of the light emitting diode may be prevented from being shortened.

Referring to FIG. 4, in the display device 1 according to the first aspect of the present disclosure, since the patterning process such as the exposure process and the dry etching process is performed after up to the first sub hole transporting layer 6141 is arranged on the light emitting layer 613, the first sub hole transporting layer 6141 may be exposed to the air and therefore O2 in the air may be included in the first sub hole transporting layer 6141.

Therefore, in the display device 1 according to the first aspect of the present disclosure, a ratio of $O_2$ included in the first sub hole transporting layer 6141 and $O_2$ included in the second sub hole transporting layer 6142 may be higher than the case that the first sub hole transporting layer and the second sub hole transporting layer are continuously deposited in a vacuum state without a patterning process. For example, the ratio of $O_2$ included in the first sub hole transporting layer and $O_2$ included in the second sub hole transporting layer in the case that the first sub hole transporting layer and the second sub hole transporting layer are continuously deposited in a vacuum state without a patterning process is 2% or less, whereas the ratio of $O_2$ included in the first sub hole transporting layer 6141 and $O_2$ included in the second sub hole transporting layer 6142 in the display device 1 according to the first aspect of the present disclosure may be 3% or more and 16% or less. This is shown as a graph of FIG. 4.

In FIG. 4, a horizontal axis denotes a thickness of the first hole transporting layer, that is, a sum of a thickness of the first sub hole transporting layer and a thickness of the second sub hole transporting layer, and a vertical axis denotes a rate of $O_2$ included in the first hole transporting layer. In this case, L1 is a graph illustrating a rate of $O_2$ included in the first hole transporting layer in the case that the first sub hole transporting layer and the second sub hole transporting layer are continuously deposited in a vacuum state without a patterning process, and L2 is a graph illustrating a rate of $O_2$ included in the first hole transporting layer 614 in the display device 1 according to the first aspect of the present disclosure. As shown in FIG. 4, L1 shows that the rate of $O_2$ included in the first hole transporting layer is 1% because the first sub hole transporting layer and the second sub hole transporting layer are continuously deposited in a vacuum state. On the other hand, L2 shows that the rate of $O_2$ included in the first hole transporting layer 614 is 3% or more and 16% or less and is higher than L1, especially shows the highest rate of $O_2$ at 100 Å or more and 200 Å or less close to the upper surface of the first sub hole transporting layer 6141.

In the display device 1 according to the first aspect of the present disclosure, it is noted that the patterning process is performed between the first sub hole transporting layer 6141 and the second sub hole transporting layer 6142, which are made of the same material, by checking the rate of $O_2$ included in the first hole transporting layer 614. The rate of $O_2$ included in the first hole transporting layer 614 may be checked through an analysis method such as EDS.

Also, the display device 1 according to the first aspect of the present disclosure may be provided such that a content of $O_2$ is increased toward the center of the first hole transporting layer 614 rather than an interface between the first hole transporting layer 614 and another layer.

Meanwhile, referring to FIG. 3, the display device 1 according to the first aspect of the present disclosure may be provided such that a thickness T1 (shown in FIG. 3) of the first sub hole transporting layer 6141 is equal to a thickness T2 (shown in FIG. 3) of the second sub hole transporting layer 6142. For example, one hole transporting layer is provided in the related art and its thickness is 400 Å, whereas a sum thickness of the first sub hole transporting layer 6141 and the second hole transporting layer 6142 is 400 Å in the display device 1 of the present disclosure. That is, in the display device 1 of the present disclosure, one hole transporting layer of the related art may be divided into two. Therefore, the thickness T1 of the first sub hole transporting layer 6141 may be 200 Å, and the thickness T2 of the second sub hole transporting layer 6142 may be 200 Å. However, without limitation to this example, the thickness T1 of the first sub hole transporting layer 6141 may be 100 Å or more, and the thickness T2 of the second sub hole transporting layer 6142 may be 300 Å or less. This is because that a protective effect of the light emitting layer 613 from the UV light, the etching gas and the stripper solution, which are used for the patterning process, is deteriorated if the thickness T1 of the first sub hole transporting layer 6141 is less than 100 Å.

In the display device 1 according to the first aspect of the present disclosure, a sum thickness of the first sub hole transporting layer and the second sub hole transporting layer may equally be provided as 400 Å for each of the first to third subpixels 21, 22 and 23, and the thickness T2 of the second sub hole transporting layer 6142 may be varied depending on the thickness T1 of the first sub hole transporting layer 6141.

This is because that an interval between the first electrode 4 and the second electrode 7 is varied for each of the subpixels to form a different electric field for each of the subpixels if the sum thickness of the first sub hole transporting layer and the second sub hole transporting layer is varied for each of the first to third subpixels 21, 22 and 23. If a different electric field for each of the subpixels is formed, luminance of a specific color is only increased, whereby a problem may occur in that luminance becomes non-uniform in view of an entire aspect.

Therefore, in the display device 1 according to the first aspect of the present disclosure, the sum thickness of the first sub hole transporting layer 6141 and the second sub hole transporting layer 6142 is equally provided for each of the first to third subpixels 21, 22 and 23, whereby overall luminance may be prevented from being non-uniform.

FIG. 5 illustrates that the first sub hole transporting layer 6141 and the second sub hole transporting layer 6142 are made of the same material and therefore holes actively move without being accumulated between the interface between the first sub hole transporting layer 6141 and the second sub hole transporting layer 6142.

As described above, since the patterning process is performed in a state that up to the first sub hole transporting layer 6141 is deposited on the light emitting layer 613, the first sub hole transporting layer 6141 may be expanded by air exposure and therefore it may be difficult to inject holes into the first sub hole transporting layer 6141. If another layer made of a material different from that of the first sub hole transporting layer is arranged on the first sub hole transporting layer, holes are accumulated between the interface between the first sub hole transporting layer and another layer, whereby a problem may occur in that a driving voltage becomes high in emitting light.

However, in the display device 1 according to the first aspect of the present disclosure, the second sub hole transporting layer 6142 made of the same material as that of the first sub hole transporting layer 6141 is arranged on the first sub hole transporting layer 6141, whereby an initial driving voltage may be maintained without change even if the time passes. This is shown in the graph illustrated in FIG. 6.

In FIG. 6, a horizontal axis denotes time, and a vertical axis denotes a change of a driving voltage. In this case, L3 is a graph illustrating a change of a driving voltage according to time when the light emitting layer is exposed to the air by the patterning process performed on the light emitting layer and the hole transporting layer is deposited on the light emitting layer, and L4 is a graph illustrating a change of a driving voltage according to time when the patterning process is performed in a state that up to the first sub hole transporting layer 6141 is deposited on the light emitting layer 613 of the display device 1 according to the first aspect of the present disclosure and the second sub hole transporting layer 6142 made of the same material as that of the first sub hole transporting layer 6141 is deposited on the first sub hole transporting layer 6141. As shown in FIG. 6, since the light emitting layer is exposed to the air and the hole transporting layer made of a material different from that of the light emitting layer is deposited on the light emitting layer, holes are accumulated in the interface between the light emitting layer and the hole transporting layer made of a material different from that of the light emitting layer, whereby it is noted from L3 that the driving voltage becomes high in accordance with the passage of time. On the other hand, since the second sub hole transporting layer 6142 made of the same material as that of the first sub hole transporting layer 6141 is arranged on the first sub hole transporting layer 6141 even though the first sub hole transporting layer 6141 is exposed to the air, holes actively move from the second sub hole transporting layer 6142 to the first sub hole transporting layer 6141, whereby it is noted from L4 that there is no almost change of the driving voltage according to time.

Consequently, in the display device 1 according to the first aspect of the present disclosure, the second sub hole transporting layer 6142 made of the same material as that of the first sub hole transporting layer 6141 is provided to cover the first sub hole transporting layer 6141 even though the first sub hole transporting layer 6141 is exposed to the air, whereby the holes may be prevented from being accumulated in the interface between the first sub hole transporting layer 6141 and the second sub hole transporting layer 6142 to prevent the driving voltage from being become high. For this reason, a lifetime of the light emitting diode of the light emitting layer 613 may be prevented from being shortened.

Figure 7:
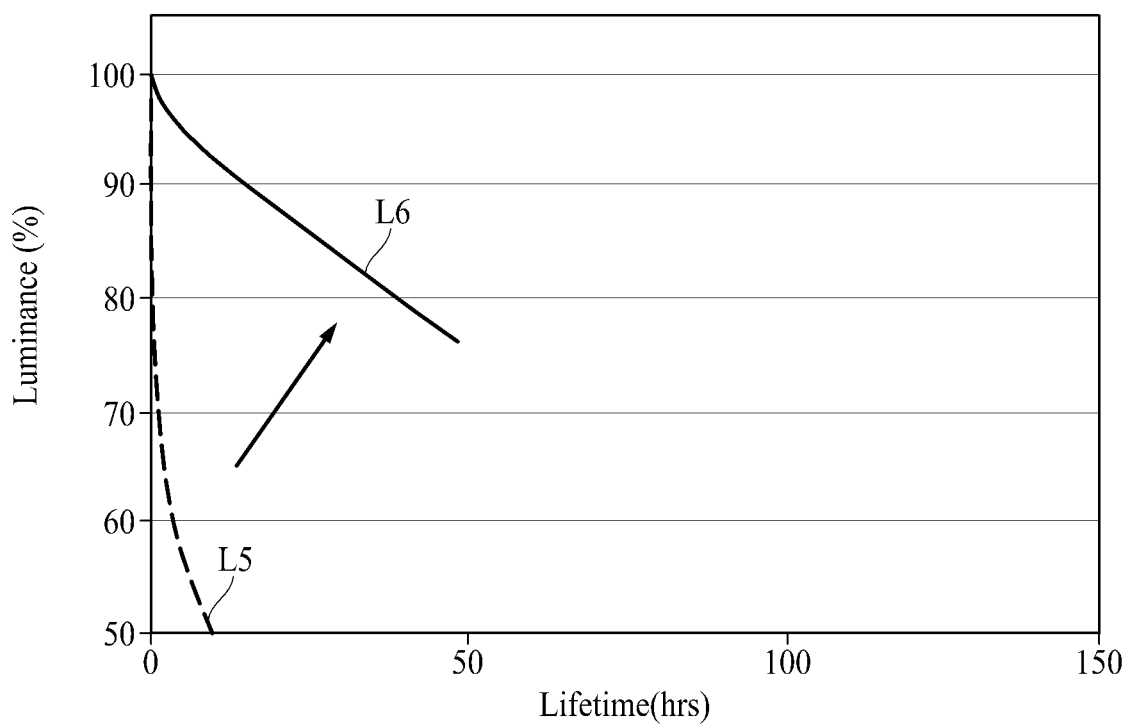
FIG. 7 is a graph illustrating lifetime improvement of an organic light emitting layer of a display device according to the first aspect of the present disclosure.

FIG. 7 is a graph illustrating lifetime improvement of an organic light emitting layer of a display device according to the first aspect of the present disclosure.

In FIG. 7, a horizontal axis denotes time, and a vertical axis denotes initial luminance converted into a percentage. In this case, L5 is a graph illustrating a lifetime of the light emitting layer when the patterning process is performed on the light emitting layer and the hole transporting layer is provided as one layer and deposited on the light emitting layer, and L6 is a graph illustrating a lifetime of the light emitting layer when the patterning process is performed in a state that the first sub hole transporting layer 6141 of the display device 1 according to the first aspect of the present disclosure covers the light emitting layer 613 and the second sub hole transporting layer 6142 made of the same material as that of the first sub hole transporting layer 6141 covers the first sub hole transporting layer 6141. As shown in FIG. 7, a lifetime of the light emitting diode of the light emitting layer is about one hour when luminance is about 78% in L5, whereas a lifetime of the light emitting diode of the light emitting layer is about 50 hours when luminance is about 78% in L6.

Consequently, in the display device 1 according to the first aspect of the present disclosure, the patterning process is performed in a state that the first sub hole transporting layer 6141 covers the light emitting layer 613, and the second sub hole transporting layer 6142 made of the same material as that of the first sub hole transporting layer 6141 is arranged to cover the first sub hole transporting layer 6141, whereby the lifetime of the light emitting diode of the light emitting layer 613 may be more improved than the case that the patterning process is performed on the light emitting layer and the hole transporting layer made of a material different from that of the light emitting layer is arranged on the light emitting layer.

Figure 8:
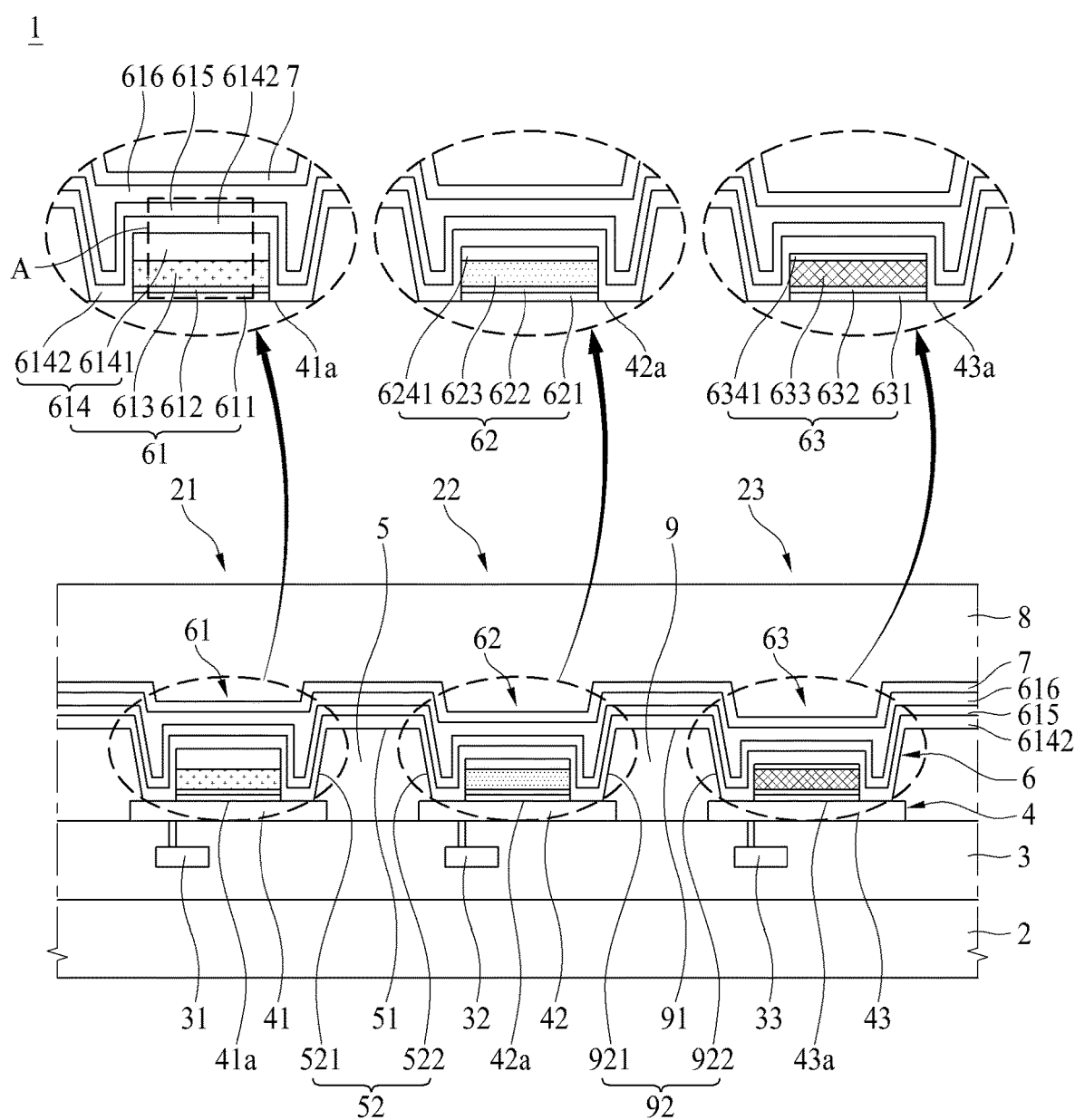
FIG. 8 is a cross-sectional view illustrating a display device according to a second aspect of the present disclosure.

FIG. 8 is a cross-sectional view illustrating a display device according to the second aspect of the present disclosure.

Referring to FIG. 8, the display device 1 according to the second aspect of the present disclosure is the same as the display device 1 according to FIG. 1 except that thicknesses of the first sub hole transporting layers 6141, 6241 and 6341 of the first to third organic light emitting layers 61, 62 and 63 are different from one another. Therefore, the same reference numerals are given to the same elements, and only different elements will be described hereinafter.

In the aforementioned display device according to FIG. 1, the first sub hole transporting layers 6141, 6241 and 6341 of the first to third organic light emitting layers 61, 62 and 63 are formed to have the same thickness.

On the contrary, in the display device according to FIG. 8, the first sub hole transporting layer 6141 of the first organic light emitting layer 61 is thicker than the first sub hole transporting layer 6241 of the second organic light emitting layer 62 and the first sub hole transporting layer 6341 of the third organic light emitting layer 63, and the first sub hole transporting layer 6241 of the second organic light emitting layer 62 is thicker than the first sub hole transporting layer 6341 of the third organic light emitting layer 63. Therefore, the display device 1 according to the second aspect of the present disclosure may embody the microcavity characteristic for each of the first to third subpixels 21, 22 and 23.

Meanwhile, the second sub hole transporting layer 6142, the second hole transporting layer 615 and the hole injecting layer 616 of the first organic light emitting layer 61, which are arranged as common layers above the first sub hole transporting layers 6141, 6241 and 6341 of the first to third organic light emitting layers 61, 62 and 63, may be provided to have a step difference along a profile of the first sub hole transporting layers 6141, 6241 and 6341 as the first sub hole transporting layers 6141, 6241 and 6341 of the first to third organic light emitting layers 61, 62 and 63 are provided to have their respective thicknesses different from one another.

The first organic light emitting layer 61 may be provided to emit red light, the second organic light emitting layer 62 may be provided to emit green light, and the third organic light emitting layer 63 may be provided to emit blue light, but the organic light emitting layers are not limited to this example. However, the first sub hole transporting layer arranged on the organic light emitting layer emitting light of a long wavelength, for example, red light may be thicker than the first sub hole transporting layer arranged on the organic light emitting layer emitting light of a short wavelength, for example, blue light.

Figure 9:
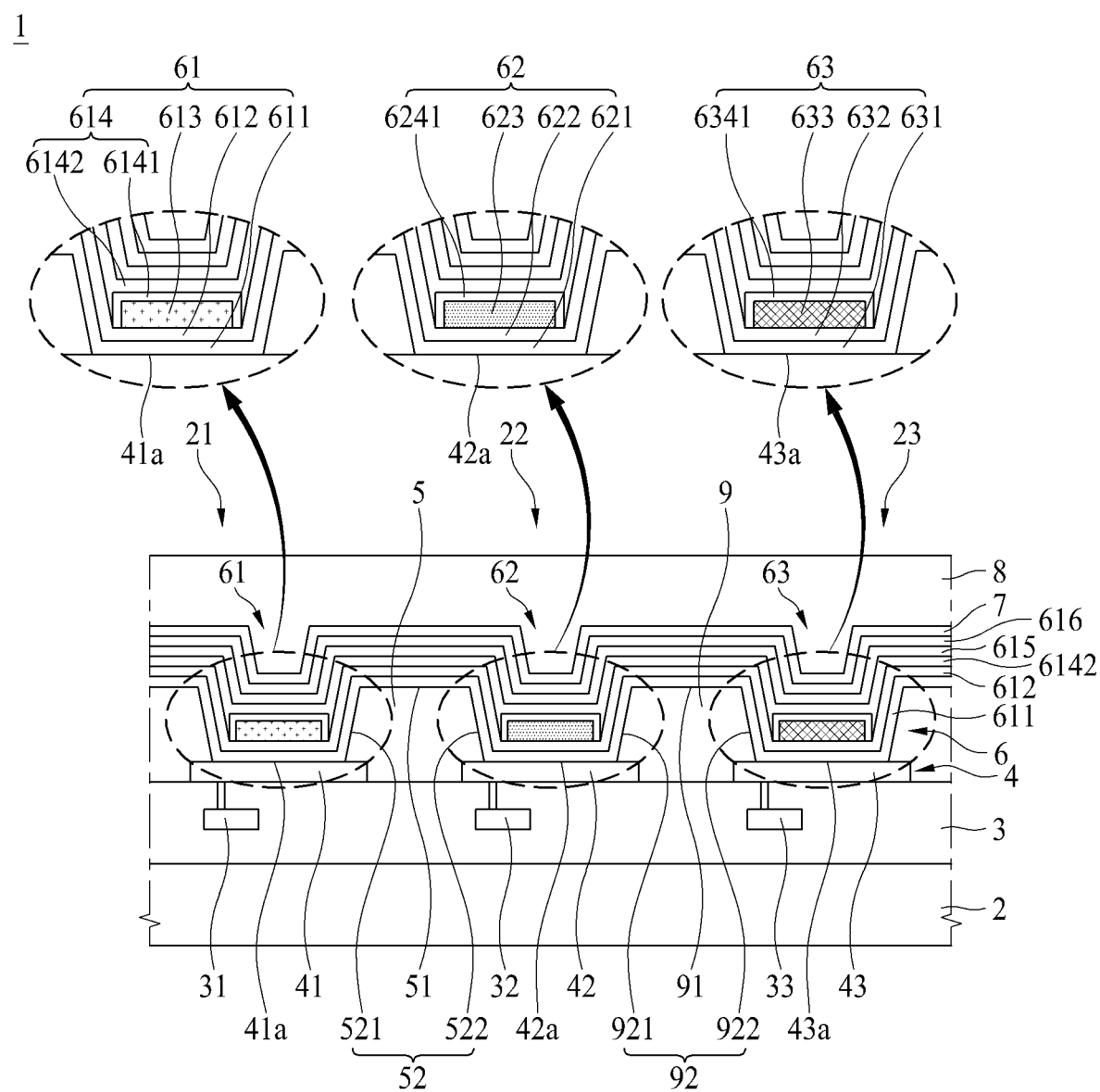
FIG. 9 is a cross-sectional view illustrating a display device according to a third aspect of the present disclosure.

FIG. 9 is a cross-sectional view illustrating a display device according to the third aspect of the present disclosure, and FIGS. 10A to 10J are cross-sectional views illustrating a manufacturing process of a display device according to the third aspect of the present disclosure.

Figure 10A:
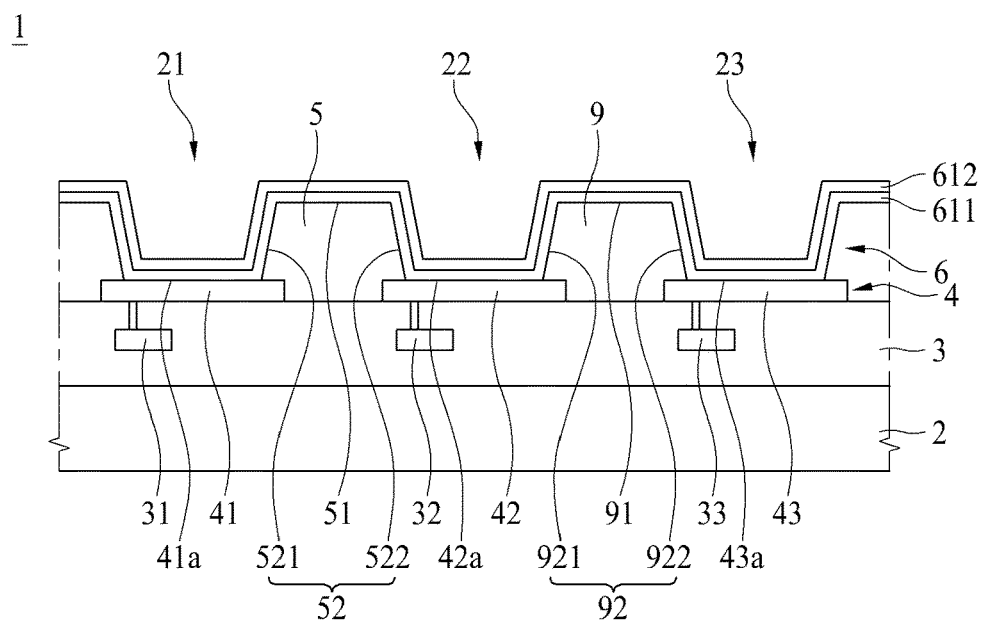
FIGS. 10A to 10J are cross-sectional views illustrating a manufacturing process of a display device according to the third aspect of the present disclosure.
Figure 10B:
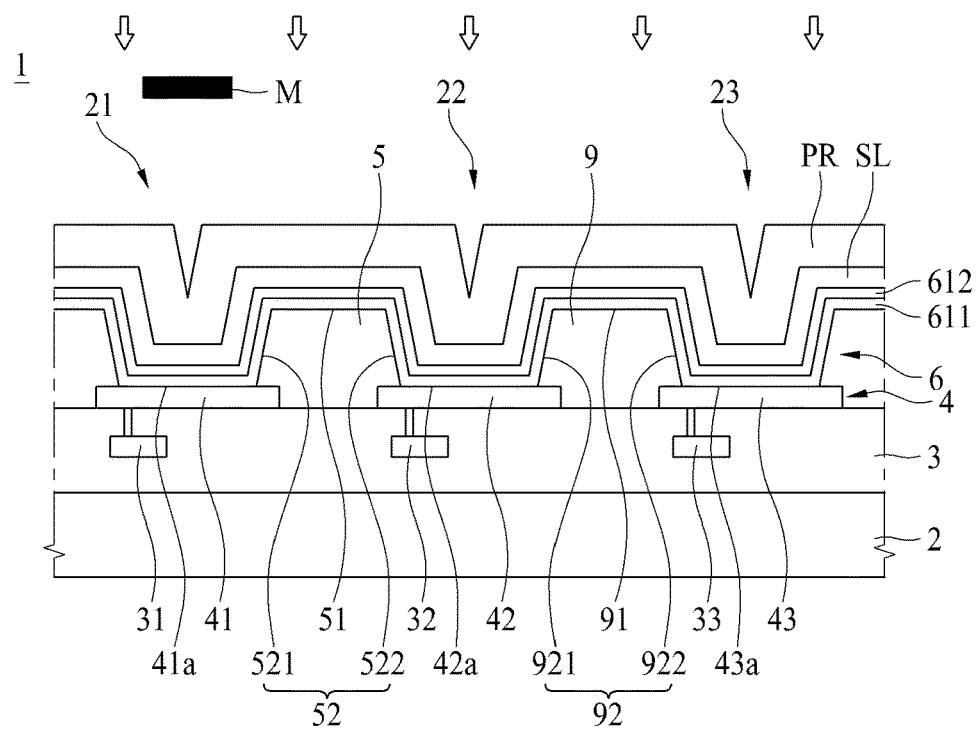
Figure 10C:
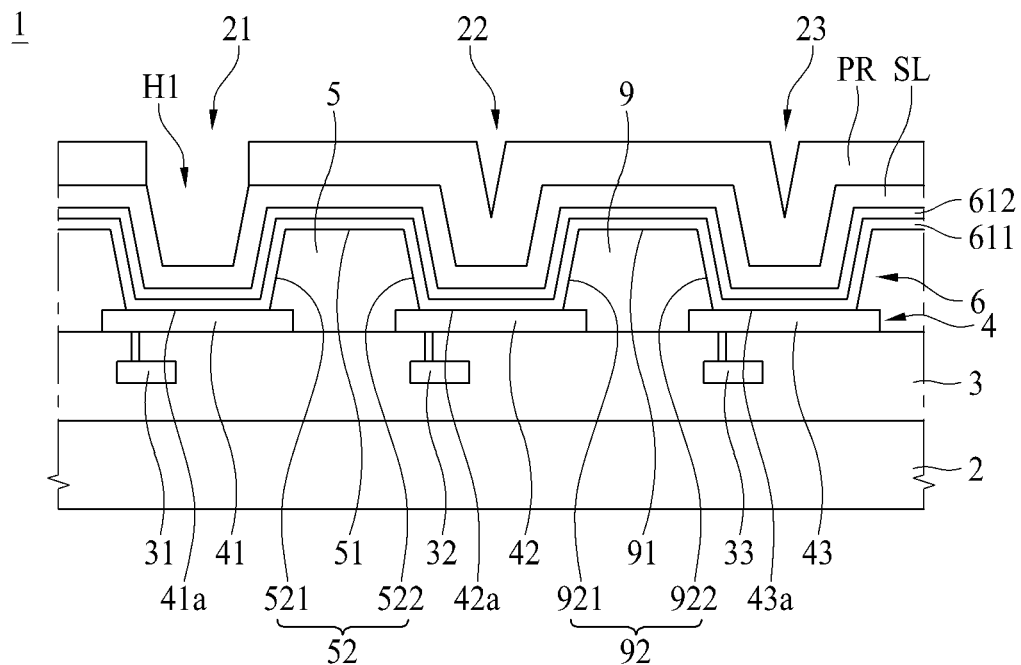
Figure 10D:
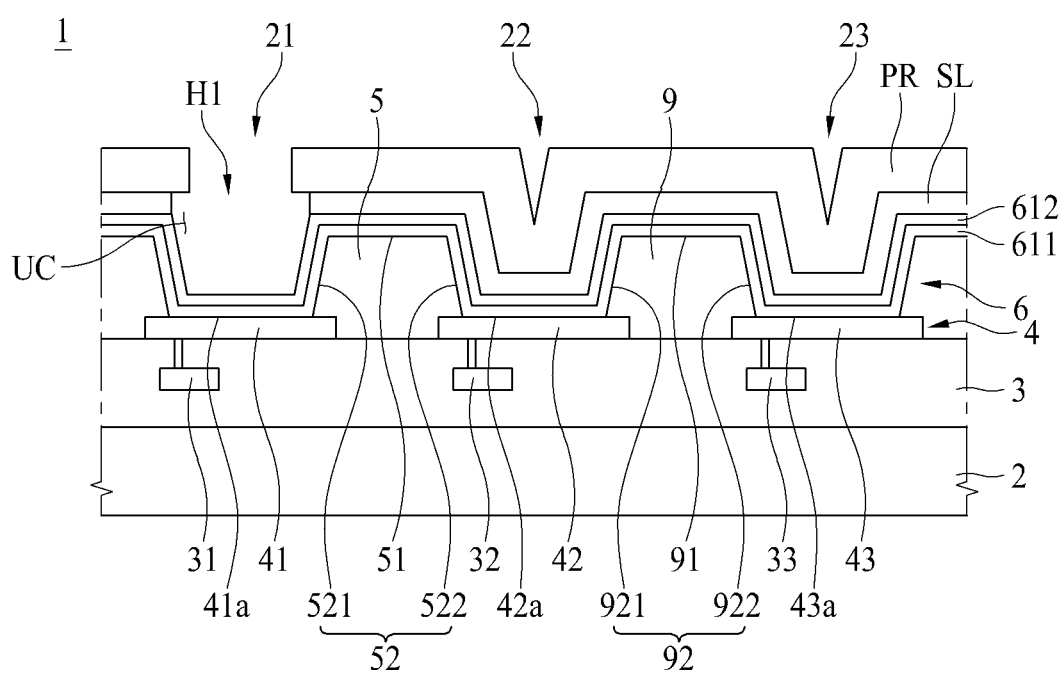
Figure 10E:
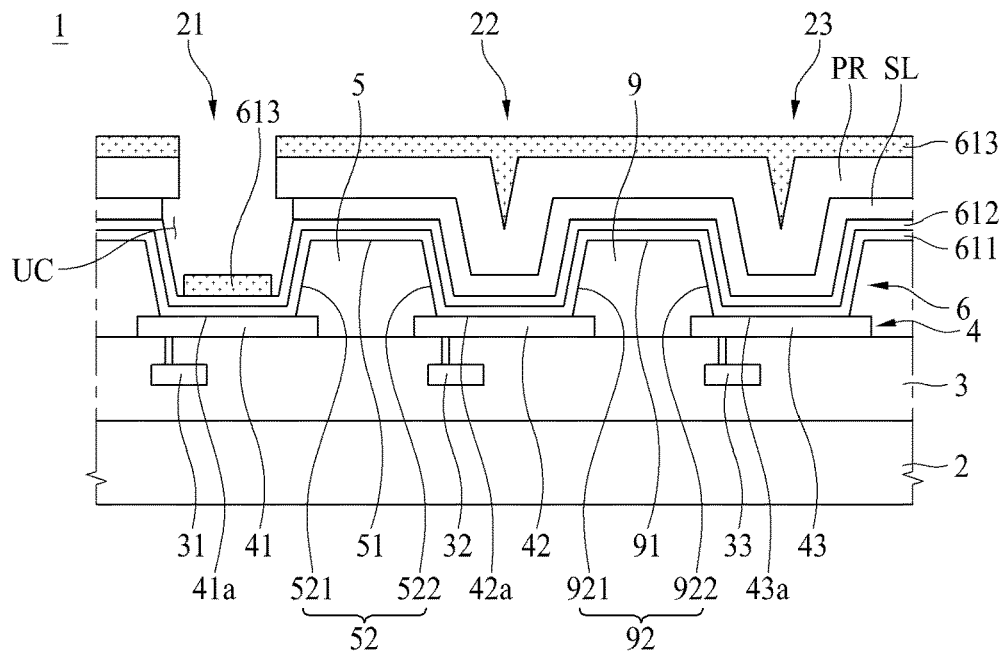
Figure 10F:
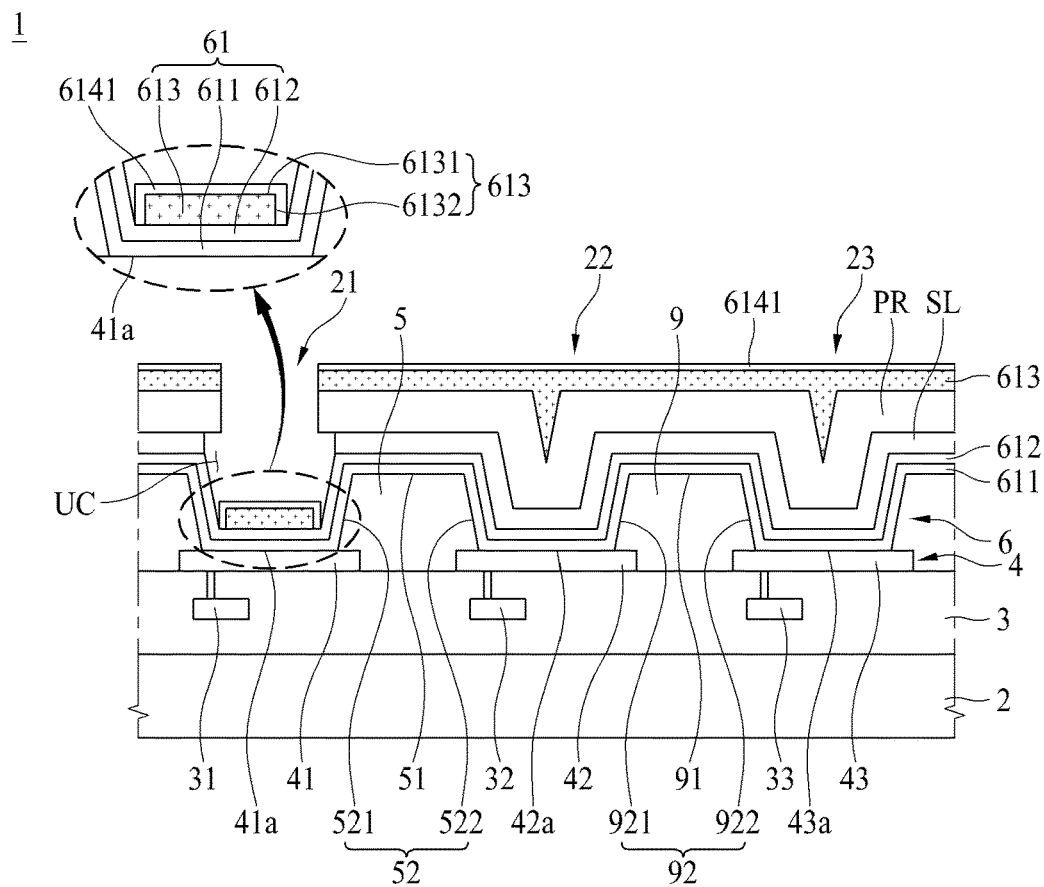
Figure 10G:
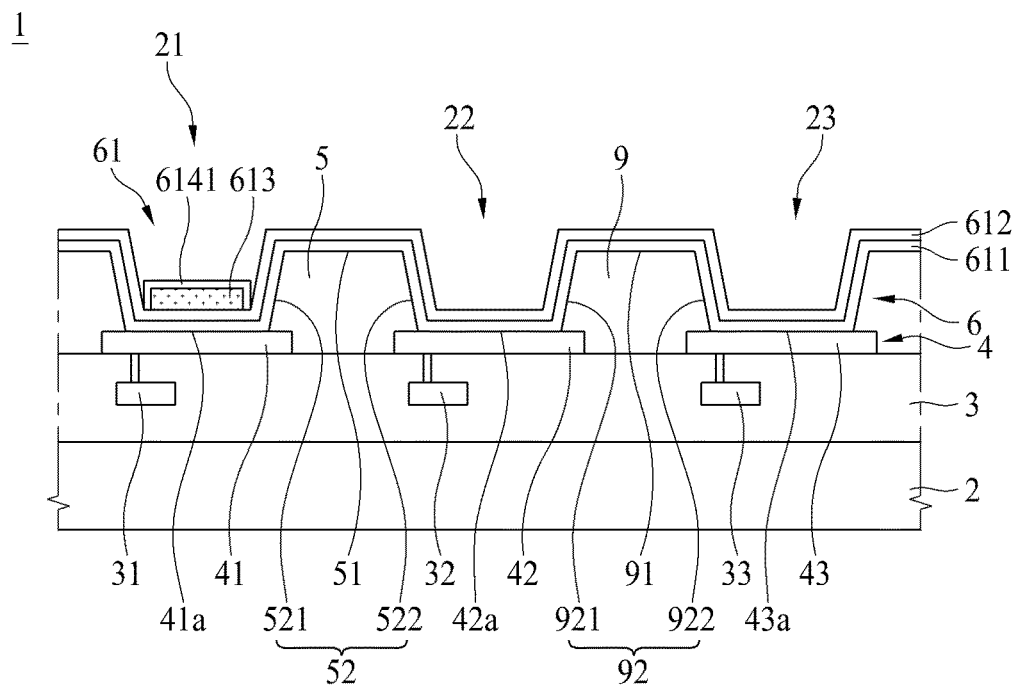
Figure 10H:
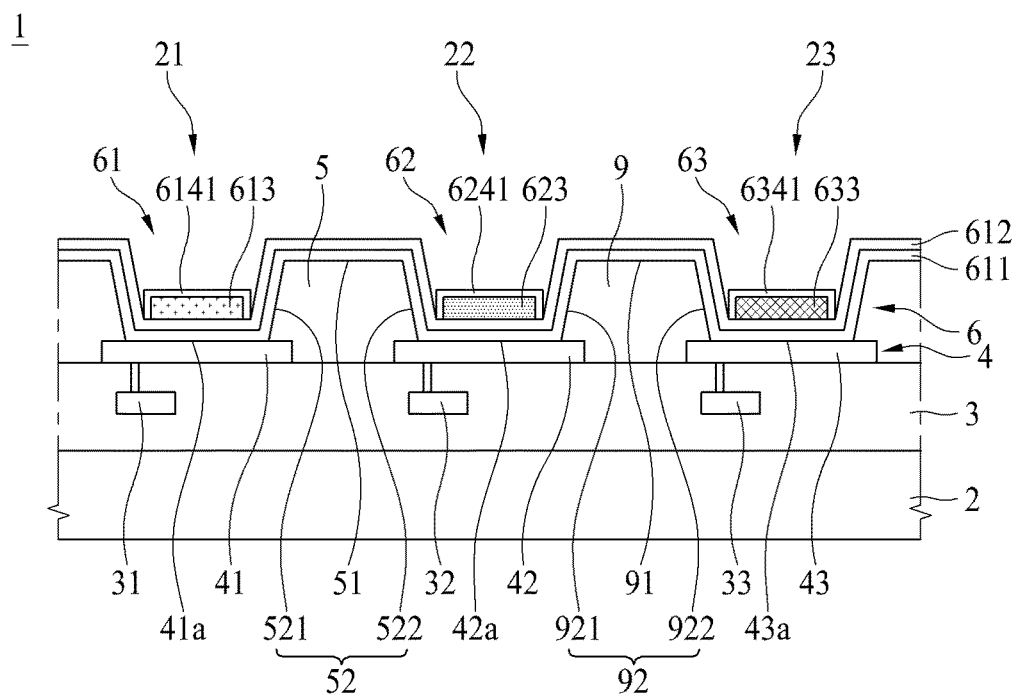
Figure 10I:
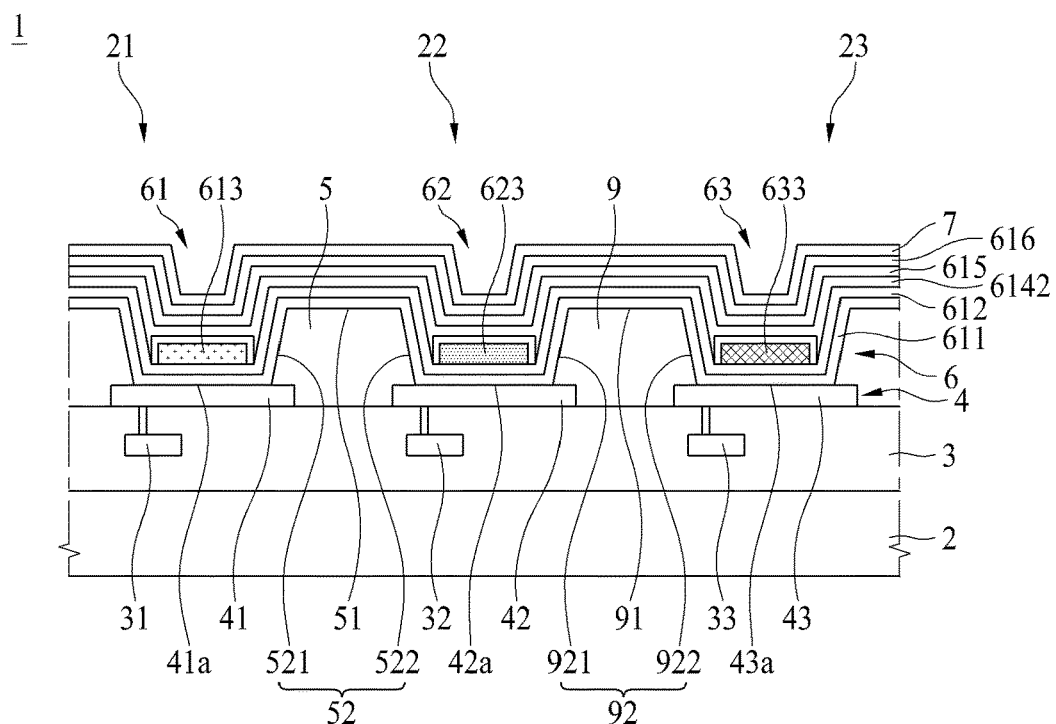
Figure 10J:
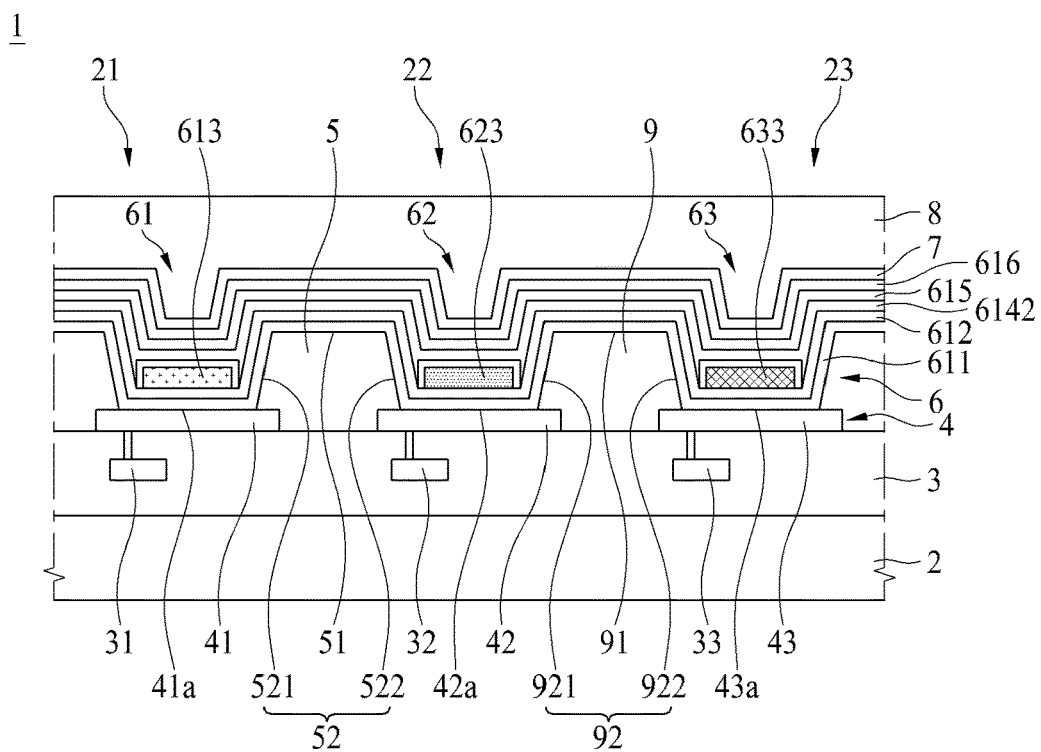

Referring to FIGS. 9 to 10J, the display device 1 according to the third aspect of the present disclosure is the same as the display device 1 according to FIG. 1 except that structures of the electron injecting layers 611, 621 and 631, the electron transporting layers 612, 622 and 632 and the first sub hole transporting layers 6141, 6241 and 6341 of the first to third organic light emitting layers 61, 62 and 63 are modified. Therefore, the same reference numerals are given to the same elements, and only different elements will be described hereinafter.

In the aforementioned display device according to FIG. 1, the electron injecting layers 611, 621 and 631 and the electron transporting layers 612, 622 and 632 of the first to third organic light emitting layers 61, 62 and 63 are arranged to be spaced apart from one another for each of the subpixels 21, 22 and 23. Also, the first sub hole transporting layers 6141, 6241 and 6341 of the first to third organic light emitting layers 61, 62 and 63 are provided to be matched with both ends of the light emitting layers 613, 623 and 633 and therefore arranged on only the light emitting layers 613, 623 and 633 but are not contact with the electron transporting layers 612, 622 and 632 arranged on the lower surface of the light emitting layers 613, 623 and 633.

On the contrary, in the display device according to the third aspect of FIG. 9, the electron injecting layers 611, 621 and 631 and the electron transporting layers 612, 622 and 632 of the first to third organic light emitting layers 61, 62 and 63 are arranged to be connected with one another. Therefore, in the display device 1 according to the third aspect of the present disclosure, the electron injecting layer 611, the electron transporting layer 612, the second sub hole transporting layer 6142, the second hole transporting layer 615 and the hole injecting layer 616 of the first organic light emitting layer 61 may be provided to be respectively connected with the electron injecting layer 621, the electron transporting layer 622, the second sub hole transporting layer, the second hole transporting layer and the hole injecting layer of the second organic light emitting layer 62, and the electron injecting layer 621, the electron transporting layer 622, the second sub hole transporting layer, the second hole transporting layer and the hole injecting layer of the second organic light emitting layer 62 may be provided to be respectively connected with the electron injecting layer 631, the electron transporting layer 632, the second sub hole transporting layer, the second hole transporting layer and the hole injecting layer of the third organic light emitting layer 63. In this case, since the second sub hole transporting layer 6142, the second hole transporting layer 615 and the hole injecting layer 616 of the first organic light emitting layer 61 are common layers formed over the first to third subpixels 21, 22 and 23 as described in the first aspect, and therefore may be the second sub hole transporting layer, the second hole transporting layer and the hole injecting layer of the second organic light emitting layer 62 and may be the second sub hole transporting layer, the second hole transporting layer and the hole injecting layer of the third organic light emitting layer 63, as shown in FIG. 9.

Consequently, in the display device 1 according to the third aspect of the present disclosure, as the electron injecting layers 611, 621 and 631 and the electron transporting layers 612, 622 and 632 of the first to third organic light emitting layers 61, 62 and 63 are formed to be connected with one another, the number of manufacturing processes may be reduced as compared with the case that the electron injecting layers and the electron transporting layers are respectively formed for each of the subpixels 21, 22 and 23, whereby a tact time of the complete display device may be reduced.

Meanwhile, as the electron injecting layers 611, 621 and 631, the electron transporting layers 612, 622 and 632, the second sub hole transporting layers 6142, 6242 and 6342, the second hole transporting layers and the hole injecting layers of the first to third organic light emitting layers 61, 62 and 63 are connected with one another, the light emitting layers 613, 623 and 633 and the first sub hole transporting layers 6141, 6241 and 6341, which correspond to the other elements of the first to third organic light emitting layers 61, 62 and 63, may be arranged to be spaced apart from one another. Therefore, in the display device 1 according to the third aspect of the present disclosure, the light emitting layers 613, 623 and 633 and the first sub hole transporting layers 6141, 6241 and 6341 of the first to third organic light emitting layers 61, 62 and 63 may be arranged to be spaced apart from one another for each of the first to third subpixels 21, 22 and 23, thereby emitting light of different colors for each of the first to third subpixels 21, 22 and 23.

Referring to FIG. 9 again, in the display device 1 according to the third aspect of the present disclosure, the first sub hole transporting layers 6141 of the first organic light emitting layer 61 may be provided to be in contact with the upper surface of the electron transporting layer 612 arranged on the lower surface of the first organic light emitting layer 61 while covering the upper surface and the side of the light emitting layer 613 of the first organic light emitting layer 61.

In the aforementioned display device of FIG. 1, the electron injecting layer 611, the electron transporting layer 612, the light emitting layer 613 and the first sub hole transporting layer 6141 are sequentially deposited and then patterned using a dry etching process. On the other hand, in the display device of FIG. 9, the electron injecting layer 611, the electron transporting layer 612, the shield layer SL and the PR layer are sequentially deposited and then the shield layer SL and the PR layer are removed. After the light emitting layer 613 and the first sub hole transporting layer 6141 are deposited on the removed groove, the other shield layer SL and PR layer are removed using a lift-off process. Therefore, such a structural difference may occur. That is, since the display device of FIG. 1 is a display device manufactured using a dry etching process and the display device of FIG. 9 is a display device manufactured using a lift-off process, the structural difference may occur in that the first sub hole transporting layer 6141 covers only the upper surface of the light emitting layer 613 or the first sub hole transporting layer 6141 covers both the upper surface and the side of the light emitting layer 613.

Hereinafter, the display device 1 according to the third aspect of the present disclosure shown in FIG. 9 will be described based on the above difference with reference to the manufacturing process of the display device 1 according to the third aspect of the present disclosure shown in FIGS. 10A to 10J.

First of all, referring to FIGS. 10A and 10B, in a state that the first electrode 4, the first bank 5 and the second bank 9 are formed on the substrate 2 and the circuit element layer 3, after the electron injecting layer 611, the electron transporting layer 612, the shield layer SL and the PR layer of the first organic light emitting layer 61 are sequentially deposited, a mask M (shown in FIG. 10b) is placed on a portion where a first deposition hole H1 (shown in FIG. 10c) is to be formed and then the other portion is subjected to exposure. Therefore, property of the other area except the area of the first deposition hole H1 is to be formed in the PR layer may be changed such that the corresponding area may not be etched even with a developing solution.

Since the electron injecting layer 611 and the electron transporting layer 612 of the first organic light emitting layer 61 are deposited on the entire surface as common layers as described above, the electron injecting layer 611 and the electron transporting layer 612 of the first organic light emitting layer 61 may be the electron injecting layer 621 and the electron transporting layer 622 of the second organic light emitting layer 62 and the electron injecting layer 631 and the electron transporting layer 632 of the third organic light emitting layer 63. That is, the electron injecting layer 611 and the electron transporting layer 612 of the first organic light emitting layer 61 may respectively be connected with the electron injecting layer 621 and the electron transporting layer 622 of the second organic light emitting layer 62 and the electron injecting layer 631 and the electron transporting layer 632 of the third organic light emitting layer 63.

The first deposition hole H1 is a hole for forming the light emitting layer 613 and the first sub hole transporting layer 6141 of the first organic light emitting layer 61, and may finally be the upper surface of the electron transporting layer 612. The PR layer may be a photoresist layer. The light emitting layer 613 may be a red light emitting layer for emitting red (R) light if an electric field is formed.

Then, referring to FIG. 10C, a primary removing process is performed to remove the PR layer, which is arranged on the area where the first deposition hole H1 is to be formed, by using a developing solution. The PR layer removed by the developing solution may be corroded by being put in the developing solution and then removed.

Then, referring to FIG. 10D, a secondary removing process is performed to remove the shield layer SL, which is arranged on the area where the first deposition hole H1 is to be formed, by using a developing solution. In this case, the time required to put the shield layer SL in the developing solution is increased in the secondary removing process as compared with the first removing process to increase a volume of the shield layer SL, which is to be removed, as compared with the primary removing process, whereby so called an under-cut (UC) area may be formed. Therefore, a width of the shield layer SL removed by the secondary removing process may be wider than a width of the PR layer removed by the primary removing process.

Then, referring to FIG. 10E, the light emitting layer 613 of the first organic light emitting layer 61 is formed on the electron transporting layer 612 arranged in the first deposition hole H1. For example, the light emitting layer 613 of the first organic light emitting layer 61 may be formed by supplying and depositing organic materials toward upper surfaces of the electron transporting layer 612 and the PR layer from the outside of the PR layer in various manners. In this case, the light emitting layer 613 may be deposited on the electron transporting layer 612 through the first deposition hole H1. Meanwhile, the light emitting layer 613 may be deposited even on the PR layer by such a process.

Then, referring to FIG. 10F, the first sub hole transporting layer 6141 is deposited to surround the light emitting layer 613 of the first organic light emitting layer 61. In more detail, the first sub hole transporting layer 6141 may be in contact with each of an upper surface 6131 and a side 6132 of the light emitting layer 613 through the first deposition hole H1. At this time, since the first sub hole transporting layer 6141 is deposited after the light emitting layer 613 is formed, the first sub hole transporting layer 6141 may be in contact with even the upper surface of the electron transporting layer 612 while covering the light emitting layer 613. Meanwhile, the first sub hole transporting layer 6141 may be deposited on the light emitting layer 613 by a sputter method to have a thickness of 100 Å or more. Therefore, the first sub hole transporting layer 6141 may protect the light emitting layer 613 to prevent the light emitting layer 613 from being damaged by an etching solution used for a process which will be performed later.

Then, referring to FIG. 10G, a third removing process is performed to remove the other except the light emitting layer 613 of the first organic light emitting layer 61 and the first sub hole transporting layer 6141 surrounding the light emitting layer 613 of the first organic light emitting layer 61. The third removing process may be performed by lifting-off the shield layer SL coated on the second sub electrode 42 and the third sub electrode 43 and the banks including the first bank 5 and the second bank 9 except the light emitting layer 613 and the first sub hole transporting layer 6141 of the first organic light emitting layer 61, which are formed on the electron transporting layer 612 in the first subpixel 21, through a strip process. Therefore, the light emitting layer 613 of which upper surface 6131 and side 6132 are protected by the first sub hole transporting layer 6141 may only remain on the electron transporting layer 612 in the first subpixel 21. Therefore, the first sub hole transporting layer 6141 may prevent the etching solution used for a follow-up process from being in contact with the light emitting layer 613 of the first organic light emitting layer 61, whereby the light emitting layer 613 of the first organic light emitting layer 61 may be prevented from being damaged by the etching solution.

Then, referring to FIG. 10h, in the display device 1 according to the third aspect of the present disclosure, the process of FIGS. 10b to 10g may be repeated, whereby the light emitting layer 623 of the second organic light emitting layer 62 of which upper surface and side are protected by the first sub hole transporting layer 6241 of the second organic light emitting layer 62 may be formed on the electron transporting layer of the second subpixel 22, and the light emitting layer 633 of the third organic light emitting layer 63 of which upper surface and side are protected by the first sub hole transporting layer 6341 of the third organic light emitting layer 63 may be formed on the electron transporting layer of the third subpixel 23.

Consequently, in the display device 1 according to the third aspect of the present disclosure, in a state that the first sub hole transporting layer 6141 of the first organic light emitting layer 61 protects the light emitting layer 613 of the first organic light emitting layer 61, since an etching process for patterning the light emitting layer 623 of the second organic light emitting layer 62 and the light emitting layer 633 of the third organic light emitting layer 63 is performed, the light emitting layer 613 of the first organic light emitting layer 61, which is formed earlier, may be prevented from being damaged by the etching solution used for the follow-up process.

Likewise, in the display device 1 according to the third aspect of the present disclosure, the first sub hole transporting layer 6241 of the second organic light emitting layer 62 may prevent the light emitting layer 623 of the second organic light emitting layer 62 from being damaged by the etching solution used for the etching process. The first sub hole transporting layer 6341 of the third organic light emitting layer 63 may prevent the light emitting layer 633 of the third organic light emitting layer 63 from being damaged by the etching solution used for the strip process used during the third removing process.

Meanwhile, although not shown, in the display device 1 according to the third aspect of the present disclosure, since the etching process is performed in a state that the first sub hole transporting layers 6141, 6241 and 6341 protect the light emitting layers 613, 623 and 633, even though a rinsing process for removing residual materials of the shield layer SL more certainly is additionally performed after the etching process, the light emitting layers 613, 623 and 633 may be prevented from being damaged by a rinsing solution used for the rinsing process. Therefore, in the display device 1 according to the third aspect of the present disclosure, since particles including the residual shield layer may be prevented from remaining in the organic light emitting layer 6, deterioration of light emission efficiency of the organic light emitting layer 6 due to the particles may be avoided.

Then, referring to FIGS. 10I and 10J, in the display device 1 according to the third aspect of the present disclosure, after the first sub hole transporting layer 6141 surrounding the light emitting layer 613 of the first organic light emitting layer 61, the first sub hole transporting layer 6241 surrounding the light emitting layer 623 of the second organic light emitting layer 62, and the first sub hole transporting layer 6341 surrounding the light emitting layer 633 of the third organic light emitting layer 63 are formed, the second sub hole transporting layer 6142, the second hole transporting layer 615, the hole injecting layer 616 of the first organic light emitting layer 61, the second electrode 7 and the encapsulation layer 8 are sequentially deposited on the entire surface, whereby the manufacturing process may partially be completed.

In this case, since the second sub hole transporting layer 6142, the second hole transporting layer 615 and the hole injecting layer 616 of the first organic light emitting layer 61 are common layers deposited on the entire surface over the first subpixel 21, the second subpixel 22 and the third subpixel 23, the second sub hole transporting layer 6142, the second hole transporting layer 615 and the hole injecting layer 616 of the first organic light emitting layer 61 may be the second sub hole transporting layer, the second hole transporting layer and the hole injecting layer of the second organic light emitting layer 62, and may be the second sub hole transporting layer, the second hole transporting layer and the hole injecting layer of the third organic light emitting layer 63.

Consequently, each of the first sub hole transporting layer 6141 of the first organic light emitting layer 61, the first sub hole transporting layer 6241 of the second organic light emitting layer 62, and the first sub hole transporting layer 6341 of the third organic light emitting layer 63 may be in contact with the upper surface and the side of each of the light emitting layers 613, 623 and 633 of the organic light emitting layers 61, 62 and 63 inside each of the first organic light emitting layer 61, the second organic light emitting layer 62 and the third organic light emitting layer 63, more specifically between the electron transporting layer 612 and the second sub hole transporting layer 6142, and may also be in contact with the upper surface of the electron transporting layer 612, thereby protecting the light emitting layers 613, 623 and 633 by sealing them.

Although not shown, in the display device 1 according to the third aspect of the present disclosure, the thicknesses of the first sub hole transporting layers 6141, 6241 and 6341 of the first to third organic light emitting layers 61, 62 and 63 are provided to be different from one another as described in the display device of FIG. 8, whereby the microcavity characteristic may be embodied for each of the first to third subpixels 21, 22 and 23.

Meanwhile, the display device 1 according to the third aspect of the present disclosure has been described based on that the electron injecting layers 611, 621 and 631 are arranged between the first electrode 4 and the electron transporting layers 612, 622 and 632. However, without limitation to this example, instead of the electron injecting layers 611, 621 and 631, N-doped electron transporting layers may be used.

Figure 11:
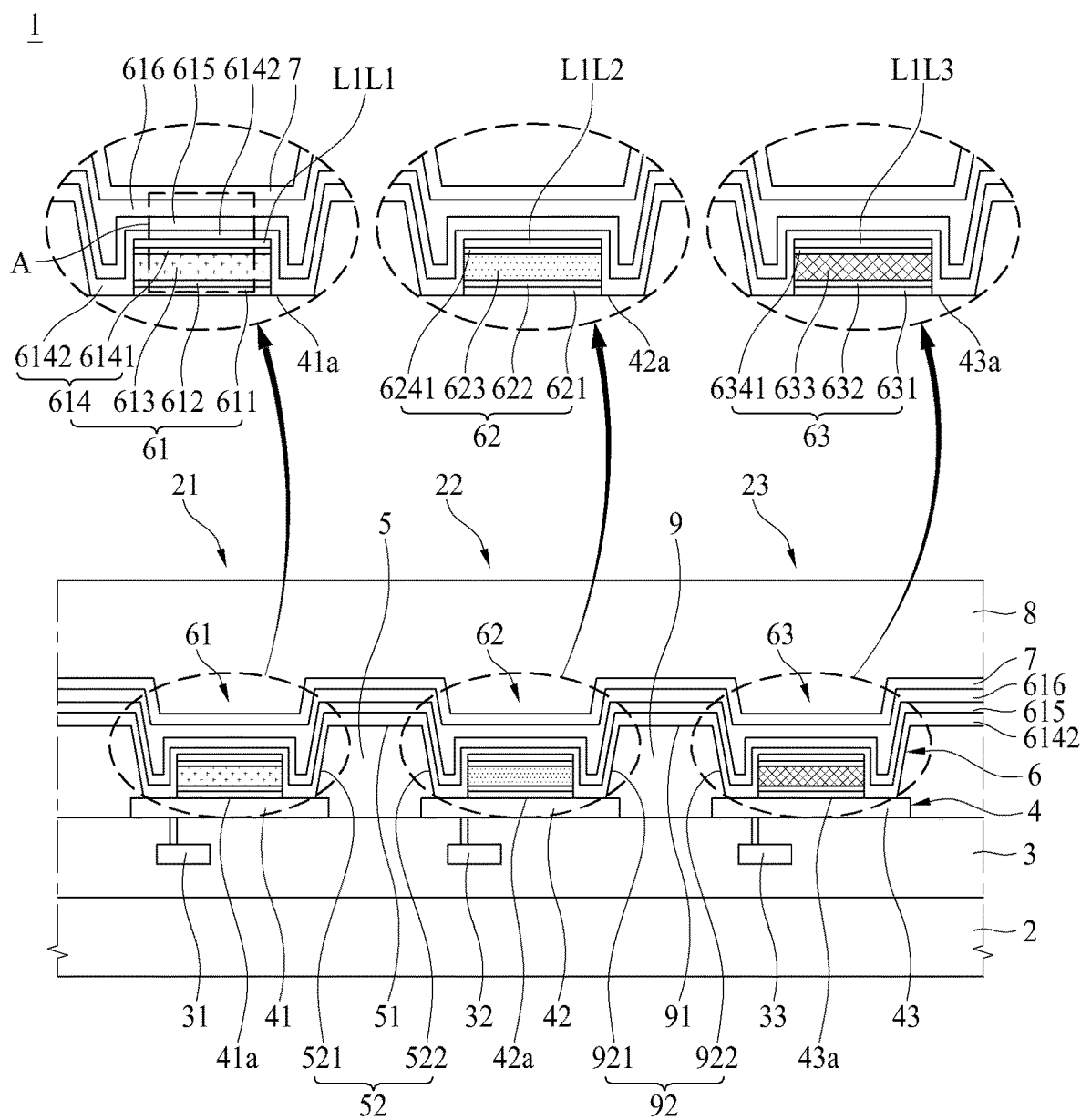
FIG. 11 is a cross-sectional view illustrating a display device according to a fourth aspect of the present disclosure.
Figure 12A:
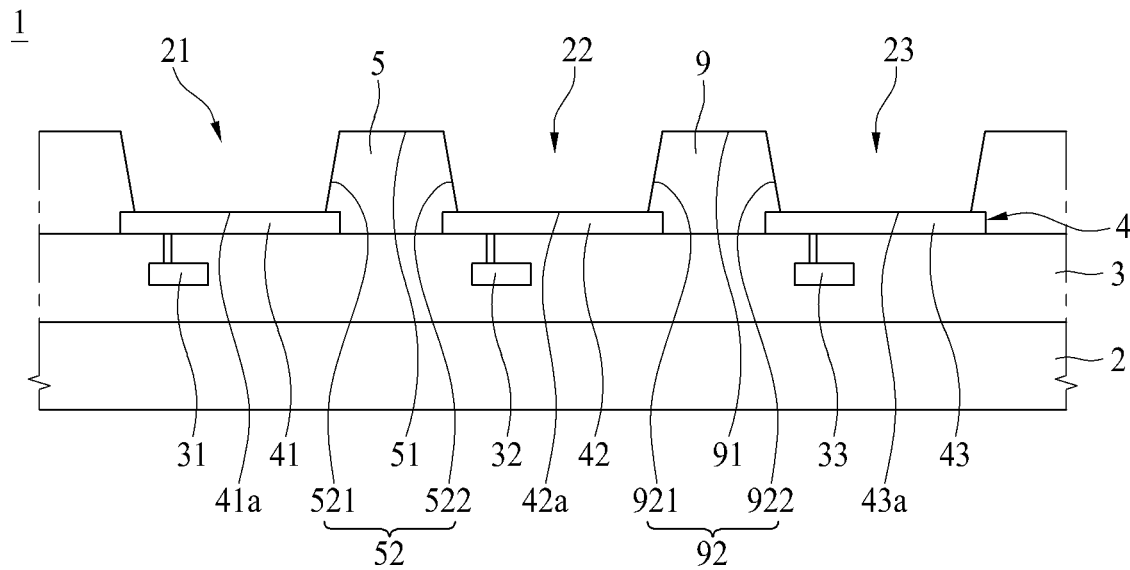
FIGS. 12A to 12P are cross-sectional views illustrating a manufacturing process of a display device according to the fourth aspect of the present disclosure.
Figure 12B:
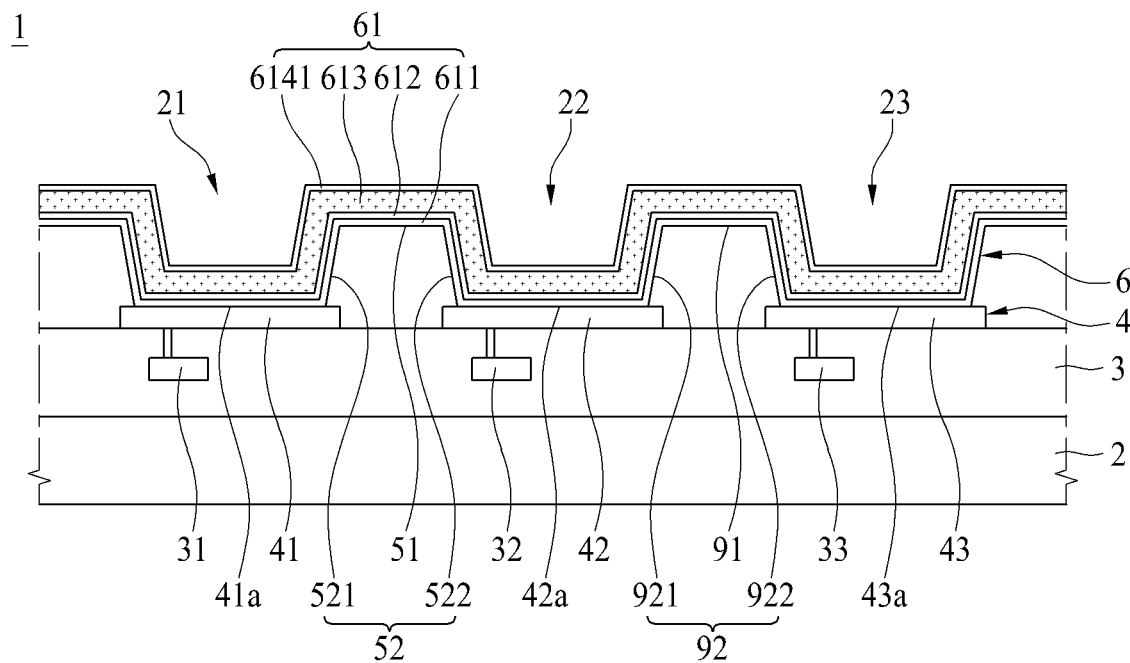
Figure 12C:
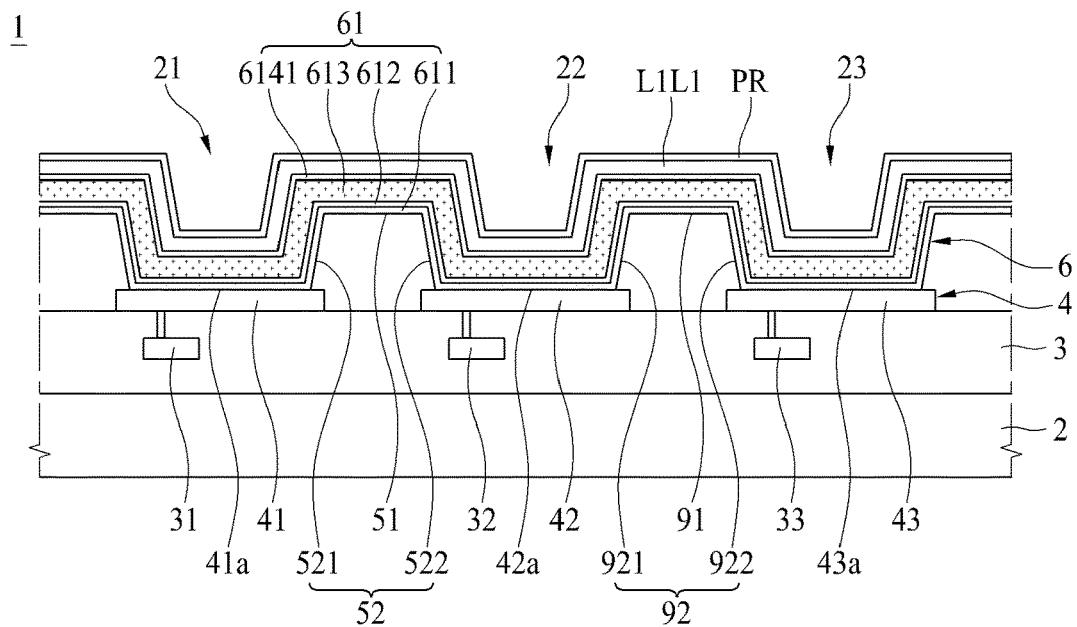
Figure 12D:
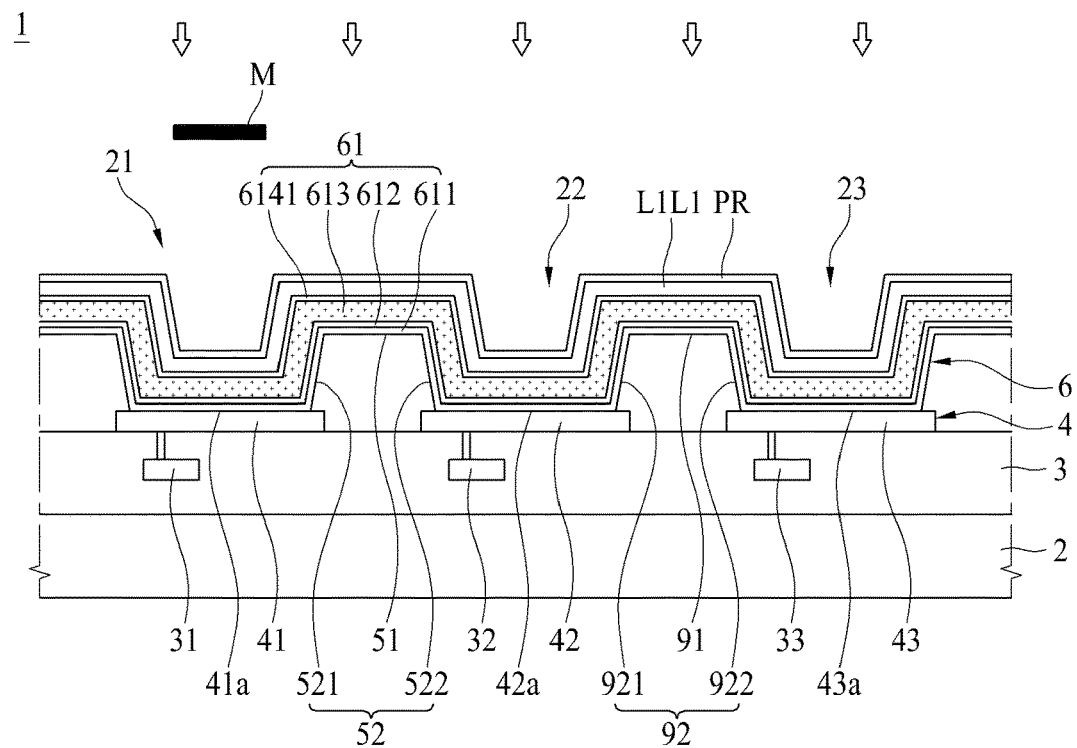
Figure 12E:
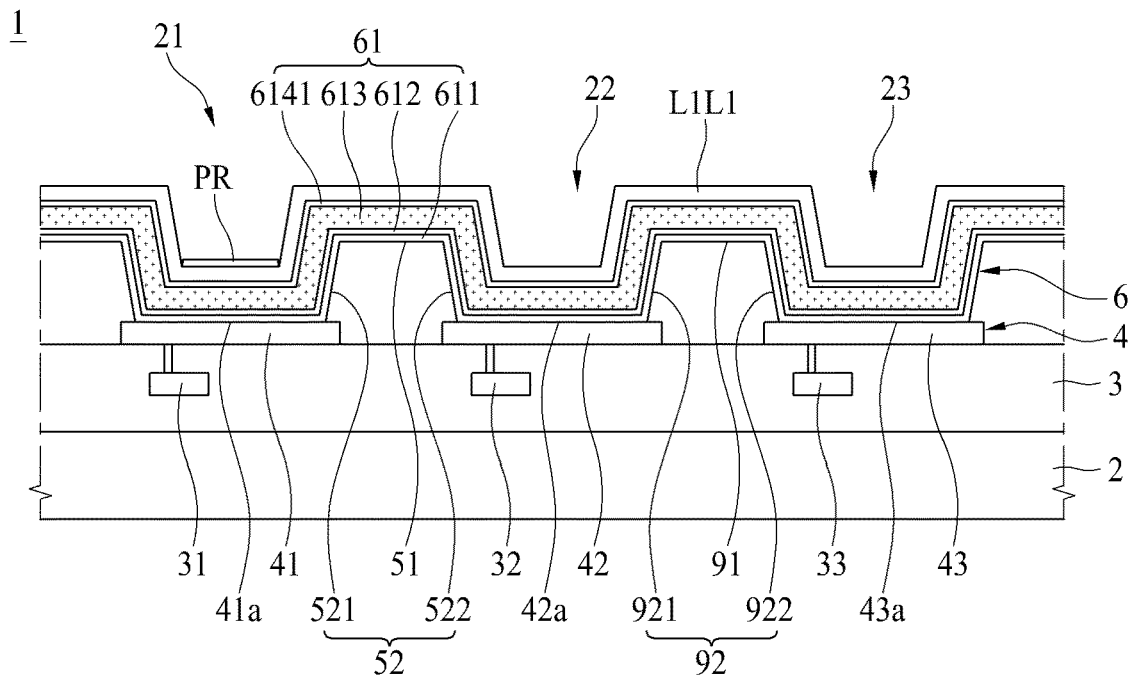
Figure 12F:
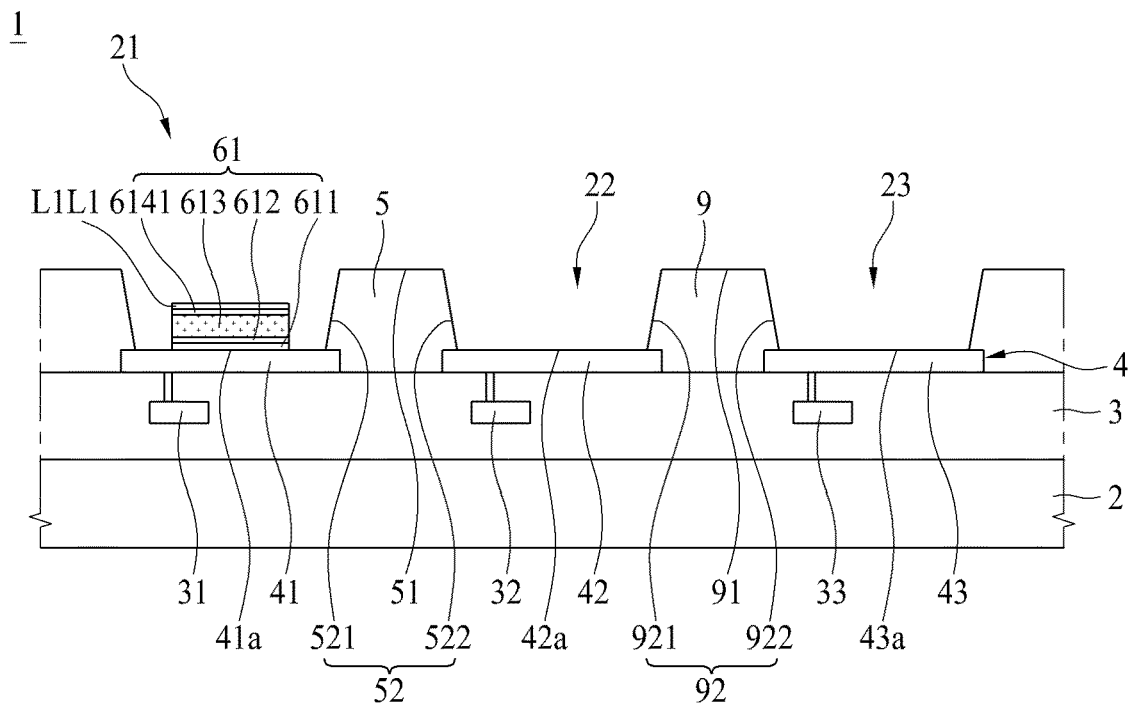
Figure 12G:
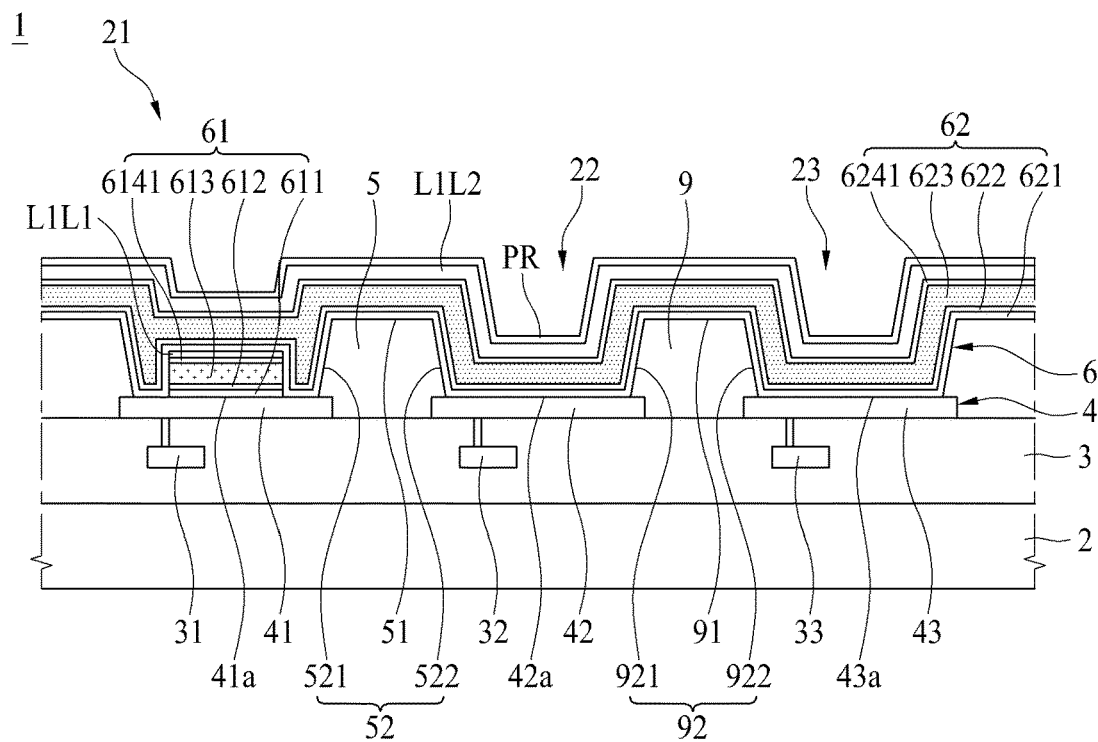
Figure 12H:
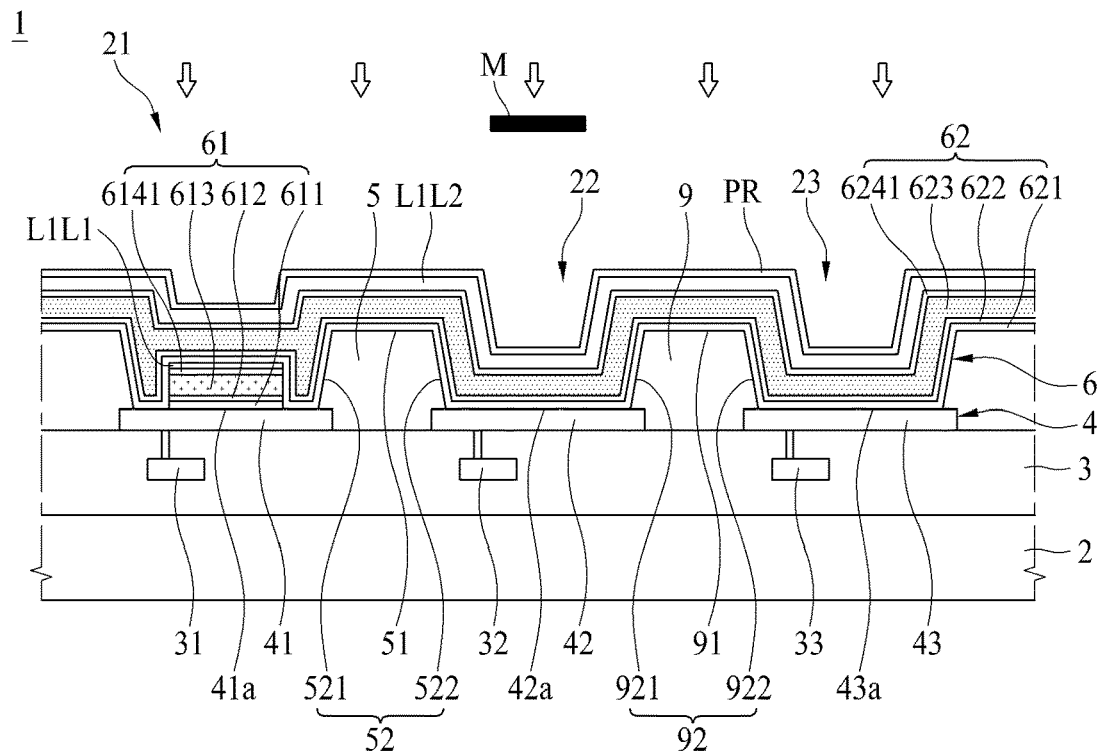
Figure 12I:
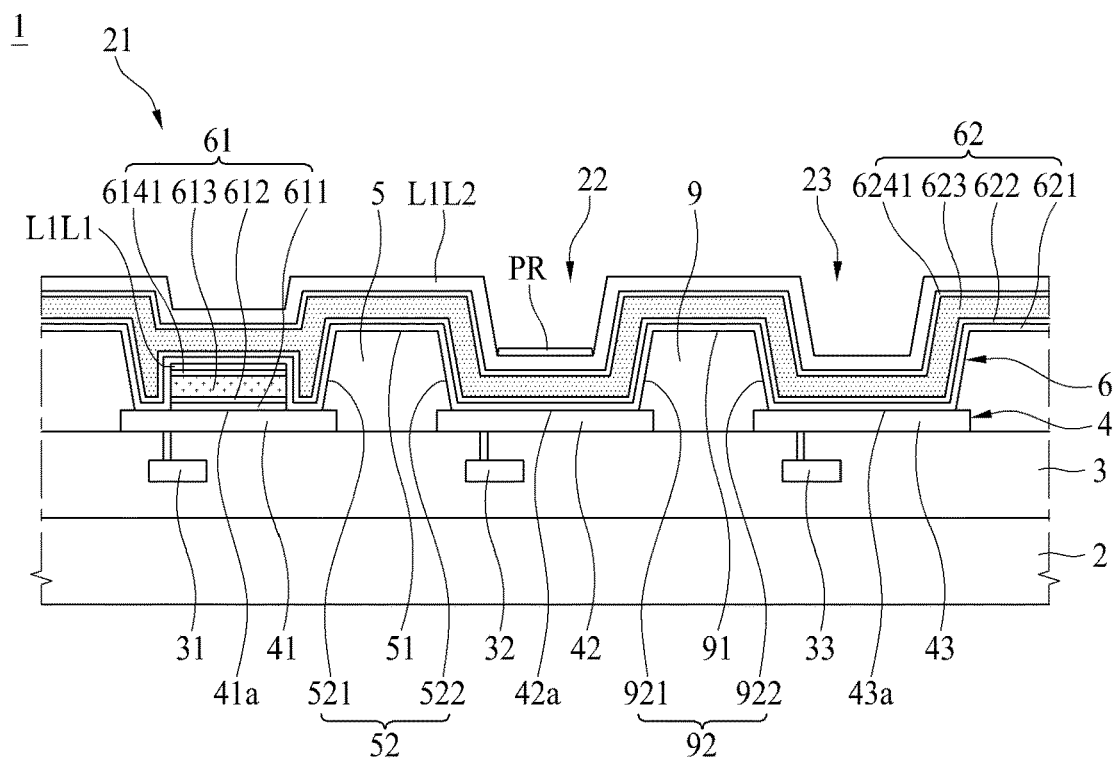
Figure 12J:
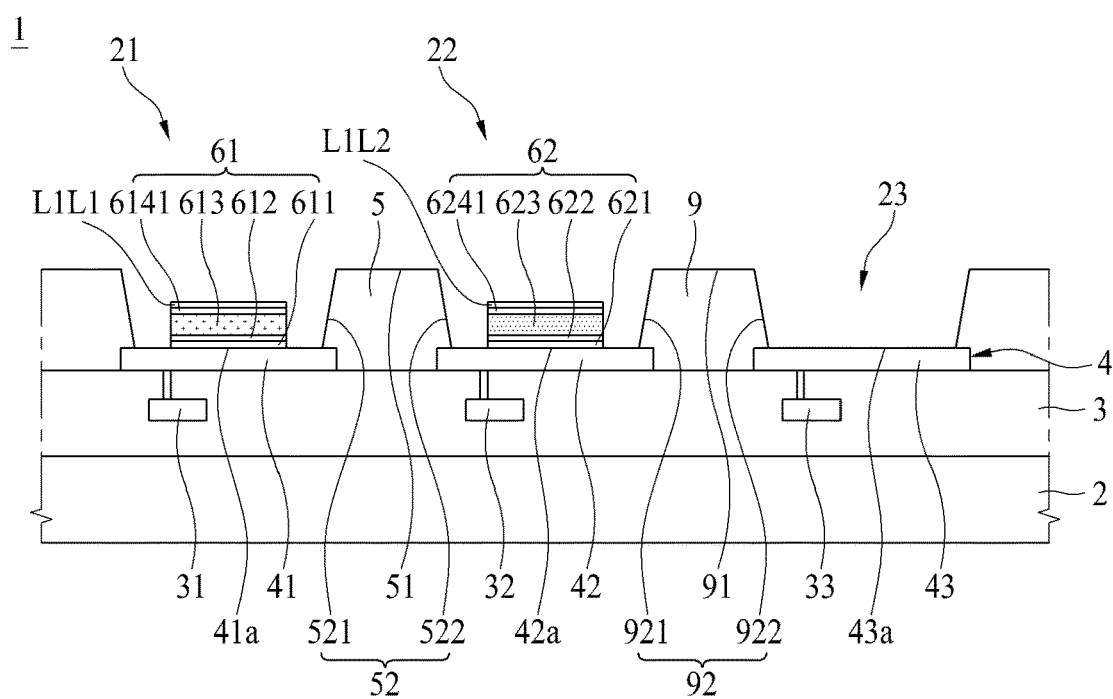
Figure 12K:
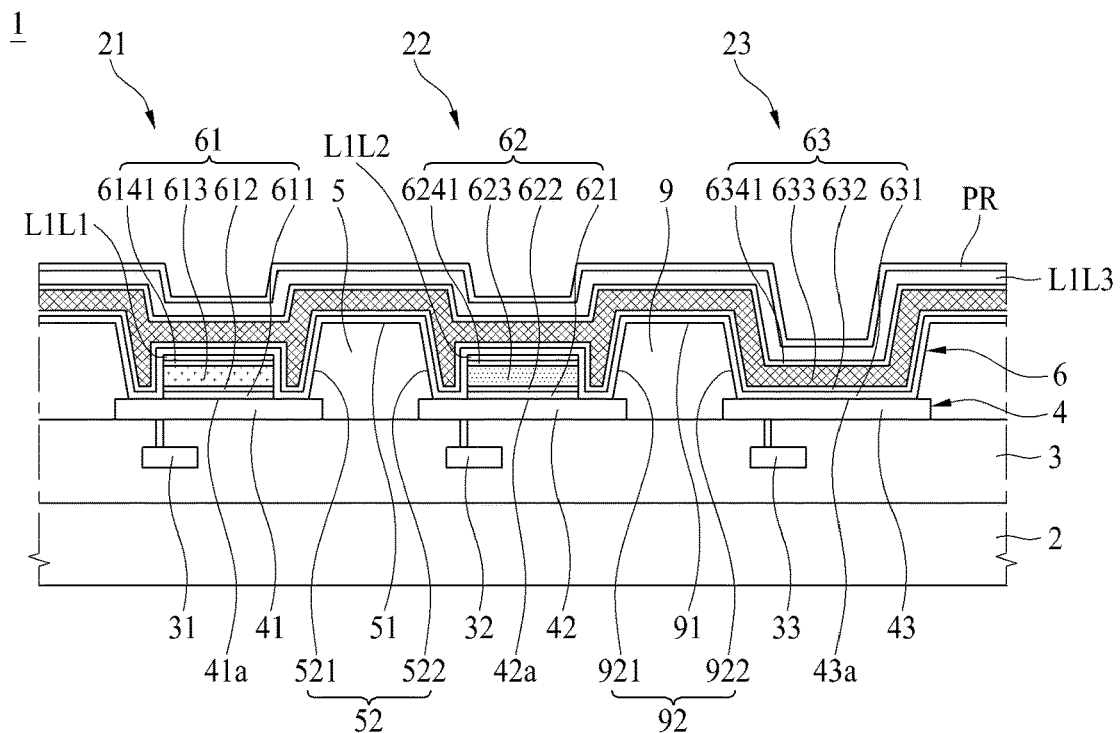
Figure 12L:
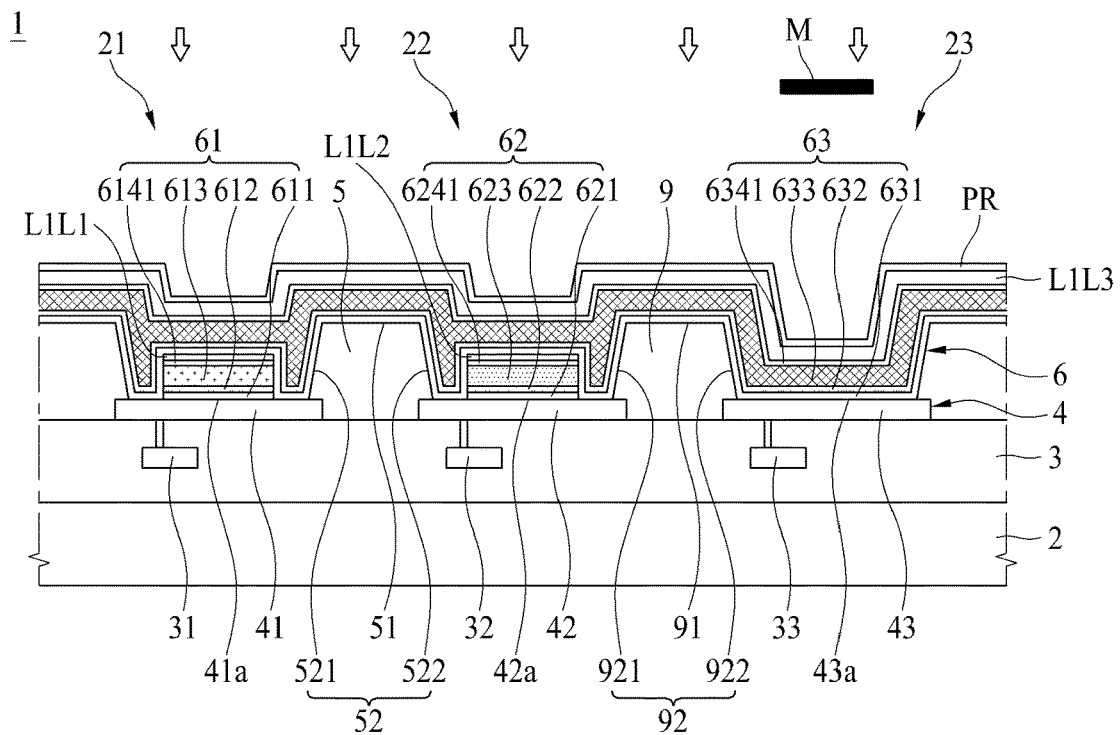
Figure 12M:
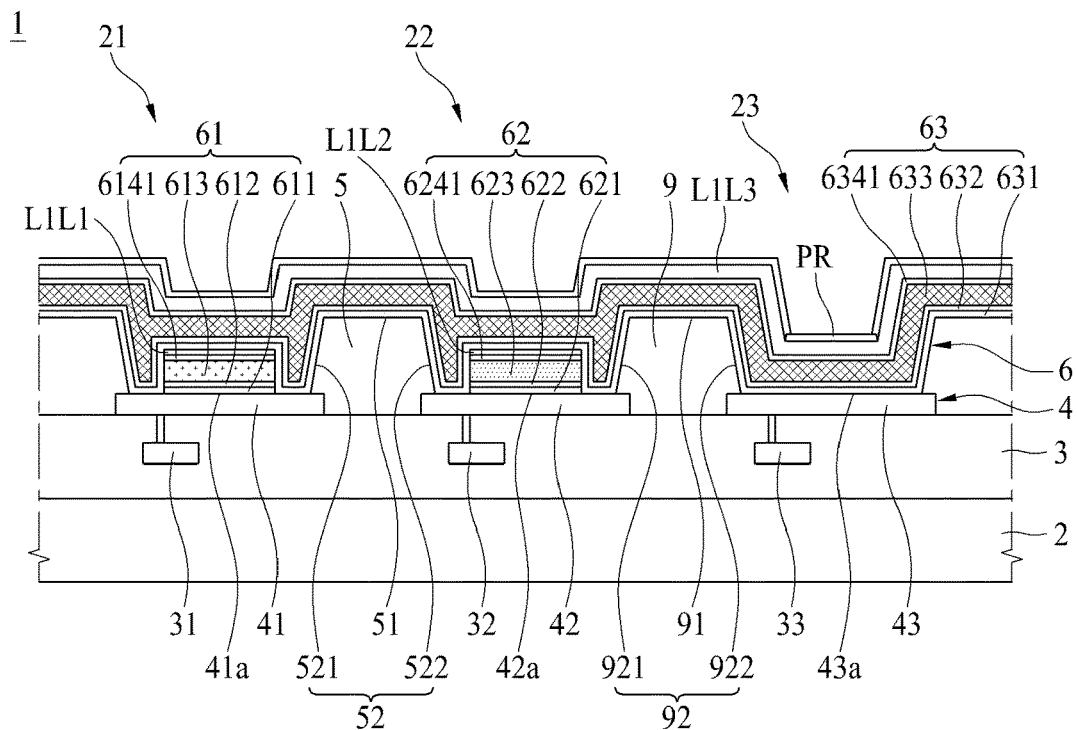
Figure 12N:
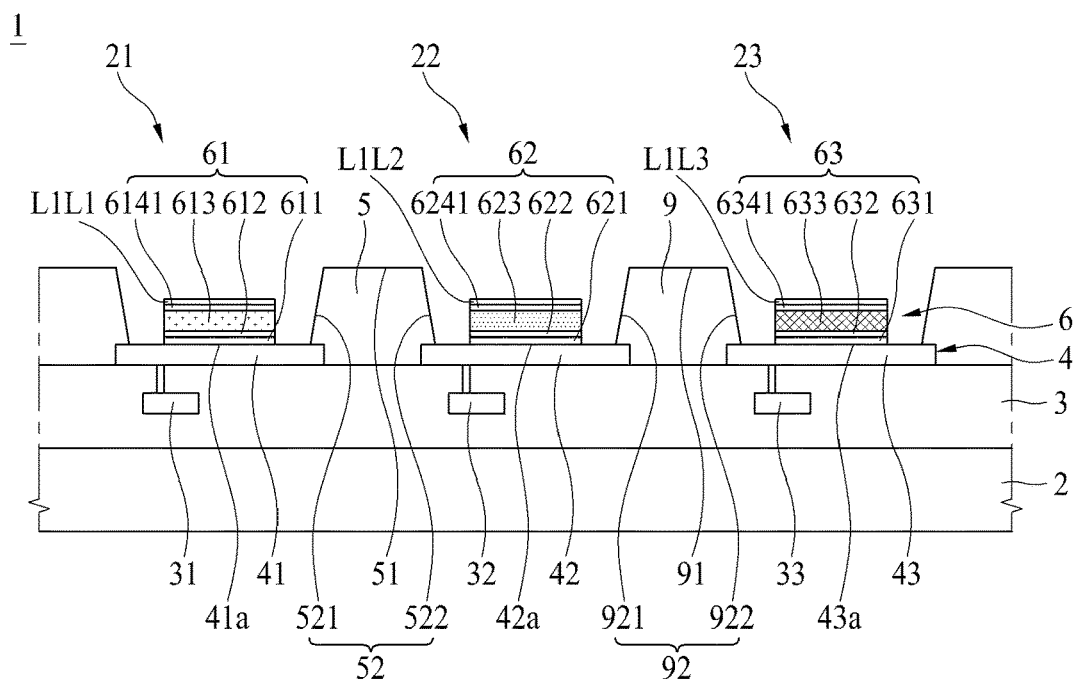
Figure 12O:
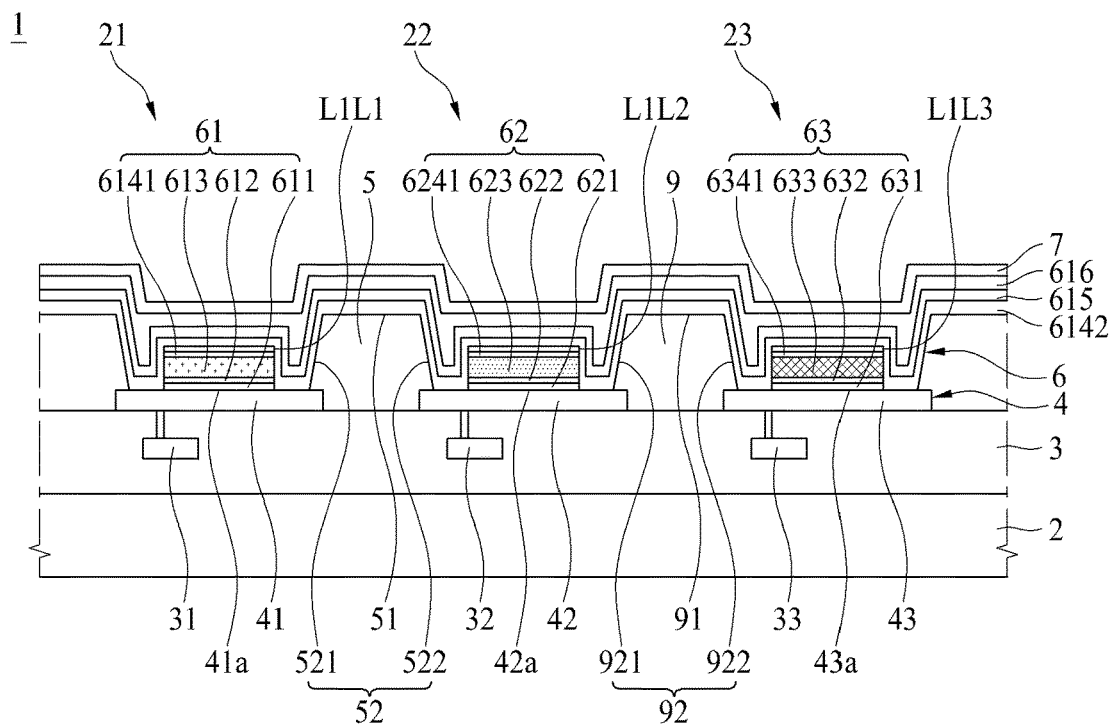
Figure 12P:
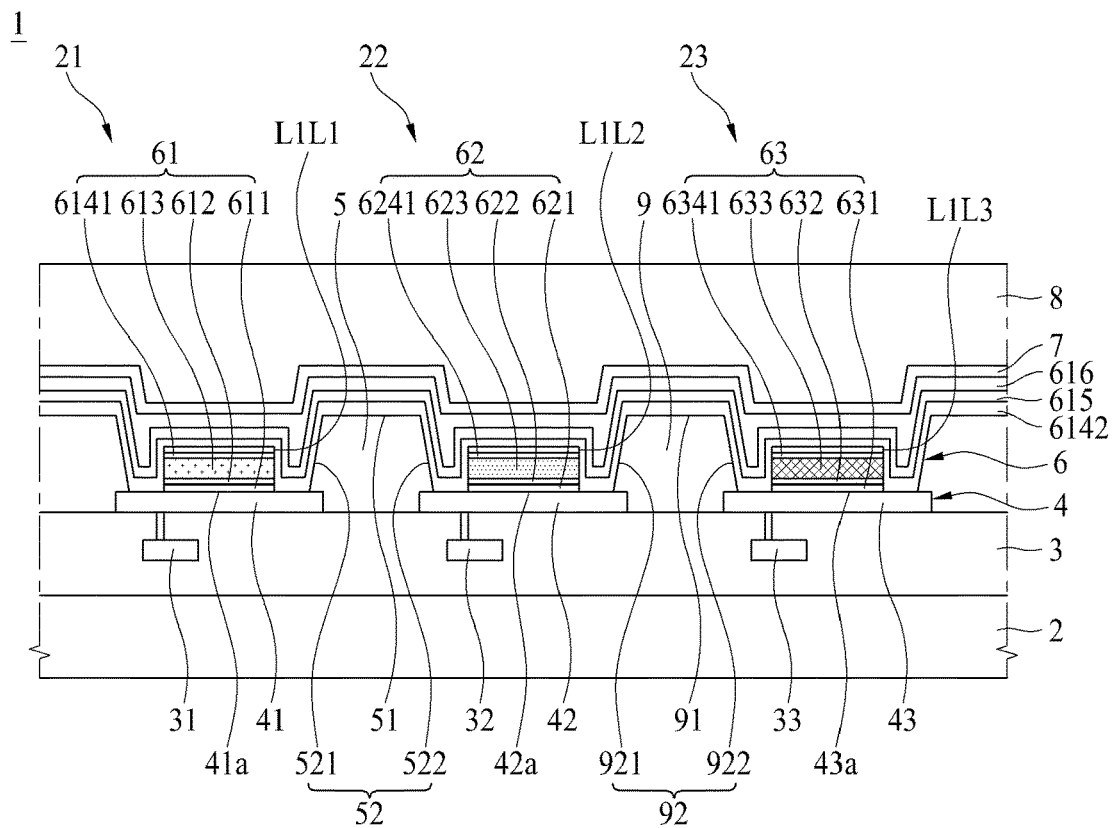

FIG. 11 is a cross-sectional view illustrating a display device according to the fourth aspect of the present disclosure, and FIGS. 12A to 12P are cross-sectional views illustrating a manufacturing process of a display device according to the fourth aspect of the present disclosure.

Referring to FIGS. 11 to 12P, the display device 1 according to the fourth aspect of the present disclosure is the same as the display device 1 according to FIG. 1 except that the display device 1 further includes a first lifetime improvement layer LIL1 arranged between the first sub hole transporting layer 6141 and the second sub hole transporting layer 6142 of the first organic light emitting layer 61, a second lifetime improvement layer LIL2 arranged between the first sub hole transporting layer 6241 and the second sub hole transporting layer of the second organic light emitting layer 62, and a third lifetime improvement layer LIL3 arranged between the first sub hole transporting layer 6341 and the second sub hole transporting layer of the third organic light emitting layer 63. Therefore, the same reference numerals are given to the same elements, and only different elements will be described hereinafter. In the display device 1 according to the fourth aspect of the present disclosure, the first lifetime improvement layer LIL1, the second lifetime improvement layer LIL2 and the third lifetime improvement layer LIL3 may be shield layers SL used for the manufacturing process of the display device according to the first aspect, and the shield layers SL may remain without being fully removed in the manufacturing process of the display device according to the first aspect and then may be arranged on the light emitting layer. As the shield layer SL used for the manufacturing process of the display device according to the first aspect may include materials such as F, O and N, which will be described later, the display device 1 according to the fourth aspect may be provided with high electron affinity and high hole injection.

In the aforementioned display device according to FIG. 1, the second hole transporting layer 615 made of a material different from that of the second sub hole transporting layer is arranged on the second sub hole transporting layer of each of the first to third organic light emitting layers 61, 62 and 63 to inject holes into the second sub hole transporting layer well, whereby lifetime of the light emitting diode may be prevented from being shortened.

On the contrary, in the display device according to the fourth aspect of FIG. 11, the first lifetime improvement layer LIL1, the second lifetime improvement layer LIL2 and the third lifetime improvement layer LIL3 are respectively arranged between the first sub hole transporting layer 6141, 6241 or 6341 and the second sub hole transporting layer of each of the first to third organic light emitting layers 61, 62 and 63, whereby hole injection from the second sub hole transporting layer to the first sub hole transporting layer may be enhanced. Electrons are withdrawn from at least one of the first electrode 4, which is a cathode electrode arranged below the light emitting layers 613, 623 and 633, the electron injecting layers 611, 621 and 631 and the electron transporting layers 612, 622 and 632, whereby generation efficiency of exciton from the light emitting layers 613, 623 and 633 may be increased, and lifetime of the organic light emitting layer 6 may be enhanced.

In more detail, each of the first to third lifetime improvement layers LIL1, LIL2 and LIL3 may be provided as a polymer that contains F, O and N. If the first to third lifetime improvement layers LIL1, LIL2 and LIL3 include atoms as described above, the layers have an electron withdrawing group (EWG), whereby electron affinity may be enhanced. The EWG is a functional group having high electronegativity, and has an electron withdrawing property through π-bond. For example, the EWG may be Halides (—F, —CL), Cyano Groups (—CN), Nitro Group (—NO2), etc.

Also, each of the first to third lifetime improvement layers LIL1, LIL2 and LIL3 may be provided as a polymer that contains F, O and N, whereby hole injection may be enhanced. Therefore, the first to third lifetime improvement layers LIL1, LIL2 and LIL3 may increase lifetime of the organic light emitting layer 6 by increasing exciton generation efficiency from the light emitting layers 613, 623 and 633 by injecting holes from the second electrode 7 arranged above the first to third lifetime improvement layers LIL1, LIL2 and LIL3, the hole injecting layer 616, the second hole transporting layer 615 and the second hole transporting layer 6142 to the light emitting layers 613, 623 and 633 into the light emitting layers 613, 623 and 633 well.

Meanwhile, each thickness of the first to third lifetime improvement layers LIL1, LIL2 and LIL3 may be provided to range from 1 nm to 10 nm. If each thickness of the first to third lifetime improvement layers LIL1, LIL2 and LIL3 is less than 1 nm, electron withdrawing property and hole injection are too low, whereby lifetime improvement effect of the organic light emitting layer 6 may not occur. On the other hand, if each thickness of the first to third lifetime improvement layers LIL1, LIL2 and LIL3 exceeds 10 nm, the first to third lifetime improvement layers LIL1, LIL2 and LIL3 may serve as barriers between the first sub hole transporting layers 6141, 6241 and 6341 and the second sub hole transporting layer, whereby a problem may occur in that hole injection for the light emitting layers 613, 623 and 633 may be deteriorated. Therefore, in the display device 1 according to the fourth aspect of the present disclosure, as each thickness of the first to third lifetime improvement layers LIL1, LIL2 and LIL3 is provided to range from 1 nm to 10 nm, a barrier function between the first sub hole transporting layers 6141, 6241 and 6341 and the second sub hole transporting layer may be minimized and electron withdrawing effect and hole injection toward the light emitting layers 613, 623 and 633 may be enhanced to increase exciton generation efficiency of the light emitting layers 613, 623 and 633, whereby lifetime of the organic light emitting layer 6 may be increased.

Referring to FIG. 11 again, in the display device 1 according to the fourth aspect of the present disclosure, the first lifetime improvement layer LIL1 may be arranged on only the first sub hole transporting layer 6141 of the first organic light emitting layer 61, the second lifetime improvement layer LIL2 may be arranged on only the first sub hole transporting layer 6241 of the second organic light emitting layer 62, and the third lifetime improvement layer LIL3 may be arranged on only the first sub hole transporting layer 6341 of the third organic light emitting layer 63. This is because that the first to third organic light emitting layers 61, 62 and 63 of the display device 1 according to the fourth aspect of the present disclosure are formed by a dry-etching process. The display device 1 according to the fourth aspect of the present disclosure will be described with reference to the manufacturing process of FIGS. 12a to 12p.

As the first lifetime improvement layer LIL1 is arranged on only the first sub hole transporting layer 6141 of the first organic light emitting layer 61, both ends of the first lifetime improvement layer LIL1 may be provided to be matched with both ends of each of the electron injecting layer 611, the electron transporting layer 612, the light emitting layer 613 and the first sub hole transporting layer 6141 of the first organic light emitting layer 61.

Likewise, as the second lifetime improvement layer LIL2 is arranged on only the second sub hole transporting layer 6241 of the second organic light emitting layer 62, both ends of the second lifetime improvement layer LIL2 may be provided to be matched with both ends of each of the electron injecting layer 621, the electron transporting layer 622, the light emitting layer 623 and the first sub hole transporting layer 6241 of the second organic light emitting layer 62. As the third lifetime improvement layer LIL3 is arranged on only the first sub hole transporting layer 6341 of the third organic light emitting layer 63, both ends of the third lifetime improvement layer LIL3 may be provided to be matched with both ends of each of the electron injecting layer 631, the electron transporting layer 632, the light emitting layer 633 and the first sub hole transporting layer 6341 of the third organic light emitting layer 63.

FIGS. 12A to 12P are cross-sectional views illustrating a manufacturing process of a display device according to the fourth aspect of the present disclosure.

In the display device 1 according to the fourth aspect of the present disclosure, as the first lifetime improvement layer LIL1, the second lifetime improvement layer LIL2 and the third lifetime improvement layer LIL3 are respectively arranged between the first sub hole transporting layer 6141, 6241 or 6341 and the second sub hole transporting layer of each of the first to third organic light emitting layers 61, 62 and 63, electron withdrawing and hole injection toward the light emitting layers 613, 623 and 633 may be enhanced, whereby exciton generation efficiency of the light emitting layers 613, 623 and 633 may be increased to increase lifetime of the organic light emitting layer 6.

The shield layer SL is used for a patterning process for forming the first to third organic light emitting layers 61, 62 and 63 in the aforementioned manufacturing process of FIGS. 2a to 2p, whereas the lifetime improvement layers are used for the manufacturing process of FIGS. 12a to 12p and may be arranged between the first sub hole transporting layer and the second sub hole transporting layer. In this case, the lifetime improvement layers may mean the first to third lifetime improvement layers LIL1, LIL2 and LIL3. Therefore, FIGS. 12A to 12P are almost the same as the manufacturing process of FIGS. 2a to 2p except the above difference. Therefore, a different manufacturing process will be described hereinafter.

Since FIGS. 12A to 12E are the same as FIGS. 2A to 2P except that the first lifetime improvement layer LIL1 is used instead of the shield layer SL of FIGS. 2A to 2P, their detailed description will be omitted.

Next, referring to FIG. 12F, a primary removing process for removing the PR layer of the other area except the area of the first organic light emitting layer 61 and a secondary removing process for removing the first lifetime improvement layer LIL1, the electron injecting layer 611, the electron transporting layer 612, the light emitting layer 613 and the first sub hole transporting layer 6141 of the other area except the area of the first organic light emitting 61 are performed. The primary removing process and the secondary removing process may be performed using at least one of an etching gas, a developing solution, and a stripper solution. The PR layer may be removed by being eroded after being dipped in the developing solution.

The secondary removing process may remove the first organic light emitting layer 61 and the first lifetime improvement layer LIL1 of the other area including the PR layer on the first organic light emitting layer 61 by using the etching gas or the stripper solution. The secondary removing process may remove organisms including the first lifetime improvement layer LIL1 more than that of the primary removing process by more increasing the time exposed to the etching as or the stripper solution than the primary removing process. At this time, the secondary removing process may be performed until the first lifetime improvement layer LIL1 partially remains on the first sub hole transporting layer 6141 at a thickness of 1 nm to 10 nm.

Through this process, the electron injecting layer 611, the electron transporting layer 612, the light emitting layer 613 and the first sub hole transporting layer 6141 of the first organic light emitting layer 61 and the first lifetime improvement layer LIL1 remain only on the upper surface 41a of the first sub electrode 41, and the electron injecting layer 611, the electron transporting layer 612, the light emitting layer 613, and the first sub hole transporting layer 6141 of the first organic light emitting layer 61 and the first lifetime improvement layer LIL1 and the PR layer may be removed from the other area. The other area is the area except a portion where the electron injecting layer 611, the electron transporting layer 612, the light emitting layer 613, and the first sub hole transporting layer 6141 of the first organic light emitting layer 61 and the first lifetime improvement layer LIL1 are patterned from the upper surface 41a of the first sub electrode 41, and may be the area in which the first bank 5, the second subpixel 22, the second bank 9, and the third subpixel 23 are included.

Meanwhile, the first lifetime improvement layer LIL1 is dry-etched together with the electron injecting layer 611, the electron transporting layer 612, the light emitting layer 613, and the first sub hole transporting layer 6141 of the first organic light emitting layer 61 in a state that it is arranged on the first sub hole transporting layer 6141. Therefore, as shown in FIG. 12f, both ends of the first lifetime improvement layer LIL1 may be provided to be matched with both ends of each of the electron injecting layer 611, the electron transporting layer 612, the light emitting layer 613, and the first sub hole transporting layer 6141 of the first organic light emitting layer 61.

In the manufacturing process of the display device 1 according to the fourth aspect of the present disclosure, after the first sub hole transporting layer 6141 and the first lifetime improvement layer LIL1 are arranged on the upper surface of the light emitting layer 613, since the exposure process and the removing process, that is, the patterning process are performed, the first sub hole transporting layer 6141 and the first lifetime improvement layer LIL1 may prevent the light emitting layer 613 from being damaged from the UV light, the etching gas and the stripper solution.

Then, referring to FIGS. 12G to 12J, the process steps of FIGS. 12B to 12F may be repeated, whereby a portion of the second organic light emitting layer 62 and the second lifetime improvement layer LIL2 may be formed in the second subpixel 22. Since the manufacturing process of FIGS. 12G to 12J is the same as that of FIGS. 2G to 2J except the second lifetime improvement layer LIL2 is used instead of the shield layer SL, its detailed description will be omitted. However, as described in FIG. 12E, the removing process is performed until the second lifetime improvement layer LIL2 partially remains on the upper surface of the first sub hole transporting layer 6241 at a thickness of 1 nm to 10 nm in FIG. 12j.

Therefore, as shown in FIG. 12J, the electron injecting layer 621, the electron transporting layer 622, the light emitting layer 623, and the first sub hole transporting layer 6241 of the second organic light emitting layer 62, and the second lifetime improvement layer LIL2 may remain only on the upper surface 42a of the second sub electrode 42. Both ends of the second lifetime improvement layer LIL2 may be provided to be matched with both ends of each of the electron injecting layer 621, the electron transporting layer 622, the light emitting layer 623, and the first sub hole transporting layer 6241 of the second organic light emitting layer 62.

In the manufacturing process of the display device 1 according to the fourth aspect of the present disclosure, after the first sub hole transporting layer 6241 and the second lifetime improvement layer LIL2 are arranged on the upper surface of the light emitting layer 623, since the exposure process and the removing process are performed, the first sub hole transporting layer 6241 and the second lifetime improvement layer LIL2 may prevent the light emitting layer 623 from being damaged from the UV light, the etching gas and the stripper solution.

Then, referring to FIGS. 12K to 12N, the process steps of FIGS. 12B to 12F may be repeated, whereby a portion of the third organic light emitting layer 63 and the third lifetime improvement layer LIL3 may be formed in the third subpixel 23. Since the manufacturing process of FIGS. 12K to 12N is the same as that of FIGS. 2K to 2N except the third lifetime improvement layer LIL3 is used instead of the shield layer SL, its detailed description will be omitted. However, as described in FIG. 12E, the removing process is performed until the third lifetime improvement layer LIL3 partially remains on the upper surface of the first sub hole transporting layer 6341 at a thickness of 1 nm to 10 nm in FIG. 12E.

Therefore, as shown in FIG. 12N, the electron injecting layer 631, the electron transporting layer 632, the light emitting layer 633, and the first sub hole transporting layer 6341 of the third organic light emitting layer 63, and the third lifetime improvement layer LIL3 may remain only on the upper surface 43a of the third sub electrode 43. Both ends of the third lifetime improvement layer LIL3 may be provided to be matched with both ends of each of the electron injecting layer 631, the electron transporting layer 632, the light emitting layer 633, and the first sub hole transporting layer 6341 of the third organic light emitting layer 63.

In the manufacturing process of the display device 1 according to the fourth aspect of the present disclosure, after the first sub hole transporting layer 6341 and the third lifetime improvement layer LIL3 are arranged on the upper surface of the light emitting layer 633, since the exposure process and the removing process are performed, the first sub hole transporting layer 6341 and the third lifetime improvement layer LIL3 may prevent the light emitting layer 633 from being damaged from the UV light, the etching gas and the stripper solution.

Then, referring to FIGS. 12o to 12p, the second sub hole transporting layer 6142, the second hole transporting layer 615 and the hole injecting layer 616 of the first organic light emitting layer 61, the second electrode 7 and the encapsulation layer 8 are entirely deposited in due order to cover the electron injecting layer 611, the electron transporting layer 612, the light emitting layer 613 and the first sub hole transporting layer 6141 of the first organic light emitting layer 61 and the first lifetime improvement layer LIL1, the electron injecting layer 621, the electron transporting layer 622, the light emitting layer 623 and the first sub hole transporting layer 6241 of the second organic light emitting layer 62 and the second lifetime improvement layer LIL2, and the electron injecting layer 631, the electron transporting layer 632, the light emitting layer 633 and the first sub hole transporting layer 6341 of the third organic light emitting layer 63 and the third lifetime improvement layer LIL3, which are respectively patterned for the first to third subpixels 21, 22 and 23, whereby the manufacturing process may partially be completed.

In this case, the second sub hole transporting layer 6142, the second hole transporting layer 615 and the hole injecting layer 616 of the first organic light emitting layer 61 are common layers entirely deposited through the first subpixel 21, the second subpixel 22 and the third subpixel 23, and therefore may be the second sub hole transporting layer, the second hole transporting layer and the hole injecting layer of the second organic light emitting layer 62.

Therefore, the second sub hole transporting layer 6142 entirely deposited through the first to third subpixels 21, 22 and 23 may cover an upper surface and a side of each of the first to third lifetime improvement layers LIL1, LIL2 and LIL3, a side of each of the first sub hole transporting layers 6141, 6241 and 6341, a side of the light emitting layers 613, 623 and 633, a side of the electron transporting layers 612, 622 and 632 and a side of the electron injecting layers 611, 621 and 631.

In the display device 1 according to the fourth aspect of the present disclosure, as the second sub hole transporting layer 6142, the second hole transporting layer 615 and the hole injecting layer 616 of the organic light emitting layer 6 are arranged as common layers for covering all of the first to third subpixels 21, 22 and 23, the number of the manufacturing process steps may be more reduced than the case that the second sub hole transporting layer, the second hole transporting layer and the hole injecting layer are formed for each of the subpixels, whereby a tact time of the complete display device may be reduced.

Meanwhile, as shown in FIG. 12P, the electron injecting layer 611, the electron transporting layer 612, the light emitting layer 613 and the first sub hole transporting layer 6141 of the first organic light emitting layer 61 and the first lifetime improvement layer LIL1 may be arranged to be spaced apart from each of the electron injecting layer 621, the electron transporting layer 622, the light emitting layer 623 and the first sub hole transporting layer 6241 of the second organic light emitting layer 62 and the second lifetime improvement layer LIL2. Therefore, even though an electric field is formed between the first sub electrode 41 and the second electrode 7, a leakage current does not occur toward the second subpixel 22, whereby the second subpixel 22 may not emit light. Likewise, even though an electric field is formed between the second sub electrode 42 and the second electrode 7, a leakage current does not occur toward the first subpixel 21, whereby the first subpixel 21 may not emit light.

Also, the electron injecting layer 631, the electron transporting layer 632, the light emitting layer 633 and the first sub hole transporting layer 6341 of the third organic light emitting layer 63 and the third lifetime improvement layer LIL3 may be arranged to be spaced apart from each of the electron injecting layer 621, the electron transporting layer 622, the light emitting layer 623 and the first sub hole transporting layer 6241 of the second organic light emitting layer 62 and the second lifetime improvement layer LIL2. Therefore, even though an electric field is formed between the third sub electrode 43 and the second electrode 7, a leakage current does not occur toward the second subpixel 22, whereby the second subpixel 22 may not emit light.

Consequently, in the display device 1 according to the fourth aspect of the present disclosure, the electron injecting layers 611, 621 and 631, the electron transporting layers 612, 622 and 632, the light emitting layers 613, 623 and 633 and the first sub hole transporting layers 6141, 6241 and 6341 of the first to third organic light emitting layers 61, 62 and 63 and the first to third lifetime improvement layers LIL1, LIL2 and LIL3 are provided to be spaced apart from one another, whereby a color mixture may be prevented from occurring between the adjacent subpixels that emit their respective colored lights different from each other.

Figure 13:
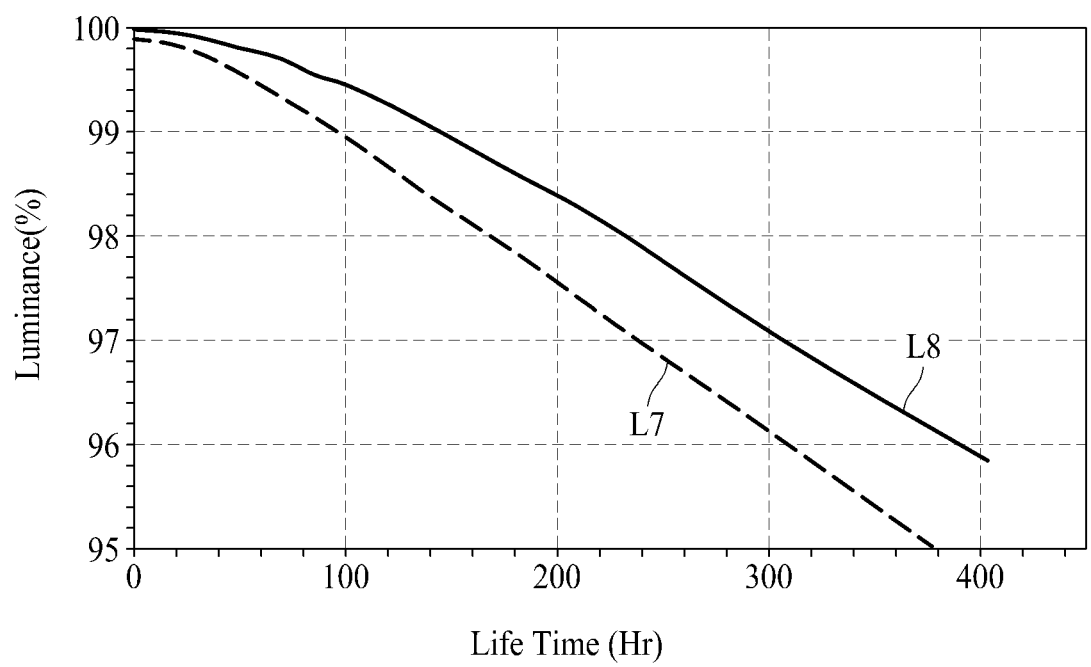
FIG. 13 is a graph illustrating lifetime improvement of an organic light emitting layer of a display device according to the fourth aspect of the present disclosure.

FIG. 13 is a graph illustrating lifetime improvement of an organic light emitting layer of a display device according to the fourth aspect of the present disclosure.

In FIG. 13, a horizontal axis denotes time, and a vertical axis denotes initial luminance converted into a percentage (100%). In this case, L7 is a graph illustrating a lifetime of the light emitting layer when the patterning process is performed in a state that the electron injecting layer, the electron transporting layer, the light emitting layer and the hole transporting layer are sequentially deposited in a vacuum state without the lifetime improvement layer, and L8 is a graph illustrating a lifetime of the light emitting layer when the patterning process is performed in a state that the first sub hole transporting layer 6141 and the first lifetime improvement layer LIL1 of the display device 1 according to the fourth aspect of the present disclosure covers the light emitting layer 613 and the second sub hole transporting layer 6142 made of the same material as that of the first sub hole transporting layer 6141 covers the first sub hole transporting layer 6141. As shown in FIG. 13, it may be estimated from L7 that a lifetime of the light emitting diode of the light emitting layer is about 380 hours, whereas it may be estimated from L8 that a lifetime of the light emitting diode of the light emitting layer is about 440 hours.

Consequently, in the display device 1 according to the fourth aspect of the present disclosure, the patterning process is performed in a state that the first sub hole transporting layer 6141 and the first lifetime improvement layer LIL1 cover the light emitting layer 613, and the second sub hole transporting layer 6142 made of the same material as that of the first sub hole transporting layer 6141 is arranged to cover the first sub hole transporting layer 6141, whereby the lifetime of the light emitting diode of the light emitting layer 613 may be more improved than the case that the patterning process is performed in a state that the electron injecting layer, the electron transporting layer, the light emitting layer and the hole transporting layer are sequentially deposited in a vacuum state without the lifetime improvement layer.

Figure 14:
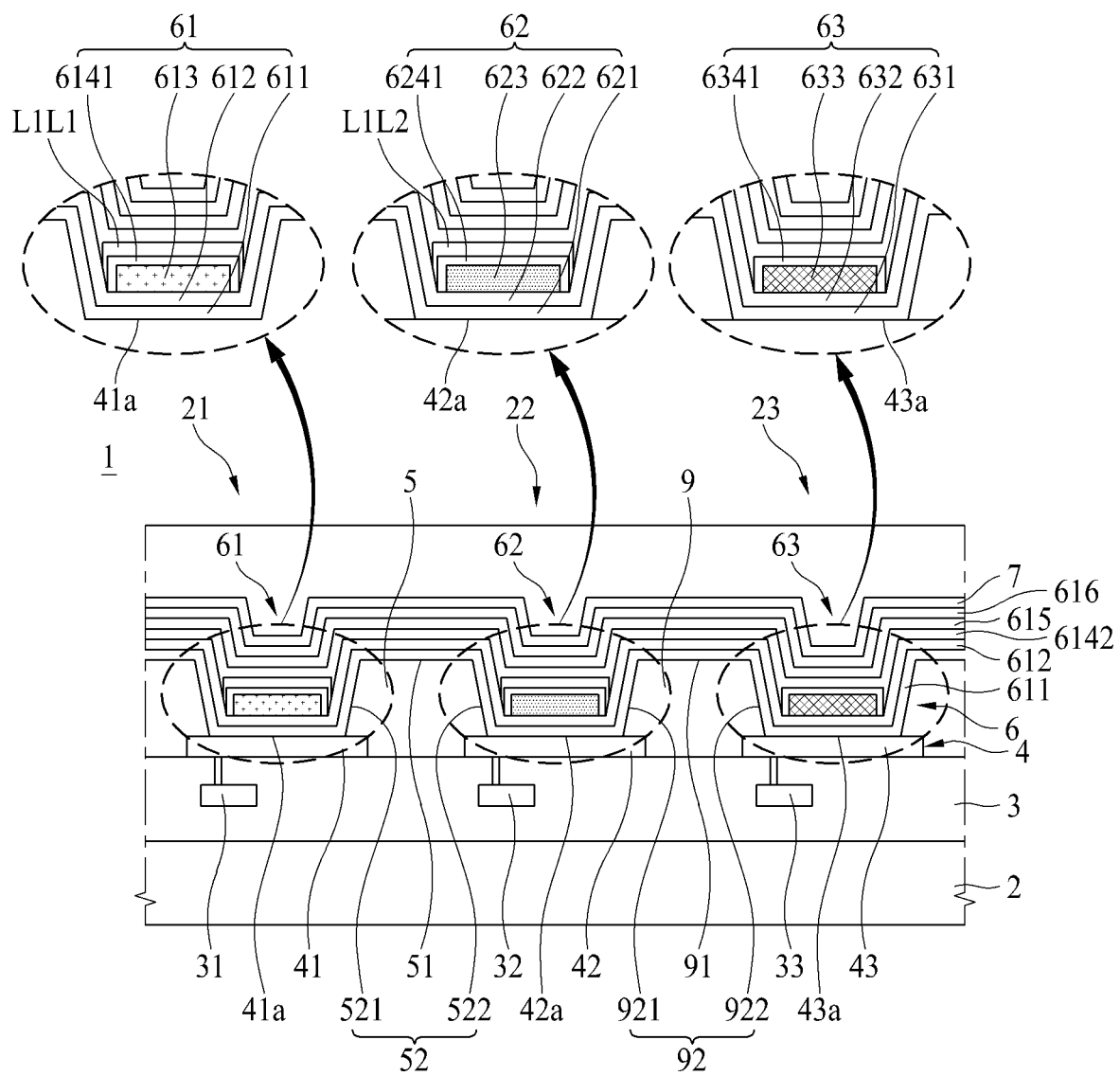
FIG. 14 is a cross-sectional view illustrating a display device according to a fifth aspect of the present disclosure.
Figure 15A:
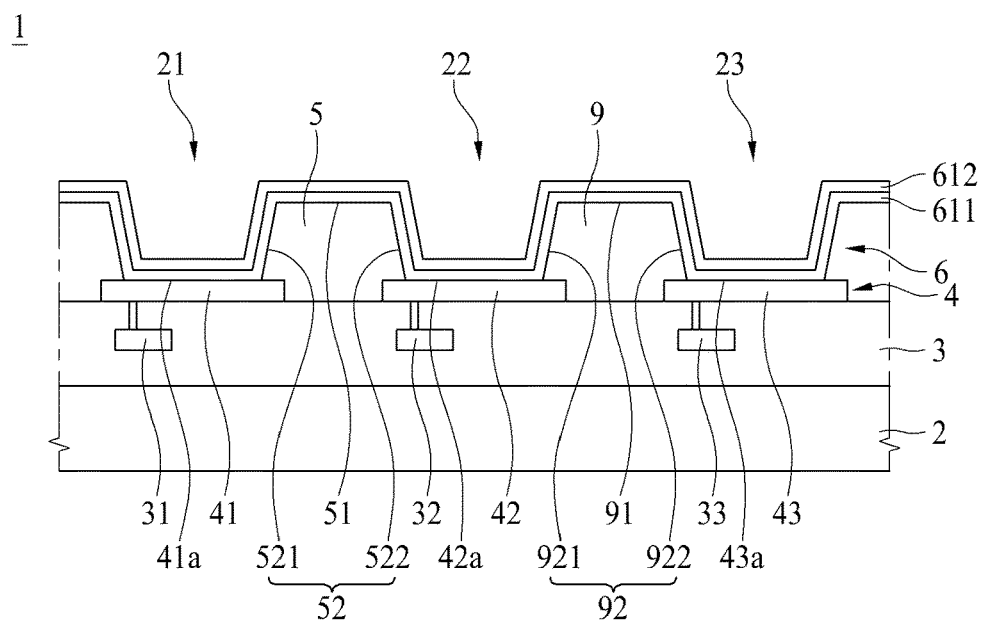
FIGS. 15A to 15P are cross-sectional views illustrating a manufacturing process of a display device according to the fifth aspect of the present disclosure.
Figure 15B:
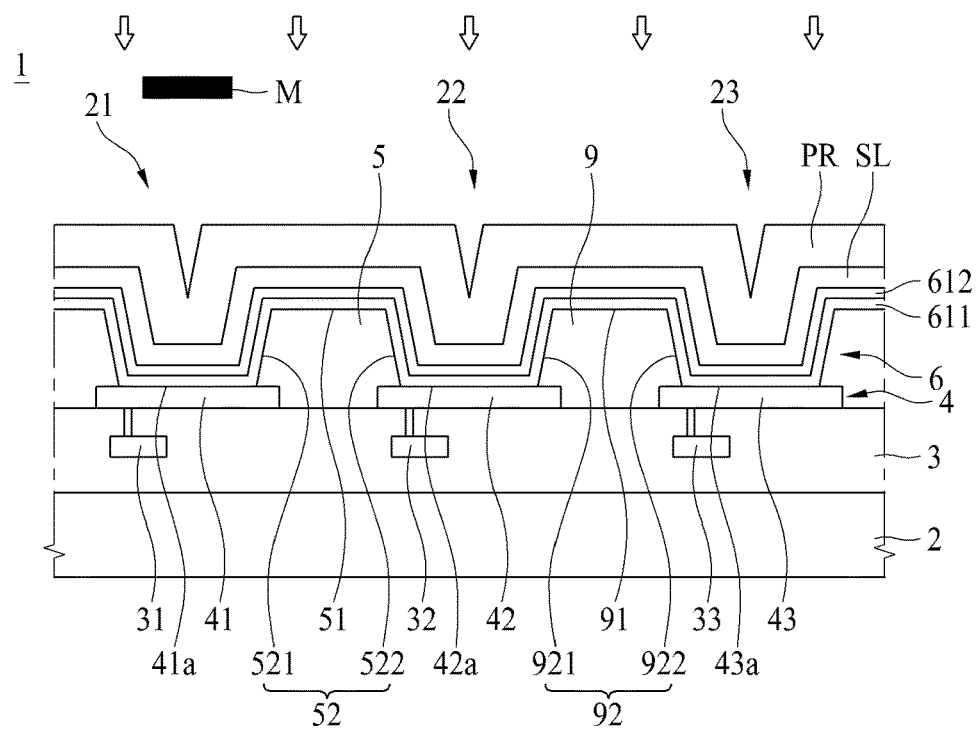
Figure 15C:
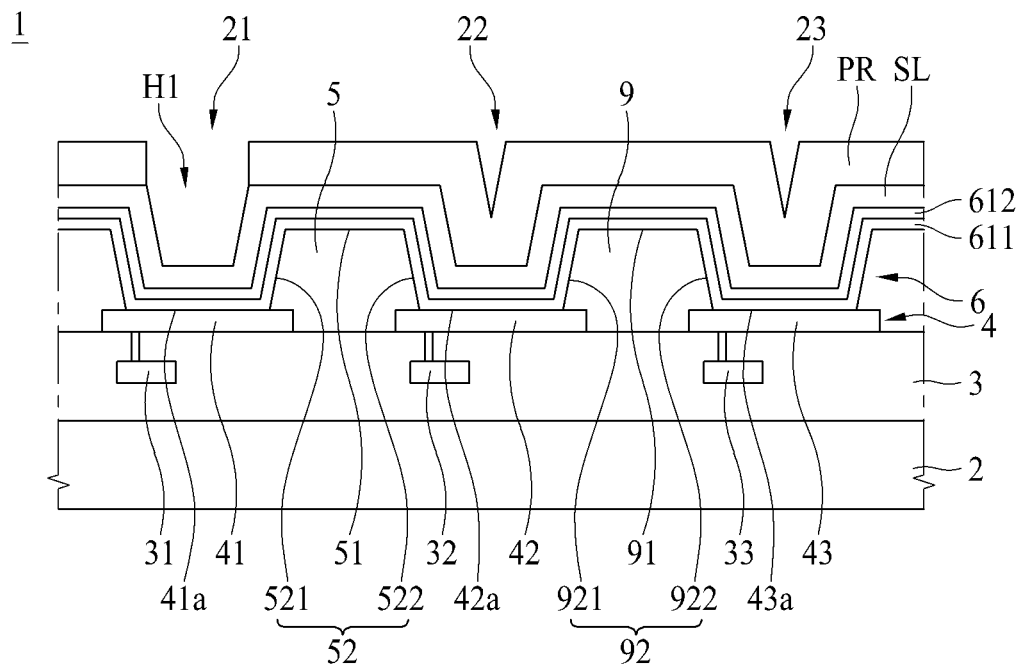
Figure 15D:
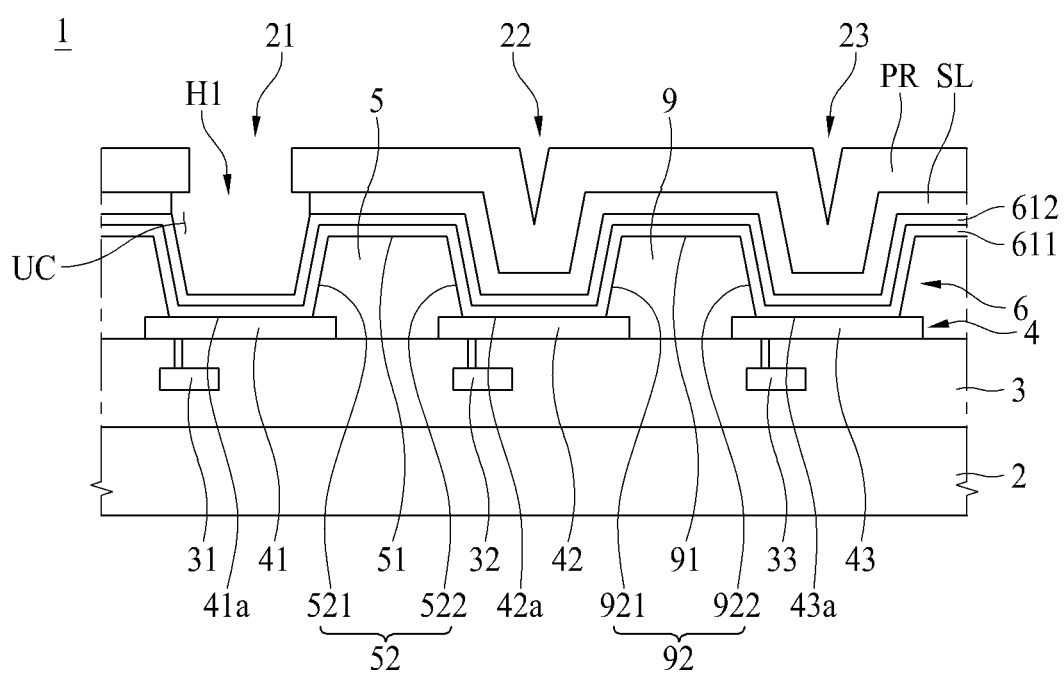
Figure 15E:
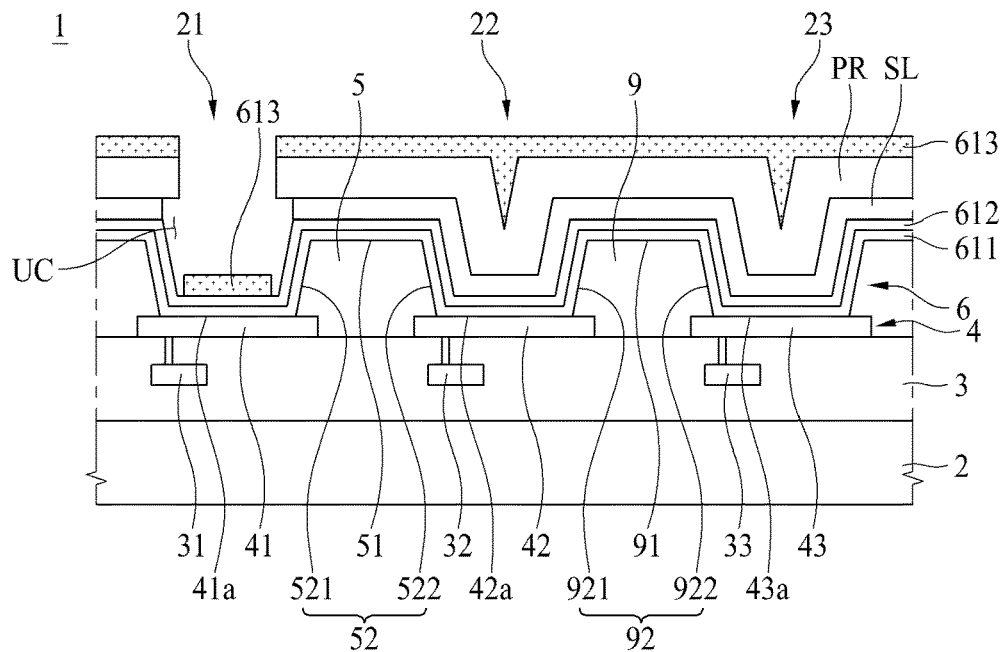
Figure 15F:
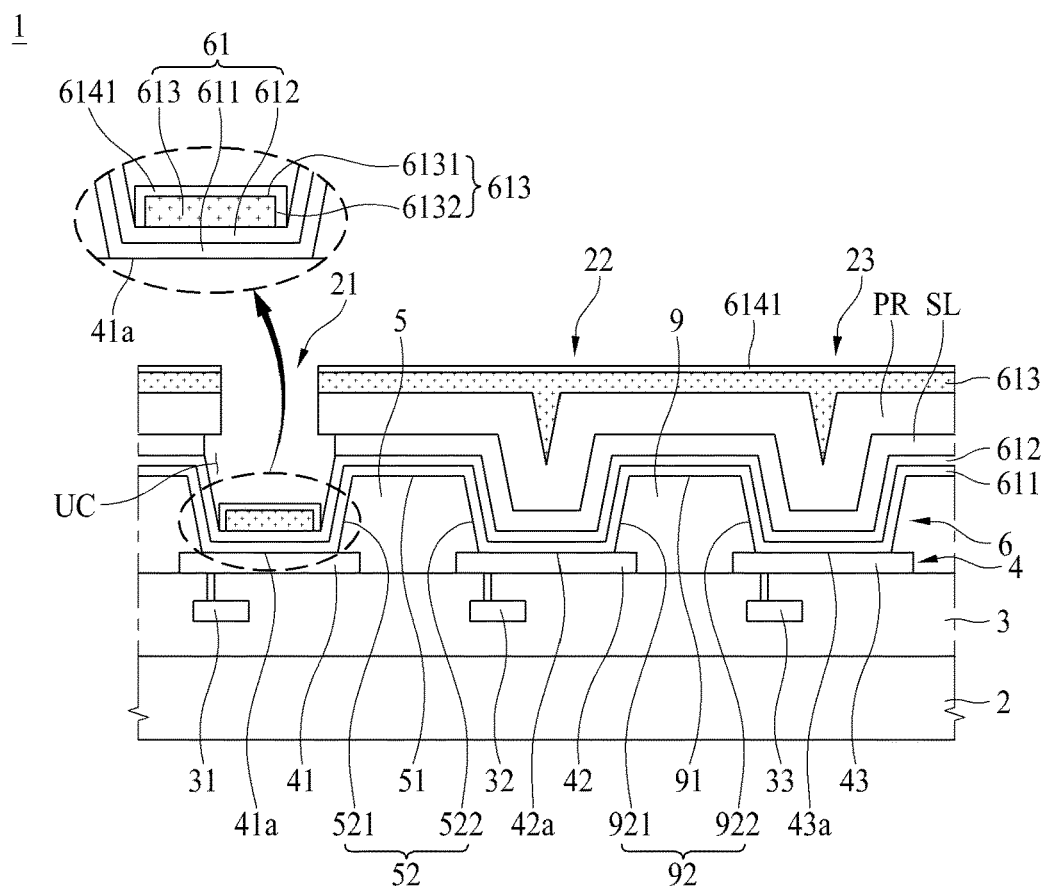
Figure 15G:
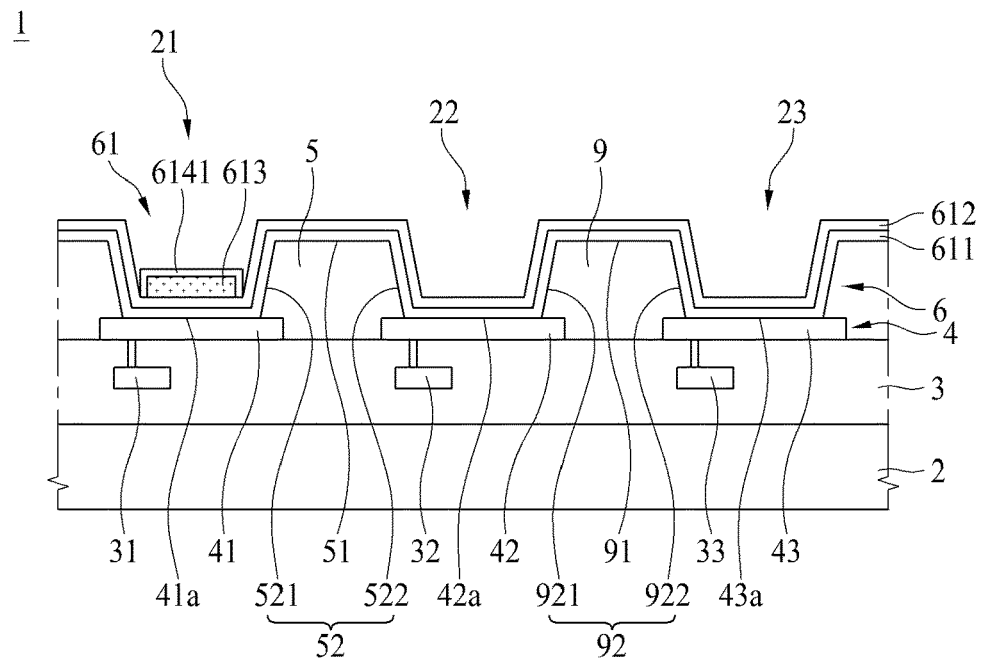
Figure 15H:
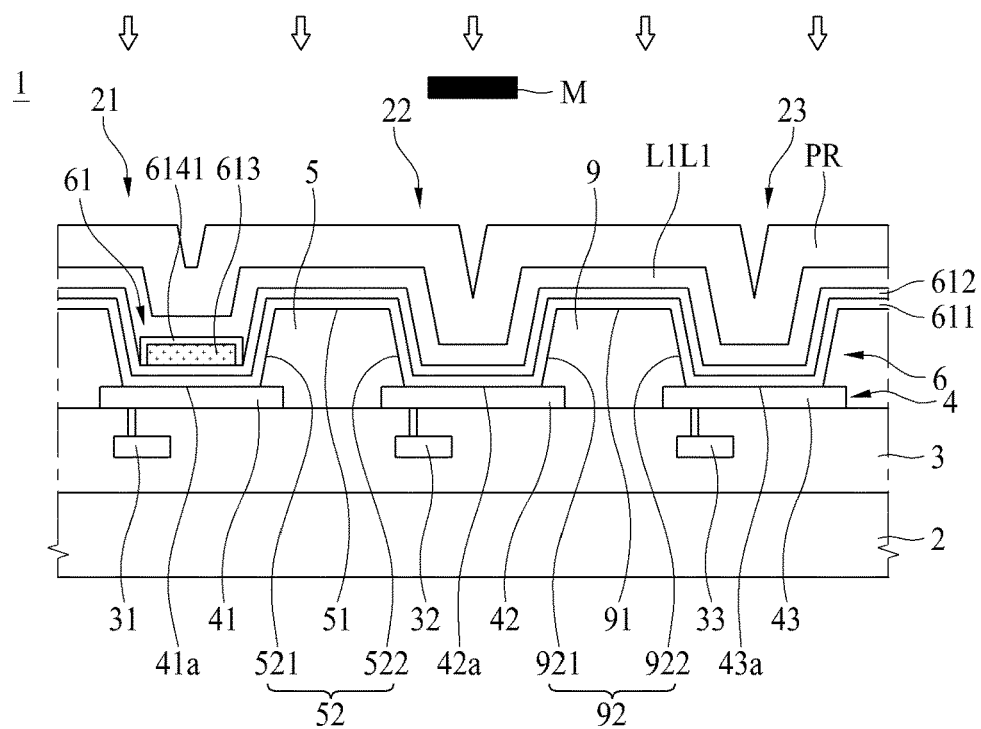
Figure 15I:
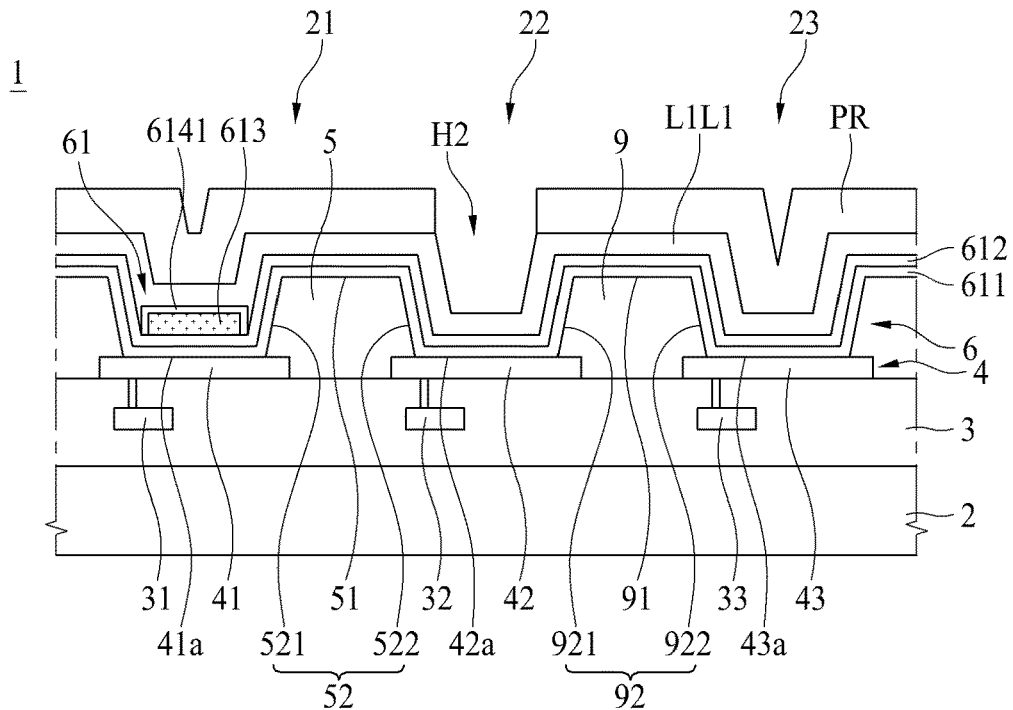
Figure 15J:
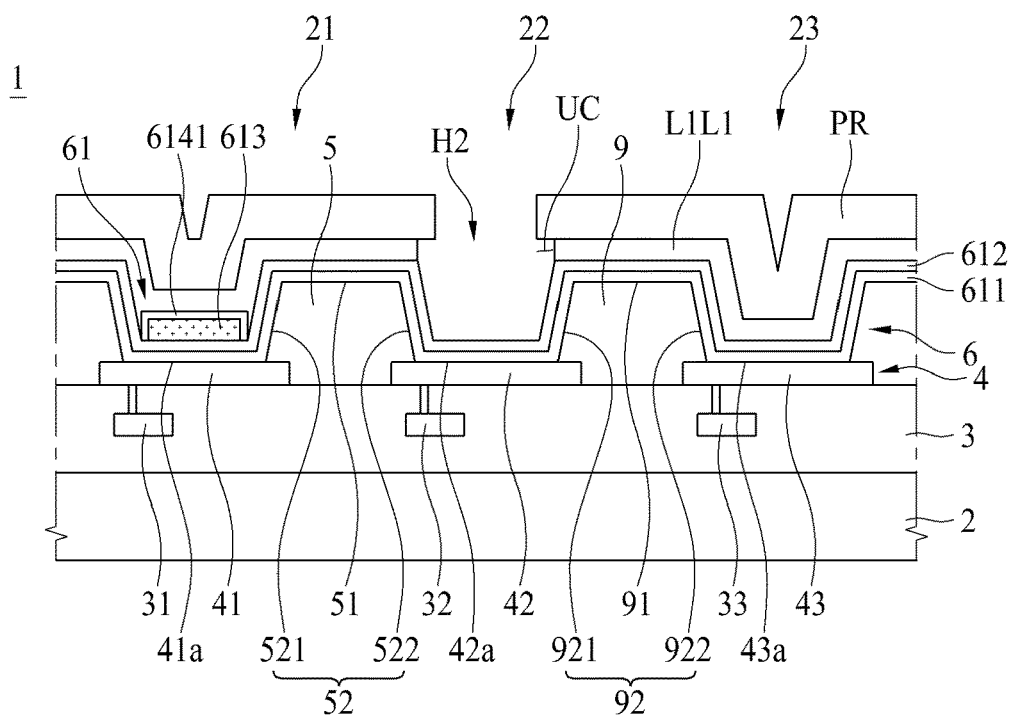
Figure 15K:
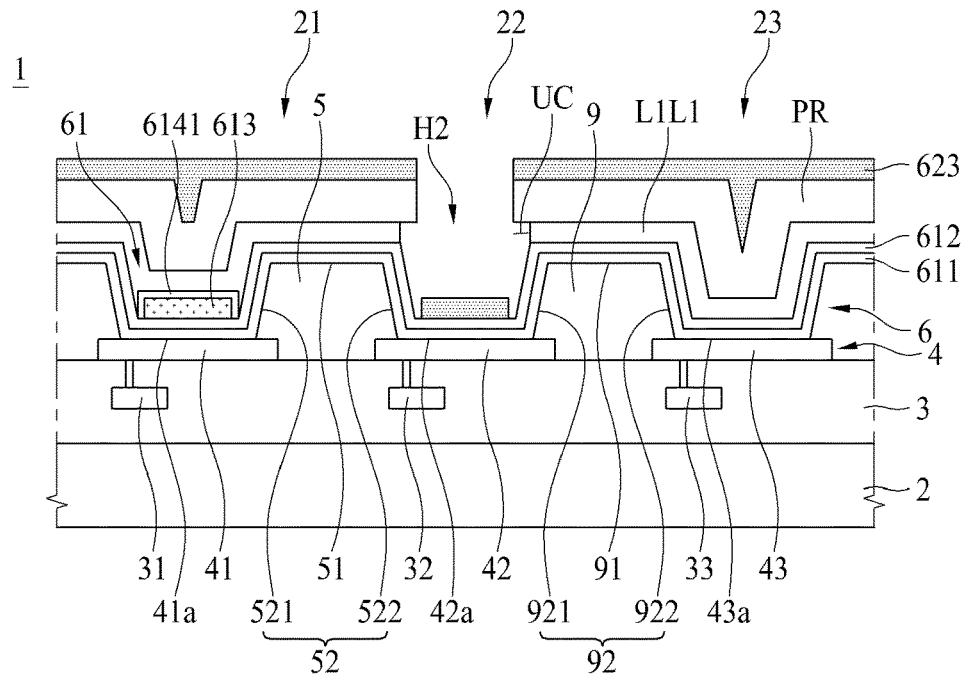
Figure 15L:
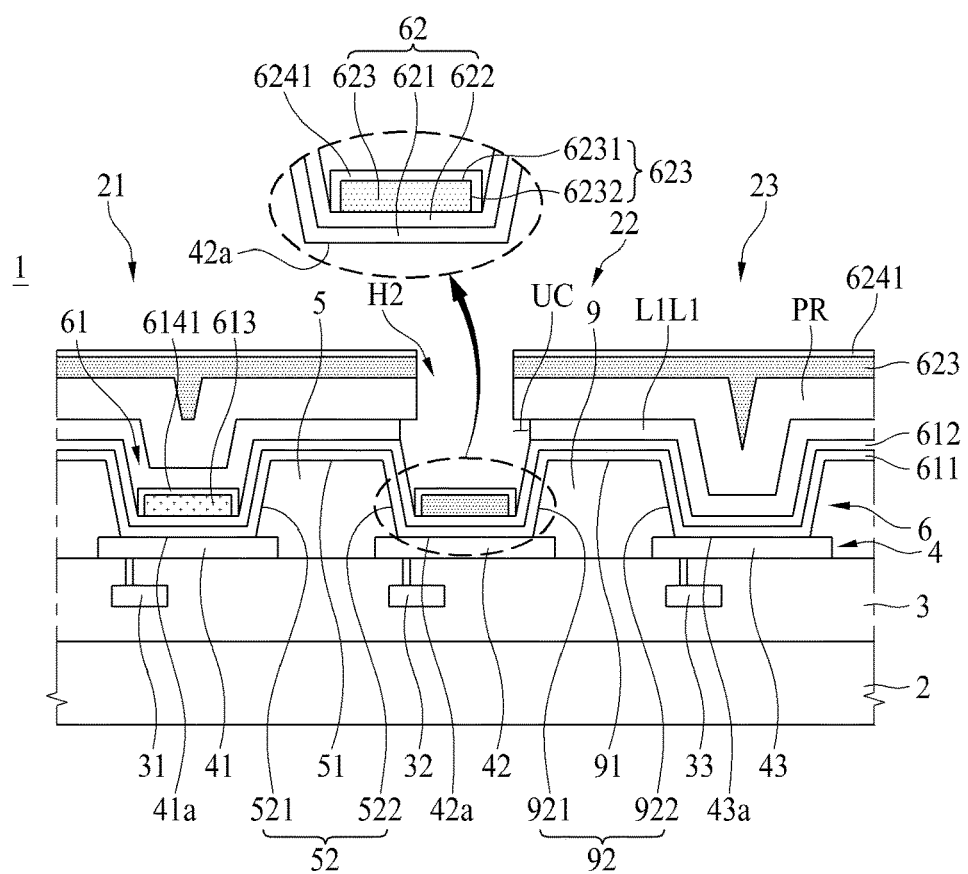
Figure 15M:
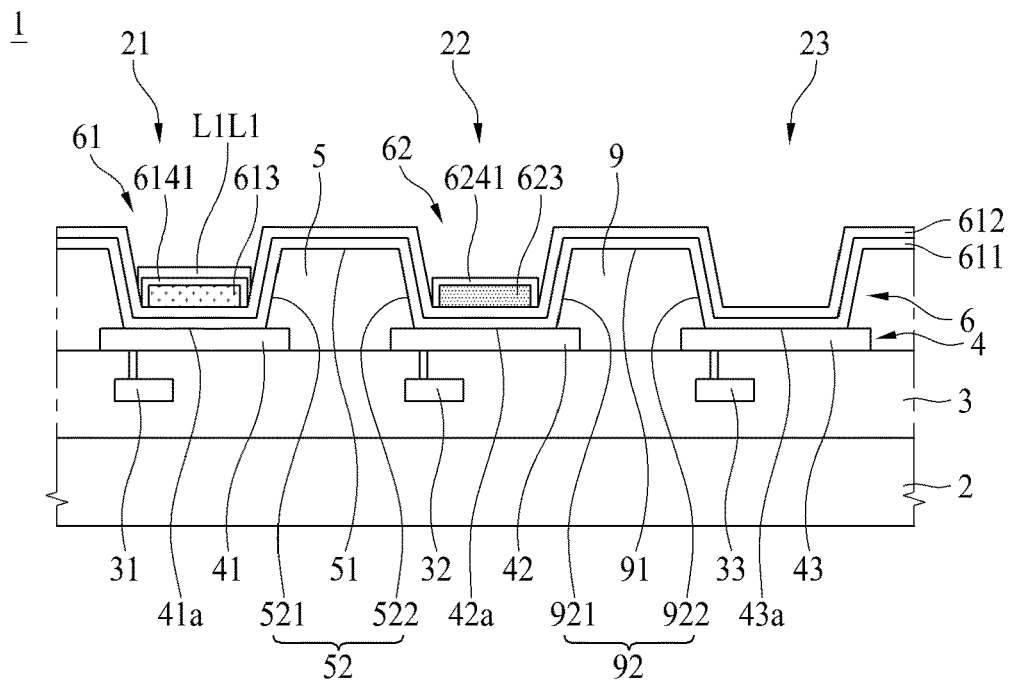
Figure 15N:
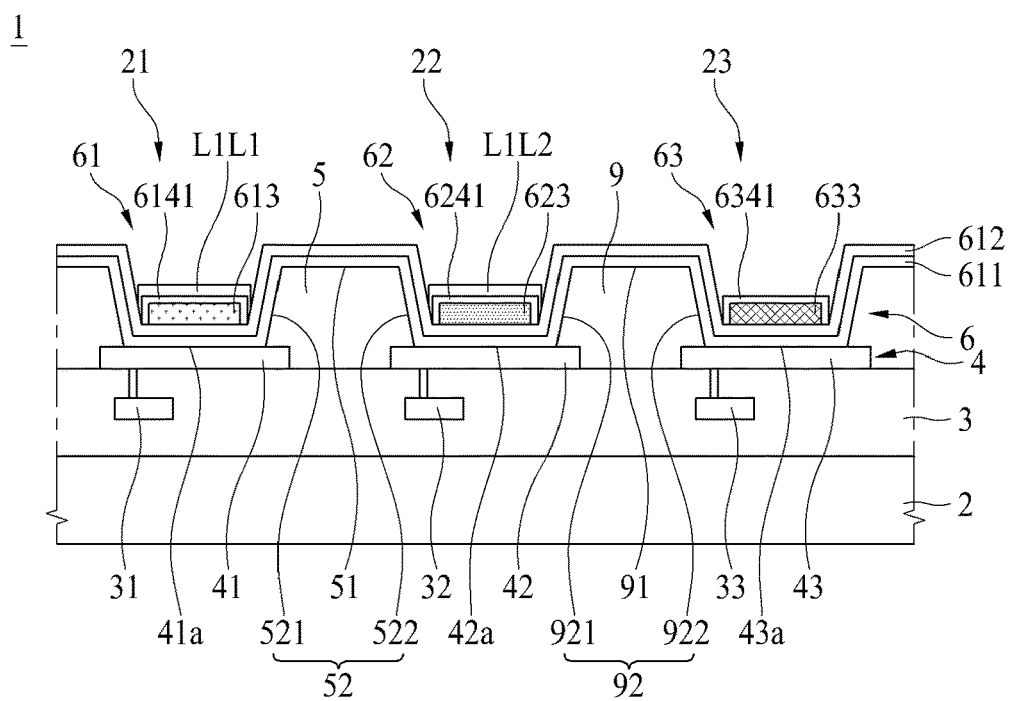
Figure 15O:
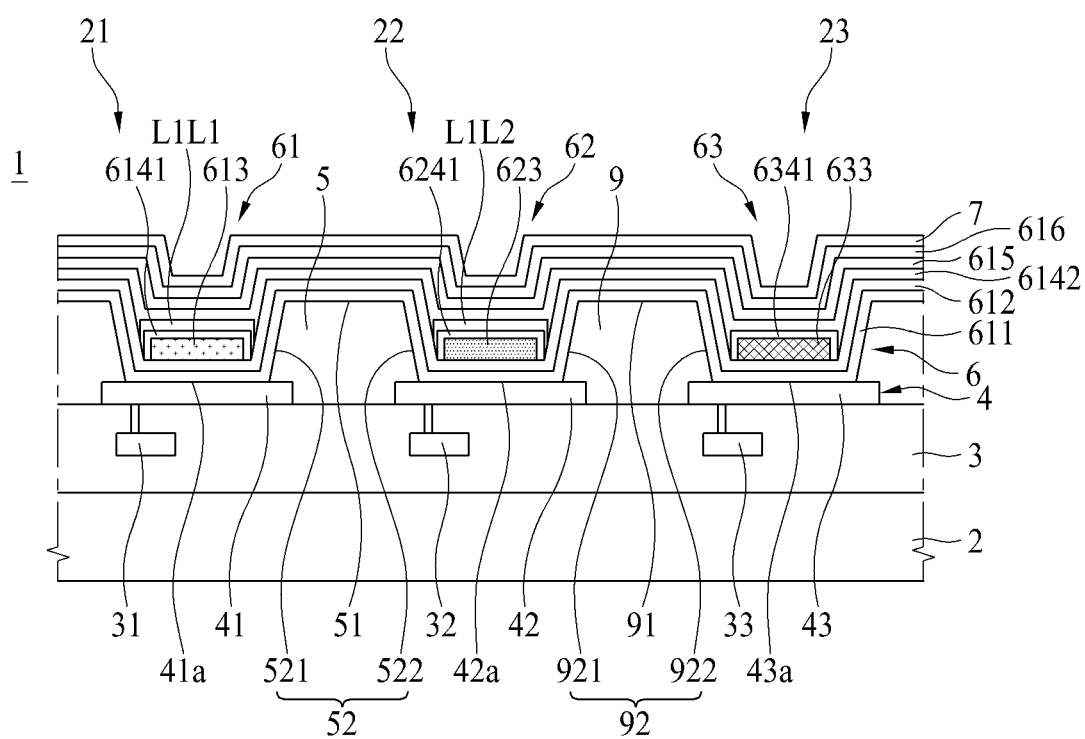
Figure 15P:
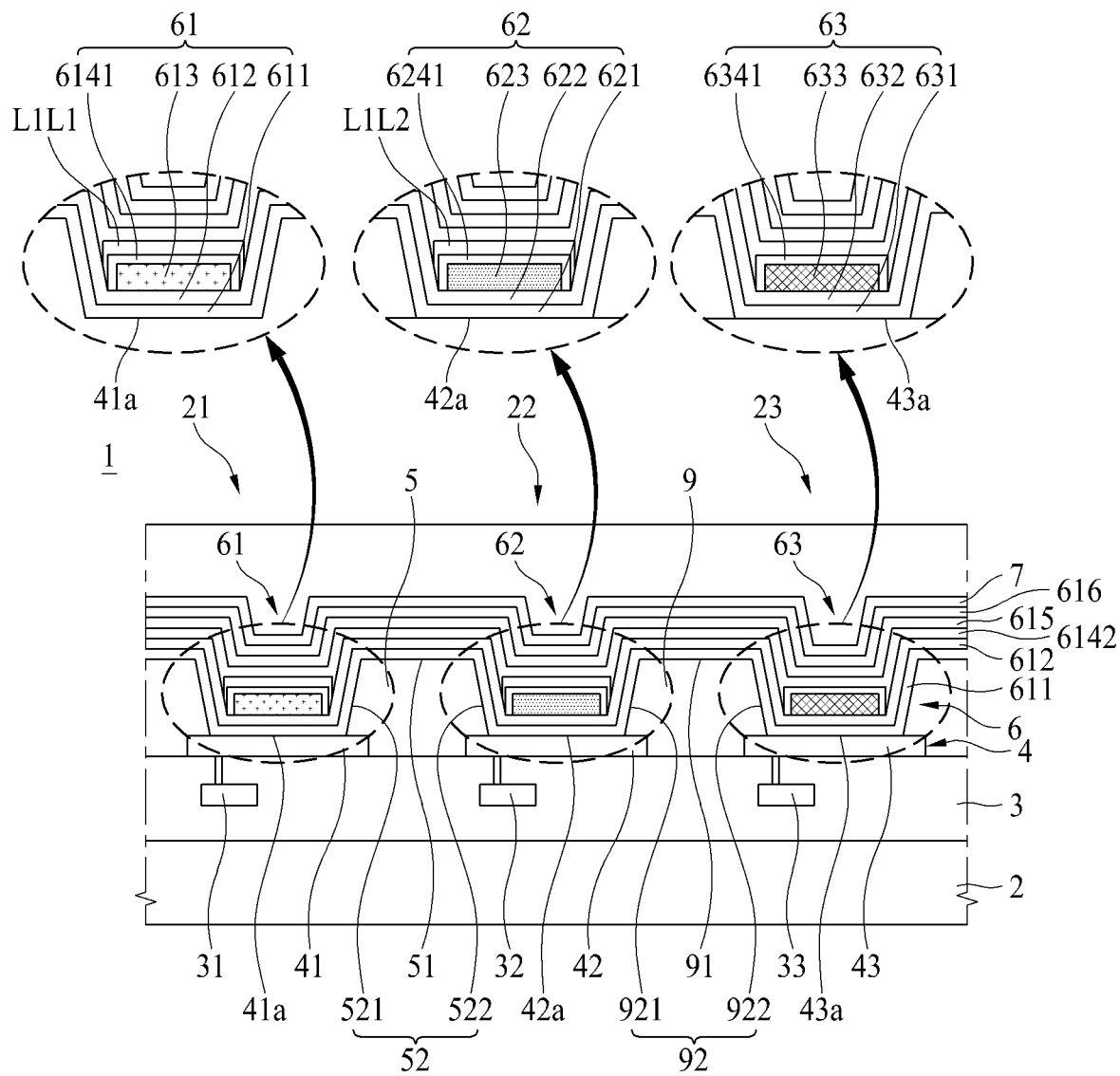

FIG. 14 is a cross-sectional view illustrating a display device according to the fifth aspect of the present disclosure, and FIGS. 15A to 15P are cross-sectional views illustrating a manufacturing process of a display device according to the fifth aspect of the present disclosure.

Referring to FIGS. 14 to 15P, the display device 1 according to the fifth aspect of the present disclosure is the same as the display device 1 according to FIG. 3 except that the display device 1 further includes a first lifetime improvement layer LIL1 arranged between the first sub hole transporting layer 6141 and the second sub hole transporting layer 6142 of the first organic light emitting layer 61 and a second lifetime improvement layer LIL2 arranged between the first sub hole transporting layer 6241 and the second sub hole transporting layer of the second organic light emitting layer 62. Therefore, the same reference numerals are given to the same elements, and only different elements will be described hereinafter. In the display device 1 according to the fifth aspect of the present disclosure, the first lifetime improvement layer LIL1 and the second lifetime improvement layer LIL2 may be shield layers SL used for the manufacturing process of the display device according to the third aspect, and the shield layers SL may remain without being fully removed in the manufacturing process of the display device according to the third aspect and then may be arranged on the light emitting layer. As the shield layer SL used for the manufacturing process of the display device according to the third aspect may include materials such as F, O and N, which will be described later, the display device 1 according to the fifth aspect may be provided with high electron affinity and high hole injection.

In the aforementioned display device according to FIG. 3, as the electron injecting layers 611, 621 and 631 and the electron transporting layers 612, 622 and 632 of each of the first to third organic light emitting layers 61, 62 and 63 are formed to be connected with each other, the number of the manufacturing process steps may be more reduced than the case that the electron injecting layer and the electron transporting layer are respectively formed for each of the sub-pixels 21, 22 and 23, whereby a tact time of the complete display device may be reduced. Also, as the second hole transporting layer 615 made of a material different from that of the second sub hole transporting layer is arranged on the second sub hole transporting layer of each of the first to third organic light emitting layers 61, 62 and 63 to inject holes into the second sub hole transporting layer well, whereby lifetime of the light emitting diode may be prevented from being shortened.

On the contrary, in the display device according to the fifth aspect of FIG. 14, the first lifetime improvement layer LIL1 and the second lifetime improvement layer LIL2 are respectively arranged between the first sub hole transporting layer 6141 and 6241 and the second sub hole transporting layer of each of the first and second organic light emitting layers 61 and 62, whereby hole injection from the second sub hole transporting layer to the first sub hole transporting layer may be enhanced. Electrons are withdrawn from at least one of the first electrode 4 arranged below the light emitting layers 613 and 623, the electron injecting layers 611, 621 and 631 and the electron transporting layers 612, 622 and 632, whereby generation efficiency of exciton from the light emitting layers 613, 623 and 633 may be increased, and lifetime of the organic light emitting layer 6 may be enhanced. This effect is the same as that of the display device according to the fourth aspect.

However, unlike the display device according to the fourth aspect, in the display device 1 according to the fifth aspect of the present disclosure, the third lifetime improvement layer LIL3 is not arranged between the first sub hole transporting layer 6341 and the second sub hole transport layer of the third organic light emitting layer 63.

Also, unlike the display device according to the fourth aspect, in the display device 1 according to the fifth aspect of the present disclosure, the first lifetime improvement layer LIL1 is arranged on the upper surface and the side of the first sub hole transporting layer 6141 of the first organic light emitting layer 61, and the second lifetime improvement layer LIL2 is arranged on the upper surface and the side of the first sub hole transporting layer 6241 of the second organic light emitting layer 62.

The display device 1 according to the fifth aspect is different from the display device according to the fourth aspect in that the first to third organic light emitting layers 61, 62 and 63 are formed by a dry-etching process in the display device according to the fourth aspect, whereas the first to third organic light emitting layers 61, 62 and 63 are formed by a lift-off process in the display device according to the fifth aspect.

Due to the difference in the process as above, in the display device 1 according to the fifth aspect of the present disclosure, the third lifetime improvement layer LIL3 is not arranged between the first sub hole transporting layer 6341 and the second sub hole transporting layer of the third organic light emitting layer 63, and the first lifetime improvement layer LIL1 may be arranged on the upper surface and the side of the first sub hole transporting layer 6141 of the first organic light emitting layer 61, and the second lifetime improvement layer LIL2 may be arranged on the upper surface and the side of the first sub hole transporting layer 6241 of the second organic light emitting layer 62.

Hereinafter, the above difference will be described in detail with reference to the display device 1 according to the fifth aspect of the present disclosure shown in FIG. 14 in connection with the manufacturing process of the display device 1 according to the fifth aspect of the present disclosure shown in FIGS. 15A to 15P.

First of all, referring to FIGS. 15A to 15B, in a state that the first electrode 4, the first bank 5 and the second bank 9 are formed on the substrate 2 and the circuit element layer 3, after the electron injecting layer 611 and the electron transporting layer 612 of the first organic light emitting layer 61, the shield layer SL and the PR layer are sequentially deposited, a mask M (shown in FIG. 15B) is arranged on a portion where a first deposition hole H1 (shown in FIG. 15c) will be formed and then the other portion is subjected to exposure. Therefore, property may be changed such that the other portion of the PR layer except the portion where the first deposition hole H1 will be formed is not etched even by an etching solution.

Since the electron injecting layer 611 and the electron transporting layer 612 of the first organic light emitting layer 61 are entirely deposited as common layers, the layers may be the electron injecting layer 621 and the electron transporting layer 622 of the second organic light emitting layer 62 and the electron injecting layer 631 and the electron transporting layer 632 of the third organic light emitting layer 63.

The first deposition hole H1 is a hole for forming the light emitting layer 613 and the first sub hole transporting layer 6141 of the first organic light emitting layer 61 and the first lifetime improvement layer LIL1, and may finally become the upper surface of the electron transporting layer 612. The PR layer may be a photoresist layer. The light emitting layer 613 may be a red light emitting layer for emitting a red (R) colored light if an electric field is formed.

Then, referring to FIG. 15C, a primary removing process for removing the PR layer arranged on the area where the first deposition hole H1 will be formed by using the developing solution is performed. The PR layer may be removed by being eroded after being dipped in the developing solution.

Then, referring to FIG. 15D, a secondary removing process for removing the shield layer SL arranged on the area where the first deposition hole H1 will be formed by using the developing solution is performed. At this time, in the secondary removing process, the time when the PR layer is dipped in the developing solution is more increased than the primary removing process, whereby an under cut (UC) area may be formed. Therefore, the shield layer SL removed by the secondary removing process may be wider than the PR layer removed by the primary removing process.

Then, referring to FIG. 15E, the light emitting layer 613 of the first organic light emitting layer 61 is formed on the electron transporting layer 612 arranged in the first deposition hole H1. For example, the light emitting layer 613 of the first organic light emitting layer 61 may be formed by supplying and depositing organisms toward the upper surface of the PR layer and the electron transporting layer 612 from the outside of the PR layer in various ways. At this time, the light emitting layer 613 may be deposited on the upper surface of the electron transporting layer 612 through the first deposition hole H1. Meanwhile, due to this process, the light emitting layer 613 may be deposited even on the PR layer.

Then, referring to FIG. 15F, the first sub hole transporting layer 6141 is deposited to surround the light emitting layer 613 of the first organic light emitting layer 61. In more detail, the first sub hole transporting layer 6141 may be in contact with each of an upper surface 6131 and a side 6132 of the light emitting layer 613 through the first deposition hole H1. At this time, since the first sub hole transporting layer 6141 is deposited after the light emitting layer 613 is formed, the first sub hole transporting layer 6141 may be in contact with even the upper surface of the electron transporting layer 612 while covering the light emitting layer 613. Meanwhile, the first sub hole transporting layer 6141 may be deposited on the light emitting layer 613 by a sputter method to have a thickness of 100 Å or more. Therefore, the first sub hole transporting layer 6141 may protect the light emitting layer 613 to prevent the light emitting layer 613 of the first organic light emitting layer 61 from being damaged by an etching solution used for a process which will be performed later.

Then, referring to FIG. 15G, a third removing process is performed to remove the other except the light emitting layer 613 of the first organic light emitting layer 61 and the first sub hole transporting layer 6141 surrounding the light emitting layer 613 of the first organic light emitting layer 61. The third removing process may be performed by lifting-off the shield layer SL coated on the second sub electrode 42 and the third sub electrode 43 and the banks including the first bank 5 and the second bank 9 except the light emitting layer 613 and the first sub hole transporting layer 6141 of the first organic light emitting layer 61, which are formed on the electron transporting layer 612 in the first subpixel 21, through a strip process. Therefore, the light emitting layer 613 of which upper surface 6131 and side 6132 are protected by the first sub hole transporting layer 6141 may only remain on the electron transporting layer 612 in the first subpixel 21. Therefore, the first sub hole transporting layer 6141 may prevent the etching solution used for a follow-up process from being in contact with the light emitting layer 613 of the first organic light emitting layer 61, whereby the light emitting layer 613 of the first organic light emitting layer 61 may be prevented from being damaged by the etching solution.

Then, referring to FIG. 15H, after the first lifetime improvement layer LIL1 and the PR layer are deposited in due order, the mask M is arranged in a portion where a second deposition hole H2 (shown in FIG. 15J) will be formed and the other portion is subjected to exposure. Therefore, a property may be changed such that the other portion of the PR layer except the portion where the second deposition hole H2 will be formed is not etched even by an etching solution.

The second deposition hole H2 is a hole for forming the light emitting layer 623 and the first sub hole transporting layer 6241 of the second organic light emitting layer 62, and may finally become the upper surface of the electron transporting layer 612. The light emitting layer 623 may be a green light emitting layer for emitting a green (G) colored light if an electric field is formed.

Then, referring to FIG. 15*i*, a primary removing process for removing the PR layer arranged on the area where the second deposition hole H2 will be formed by using the developing solution is performed. The PR layer may be removed by being eroded after being dipped in the developing solution.

Then, referring to FIG. 15J, a secondary removing process for removing the first lifetime improvement layer LIL1 arranged on the area where the first deposition hole H1 will be formed by using the developing solution is performed. At this time, in the secondary removing process, as the time when the corresponding layer is dipped in the developing solution is more increased than the primary removing process, a volume of the first lifetime improvement layer LIL1 removed by the primary removing process is increased, whereby an under cut (UC) area may be formed. Therefore, the first lifetime improvement layer LIL1 removed by the secondary removing process may be wider than the PR layer removed by the primary removing process.

Then, referring to FIG. 15K, the light emitting layer 623 of the second organic light emitting layer 62 is formed on the electron transporting layer 612 arranged in the second deposition hole H2. For example, the light emitting layer 623 of the second organic light emitting layer 62 may be formed by supplying and depositing organisms toward the upper surface of the PR layer and the electron transporting layer 612 from the outside of the PR layer in various ways. At this time, the light emitting layer 623 may be deposited on the upper surface of the electron transporting layer 612 through the second deposition hole H2. Meanwhile, due to this process, the light emitting layer 623 may be deposited even on the PR layer.

Then, referring to FIG. 15L, the first sub hole transporting layer 6141 is deposited to surround the light emitting layer 623 of the second organic light emitting layer 62. In more detail, the first sub hole transporting layer 6141 may be in contact with each of an upper surface 6231 and a side 6232 of the light emitting layer 623 through the second deposition hole H2. At this time, since the first sub hole transporting layer 6141 is deposited after the light emitting layer 623 is formed, the first sub hole transporting layer 6141 may be in contact with even the upper surface of the electron transporting layer 612 while covering the light emitting layer 623. Meanwhile, the first sub hole transporting layer 6141 may be deposited on the light emitting layer 623 by a sputter method to have a thickness of 100 Å or more. Therefore, the first sub hole transporting layer 6141 may protect the light emitting layer 623 to prevent the light emitting layer 623 of the second organic light emitting layer 62 from being damaged by an etching solution used for a process which will be performed later.

Then, referring to FIG. 15M, a third removing process is performed to remove the other except the light emitting layer 623 of the second organic light emitting layer 62 and the first sub hole transporting layer 6241 surrounding the light emitting layer 623 of the second organic light emitting layer 62. The third removing process may be performed by lifting-off the first lifetime improvement layer LIL1 coated on the third sub electrode 43, the banks including the first bank 5 and the second bank 9, and the first subpixel 21 except the light emitting layer 623 and the first sub hole transporting layer 6241 of the second organic light emitting layer 62, which are formed on the electron transporting layer 612 in the second subpixel 22, through a strip process. At this time, the third removing process may be performed until the first lifetime improvement layer LIL1 arranged to cover the upper surface and the side of the first sub hole transporting layer 6141 of the first organic light emitting layer 61 in the first subpixel 21 partially remains.

Therefore, the light emitting layer 623 of which upper surface 6231 and side 6232 are protected by the first sub hole transporting layer 6241 may only remain on the electron transporting layer 612 in the second subpixel 22. Therefore, the first sub hole transporting layer 6241 may prevent the etching solution used for a follow-up process from being in contact with the light emitting layer 623 of the second organic light emitting layer 62, whereby the light emitting layer 623 of the second organic light emitting layer 62 may be prevented from being damaged by the etching solution.

Meanwhile, the first lifetime improvement layer LIL1 may be arranged to cover the upper surface and the side of the first sub hole transporting layer 6141 that covers the upper surface and the side of the light emitting layer 613.

Consequently, in the manufacturing process of the display device 1 according to the fifth aspect of the present disclosure, when the second organic light emitting layer 62 is partially formed in the second subpixel 22, the first lifetime improvement layer LIL1 may be formed in the first subpixel 21.

Then, referring to FIG. 15N, the process of FIGS. 15H to 15M may be repeated, whereby the light emitting layer 633 of the third organic light emitting layer 63 of which upper surface and side are protected by the first sub hole transporting layer 6341 of the third organic light emitting layer 63 may be formed on the electron transporting layer 612 of the third subpixel 23, and the second lifetime improvement layer LIL2 may be arranged on the upper surface of the electron transporting layer 612 of the second subpixel 22 to cover the light emitting layer 623 of which upper surface and side are protected by the first sub hole transporting layer 6241 of the second organic light emitting layer 62 and the upper surface and the side of the first sub hole transporting layer 6241.

Consequently, in the manufacturing process of the display device according to the fifth aspect of the present disclosure, in a state that the first sub hole transporting layer 6141 of the first organic light emitting layer 61 and the first lifetime improvement layer LIL1 doubly protect the upper surface and the side of the light emitting layer 613 of the first organic light emitting layer 61, since the lift-off process for forming the light emitting layer 623 of the second organic light emitting layer 62 and the light emitting layer 633 of the third organic light emitting layer 63 is performed, the light emitting layer 613 of the first organic light emitting layer 61, which is formed earlier, may be prevented from being damaged by the etching solution used for the follow-up process.

Likewise, in the manufacturing process of the display device according to the fifth aspect of the present disclosure, in a state that the first sub hole transporting layer 6241 of the second organic light emitting layer 62 and the second lifetime improvement layer LIL2 doubly protect the upper surface and the side of the light emitting layer 623 of the second organic light emitting layer 62, when the light emitting layer 633 of the third organic light emitting layer 63 is formed, the light emitting layer 623 of the second organic light emitting layer 62 may be prevented from being damaged by the etching solution used for the lift-off process.

Meanwhile, since the lift-off process is performed in the third subpixel 23 in a state that the first sub hole transporting layer 6341 of the third organic light emitting layer 63 protects the upper surface and the side of the light emitting layer 633 of the third organic light emitting layer 63, the light emitting layer 633 of the third organic light emitting layer 63 may be prevented from being damaged by the etching solution used for the lift-off process.

As described above, in the manufacturing process of the display device according to the fifth aspect of the present disclosure, since the first lifetime improvement layer LIL1 is formed in the first subpixel 21 when the second organic light emitting layer 62 is partially formed in the second subpixel 22 and the second lifetime improvement layer LIL2 is formed in the second subpixel 22 when the third organic light emitting layer 63 is partially formed in the third subpixel 23, the third lifetime improvement layer LIL3 cannot be formed in the third subpixel 23. Therefore, in the manufacturing process of the display device according to the fifth aspect of the present disclosure, the other common layers may be formed in the state of FIG. 15n.

Meanwhile, although not shown, in the manufacturing process of the display device according to the fifth aspect of the present disclosure, since the lift-off process is performed in a state that the first sub hole transporting layer 6141 and the first lifetime improvement layer LIL1 protect the light emitting layer 613, the first sub hole transporting layer 6241 and the second lifetime improvement layer LIL2 protect the light emitting layer 623, and the first sub hole transporting layer 6341 protects the light emitting layer 633, even though a rinsing process for removing residual materials on the structure more certainly is additionally performed after the lift-off process, the light emitting layers 613, 623 and 633 may be prevented from being damaged by a rinsing solution used for the rinsing process.

Then, referring to FIGS. 15O and 15P, the second sub hole transporting layer 6142, the second hole transporting layer 615 and the hole injecting layer 616 of the first organic light emitting layer 61, the second electrode 7 and the encapsulation layer 8 are sequentially deposited on the entire surface, whereby the manufacturing process may partially be completed.

In this case, since the second sub hole transporting layer 6142, the second hole transporting layer 615 and the hole injecting layer 616 of the first organic light emitting layer 61 are common layers deposited on the entire surface over the first subpixel 21, the second subpixel 22 and the third subpixel 23, the layers may be the second sub hole transporting layer, the second hole transporting layer and the hole injecting layer of the second organic light emitting layer 62, and may also be the second sub hole transporting layer, the second hole transporting layer and the hole injecting layer of the third organic light emitting layer 63.

Consequently, each of the first sub hole transporting layer 6141 and the first lifetime improvement layer LIL1 of the first organic light emitting layer 61, the first sub hole transporting layer 6241 and the second lifetime improvement layer LIL2 of the second organic light emitting layer 62 and the first sub hole transporting layer 6341 of the third organic light emitting layer 63 may be in contact with the inside of each of the first organic light emitting layer 61, the second organic light emitting layer 62 and the third organic light emitting layer 63, more specifically the upper surface and the side of each of the light emitting layers 613, 623 and 633 of the organic light emitting layers 61, 62 and 63 between the electron transporting layer 612 and the second sub hole transporting layer 6142 and may also be in contact with the upper surface of the electron transporting layer 612, whereby the light emitting layers 613, 623 and 633 may be sealed and protected.

Meanwhile, as described above, the first lifetime improvement layer LIL1 may increase lifetime of the organic light emitting layer by increasing exciton generation efficiency from the light emitting layer 613 by withdrawing electrons toward the light emitting layer 613 of the first organic light emitting layer 61 and at the same time enhancing hole injection to reduce a driving voltage reduction, and the second lifetime improvement layer LIL2 may increase lifetime of the organic light emitting layer by increasing exciton generation efficiency from the light emitting layer 623 by withdrawing electrons toward the light emitting layer 623 of the second organic light emitting layer 62 and at the same time enhancing hole injection to reduce a driving voltage reduction.

However, in the display device 1 according to the fifth aspect of the present disclosure, since the first lifetime improvement layer LIL1 is arranged on the upper surface and the side of the light emitting layer 613, electron withdrawing and hole injection may be enhanced toward the side of the light emitting layer 613. However, since the first electrode 4 and the second electrode 7 are arranged up and down based on the light emitting layer 613, electron withdrawing and hole injection may be performed in an up and down direction corresponding to a direction where an electric field is formed. This may equally be applied to the second lifetime improvement layer LIL2 arranged in the second subpixel 22.

In conclusion, in the display device 1 according to the fifth aspect of the present disclosure, the third lifetime improvement layer is not formed in the third subpixel 23, the first lifetime improvement layer LIL1 may be formed in the first subpixel 21 and the second lifetime improvement layer LIL2 may be formed in the second subpixel 22 due to the manufacturing process different from that of the display device according to the fourth aspect. Unlike the display device according to the fourth aspect, the first lifetime improvement layer LIL1 of the display device 1 according to the fifth aspect may cover both of the upper surface and the side of the first sub hole transporting layer 6141, and the second lifetime improvement layer LIL2 may cover both of the upper surface and the side of the first sub hole transporting layer 6241. Therefore, the upper surface and the side of the light emitting layer 613 of the first organic light emitting layer 61 and the upper surface and the side of the light emitting layer 623 of the second organic light emitting layer 62 may doubly be protected, whereby the light emitting layers 613 and 623 may be protected from the etching solution more safely.

In this specification, although the description has been given based on that the first lifetime improvement layer LIL1, the second lifetime improvement layer LIL2 and the third lifetime improvement layer LIL3 are arranged between the first sub hole transporting layers 6141, 6241 and 6341 and the second sub hole transporting layer 6142, the present disclosure is not limited to this example. The first lifetime improvement layer LIL1, the second lifetime improvement layer LIL2 and the third lifetime improvement layer LIL3 may be arranged in another position unless the layers are in contact with the light emitting layers 613, 623 and 633 between the light emitting layers 613, 623 and 633 and the second electrode 7. For example, the first lifetime improvement layer LIL1, the second lifetime improvement layer LIL2 and the third lifetime improvement layer LIL3 may be arranged between the first hole transporting layer and the second hole transporting layer 615, between the second hole transporting layer 615 and the hole injecting layer 616 or between the hole transporting layer 616 and the second electrode 7.

For another example, the first lifetime improvement layer LIL1, the second lifetime improvement layer LIL2 and the third lifetime improvement layer LIL3 may be arranged above or below the hole transporting layer provided in a single layer of the first hole transporting layer and the second hole transporting layer.

Figure 16A:
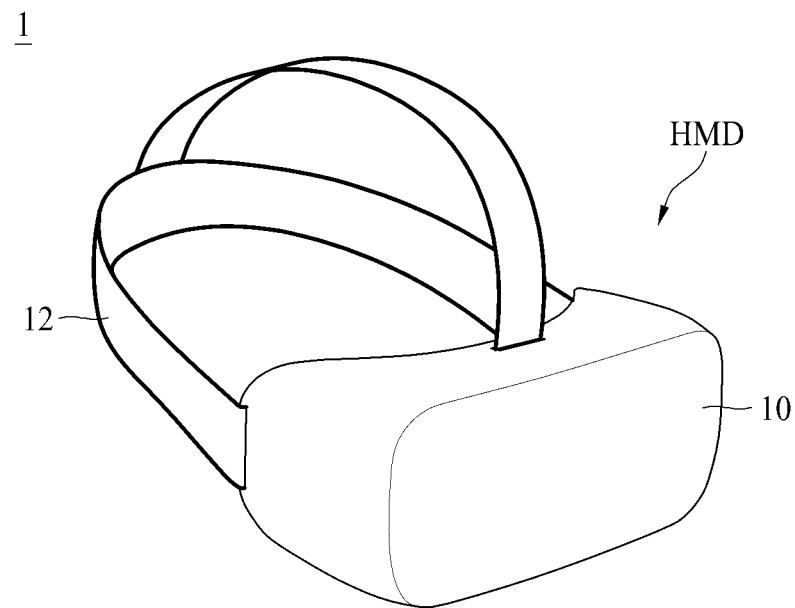
FIGS. 16A to 16C are views illustrating a display device according to a sixth aspect of the present disclosure, and relate to a head-mounted display (HMD) device.
Figure 16B:
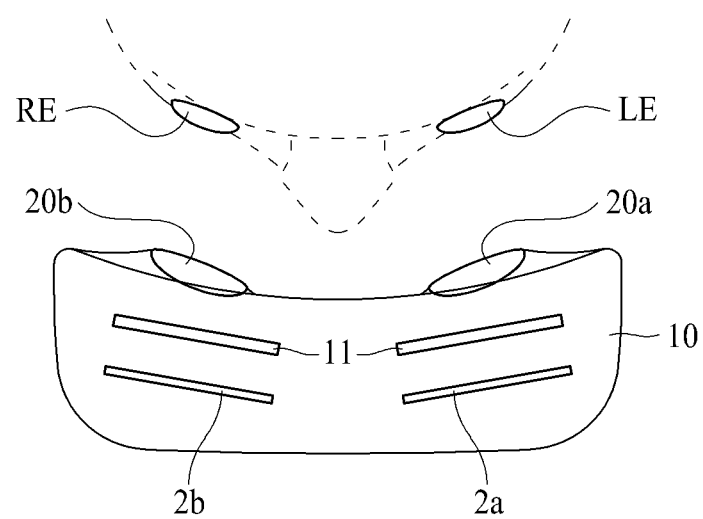
Figure 16C:
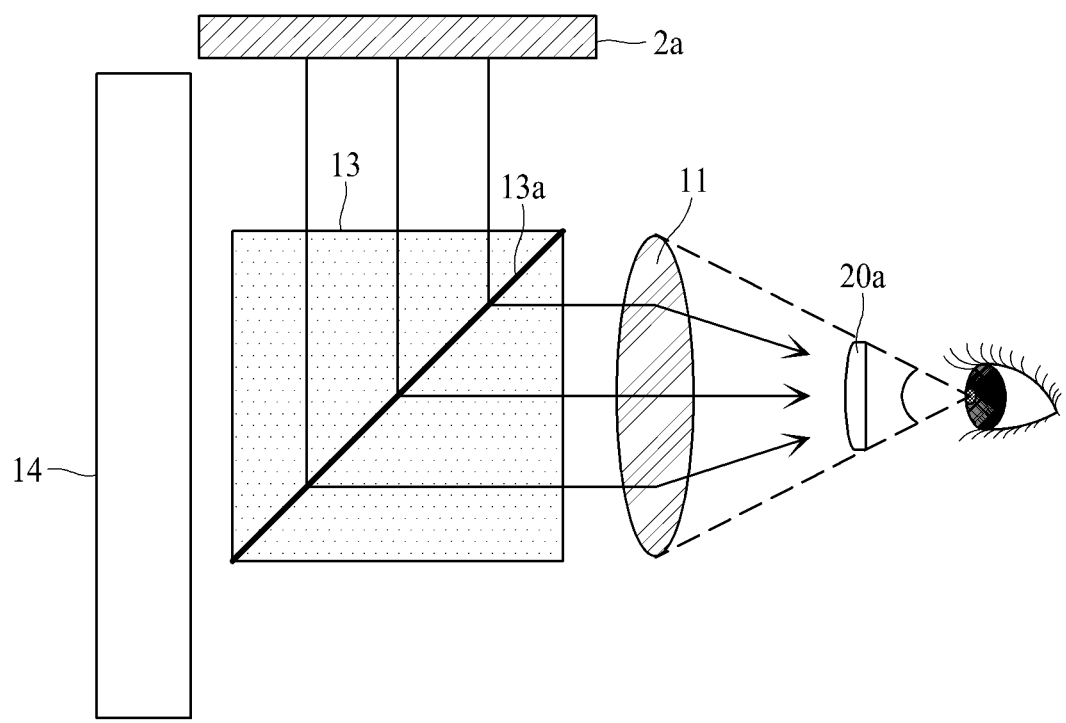

FIGS. 16A to 16C are views illustrating a display device according to the sixth aspect of the present disclosure and relate to a head mounted display (HMD) device. FIG. 16A is a perspective view, FIG. 16B is a plan view of a virtual reality (VR) structure, and FIG. 16C is a cross-sectional view of an augmented reality (AR) structure.

As will be aware of it from FIG. 16A, a head mounted display device according to present disclosure comprises a storage case 10 and a head mounted band 12.

The storage case 10 stores elements such as a display device, a lens array, and an ocular lens therein.

The head mounted band 12 is fixed to the storage case 10. The head mounted band 12 is formed to surround an upper surface and both sides of a user's head, but is not limited to this example. The head mounted band 12 is to fix a head mounted display to a user's head and may be replaced with a structure of a shape of a glasses frame or a helmet shape.

As will be aware of it from FIG. 16B, the head mounted display device 1 of a virtual reality (VR) structure according to the present disclosure may include a left eye display device 2a, a right eye display device 2b, a lens array 11, a left eye ocular lens 20a, and a right eye ocular lens 20b.

The left eye display device 2a, the right eye display device 2b, the lens array 11, the left eye ocular lens 20a and the right eye ocular lens 20b are stored in the storage case 10 described above.

The left eye display device 2a and the right eye display device 2b may display the same image, and in this case, a user may view 2D image. Alternatively, the left eye display device 2a may display a left eye image and the right eye display device 2b may display a right eye image, and in this case, a user may view a 3D image. Each of the left eye display device 2a and the right eye display device 2b may be comprised of a display device according to FIGS. 1 to 14 described above. For example, each of the left eye display device 2a and the right eye display device 2b may be an organic light emitting display device.

Each of the left eye display device 2a and the right eye display device 2b may include a plurality of subpixels, a circuit element layer 3, a first electrode 4, a first bank 5, an organic light emitting layer 6, a second electrode 7, an encapsulation layer 8, and a second bank 9, and may display various images by combining colors of light emitted from each of the subpixels in various manners.

The lens array 11 may be provided between the left eye ocular lens 20a and the left eye display device 2a by being spaced apart from each of the left eye ocular lens 20a and the left eye display device 2a. That is, the lens array 11 may be arranged in front of the left eye ocular lens 20a and behind the left eye display device 2a. Also, the lens array 11 may be provided between the right eye ocular lens 20b and the right eye display device 2b by being spaced apart from each of the right eye ocular lens 20b and the right eye display device 2b. That is, the lens array 11 may be arranged in front of the right eye ocular lens 20b and behind the right eye display device 2b.

The lens array 11 may be a micro lens array. The lens array 11 may be replaced with a pin hole array. Due to the lens array 11, images displayed on a left eye display device 2a or a right eye display device 2b may be viewed to be magnified to a user.

A left eye LE of a user may be arranged in the left eye ocular lens 20a, and a right eye RE of a user may be arranged in the right eye ocular lens 20b.

As will be aware of it from FIG. 16C, a head mounted display device of an AR structure according to the present disclosure includes a left eye display device 2a, a lens array 11, a left eye ocular lens 20a, a transmissive reflection portion 13, and a transmissive window 14. Although only a structure for a left eye is shown in FIG. 16C for convenience, a structure for a right eye is the same as the structure for the left eye.

The left eye display device 2a, the lens array 11, the left eye ocular lens 20a, the transmissive reflection portion 13, and the transmissive window 14 are stored in the aforementioned storage case 10.

The left eye display device 2a may be arranged at one side of the transmissive reflection portion 13, for example, at an upper side, without covering the transmissive window 14. Therefore, the left eye display device 2a may provide the transmissive reflection portion 13 with an image without covering an outer background viewed through the transmissive window 14.

The left eye display device 2a may be comprised of an electroluminescence display device according to FIGS. 1 to 14 described above. In this case, the top portion corresponding to the surface where images are displayed in FIGS. 1 to 14, for example, the encapsulation layer 8 or a color filter layer (not shown) faces the transmissive reflection portion 13.

The lens array 11 may be provided between the left eye ocular lens 20a and the transmissive reflection portion 13.

A left eye of a user is arranged in the left eye ocular lens 20a.

The transmissive reflection portion 13 is arranged between the lens array 11 and the transmissive window 14. The transmissive reflection portion 13 may include a reflective surface 13a which transmits a portion of light and reflects another portion of light. The reflective surface 13a is formed to allow an image displayed on the left eye display device 2a to proceed to the lens array 11. Therefore, a user may view all of images displayed on the left eye display device 2a and an outer background through the transmissive window 14. That is, since the user may view one image by overlapping background in reality with virtual images, augmented reality (AR) may be embodied.

The transmissive window 14 is arranged in front of the transmissive reflection portion 13.

It will be apparent to those skilled in the art that the present disclosure described above is not limited by the above-described aspects and the accompanying drawings and that various substitutions, modifications, and variations can be made in the present disclosure without departing from the spirit or scope of the disclosure. Consequently, the scope of the present disclosure is defined by the accompanying claims, and it is intended that all variations or modifications derived from the meaning, scope, and equivalent concept of the claims fall within the scope of the present disclosure.

What is claimed is:

1. A display device comprising:
   a substrate provided with a first subpixel and a second subpixel adjacent to the first subpixel;
   a first electrode provided on the substrate, including a first sub electrode provided on the first subpixel and a second sub electrode provided on the second subpixel;
   an organic light emitting layer including a first organic light emitting layer arranged on the first sub electrode and a second organic light emitting layer arranged on the second sub electrode;
   a second electrode arranged on the organic light emitting layer; and
   a first bank provided between the first sub electrode and the second sub electrode and partitioning the first subpixel from the second subpixel,
   wherein the first organic light emitting layer includes a first light emitting layer and a first hole transporting layer arranged on the first light emitting layer,
   wherein the first hole transporting layer includes a first sub hole transporting layer and a second sub hole transporting layer,
   wherein the first sub hole transporting layer covers the first light emitting layer and the second sub hole transporting layer covers the first sub hole transporting layer,
   wherein the second organic light emitting layer includes a second light emitting layer and a second hole transporting layer arranged on the second light emitting layer,
   wherein the second hole transporting layer includes a third sub hole transporting layer, and
   wherein the second sub hole transporting layer is a continuous layer covering both the first sub hole transporting layer and the third sub hole transporting layer.

2. The display device of claim 1, wherein the first organic light emitting layer includes:
   a first electron injecting layer and a first electron transporting layer, which are arranged below the first light emitting layer, and
   a third hole transporting layer and a first hole injecting layer, which are arranged above the second sub hole transporting layer, and
   wherein both ends of the first electron injecting layer, the first electron transporting layer, the first light emitting layer, and the first sub hole transporting layer are matched with each other.

3. The display device of claim 2, wherein the second organic light emitting layer includes:
   a second electron injecting layer, a second electron transporting layer, which are arranged below the second light emitting layer, and
   a fourth hole transporting layer and a second hole injecting layer, which are arranged above the second sub hole transporting layer,
   wherein the first subpixel includes the first electron injection layer, the first electron transporting layer, the first light emitting layer, the first hole transporting layer including the first sub hole transporting layer and the second sub hole transporting layer, the third hole transporting layer and the first hole injecting layer of the first organic light emitting layer,
   wherein the second subpixel includes the second electron injection layer, the second electron transporting layer, the second light emitting layer, the second hole transporting layer including the third sub hole transporting layer and the second sub hole transporting layer, the fourth hole transporting layer and the second hole injecting layer of the second organic light emitting layer, and
   wherein the first electron injecting layer, the first electron transporting layer, the first light emitting layer and the first sub hole transporting layer of the first organic light emitting layer are respectively spaced apart from the second electron injecting layer, the second electron transporting layer, the second light emitting layer and the third sub hole transporting layer of the second organic light emitting layer.

4. The display device of claim 2, wherein the second organic light emitting layer includes:
- a second electron injecting layer, a second electron transporting layer, which are arranged below the second light emitting layer, and
- a fourth hole transporting layer and a second hole injecting layer, which are arranged above the second sub hole transporting layer,
- wherein the first subpixel includes the first electron injection layer, the first electron transporting layer, the first light emitting layer, the first hole transporting layer including the first sub hole transporting layer and the second sub hole transporting layer, the third hole transporting layer and the first hole injecting layer of the first organic light emitting layer,
- wherein the second subpixel includes the second electron injection layer, the second electron transporting layer, the second light emitting layer, the second hole transporting layer including the third sub hole transporting layer and the second sub hole transporting layer, the fourth hole transporting layer and the second hole injecting layer of the second organic light emitting layer, and
- wherein the third hole transporting layer and the first hole injecting layer of the first organic light emitting layer are connected with the fourth hole transporting layer and the second hole injecting layer of the second organic light emitting layer.

5. The display device of claim 3, wherein the substrate includes a third subpixel adjacent to one side of the second subpixel,
- wherein the first electrode includes a third sub electrode provided on the substrate and provided in the third subpixel,
- wherein the organic light emitting layer includes a third organic light emitting layer arranged on the third sub electrode,
- wherein the third organic light emitting layer includes a third electron injecting layer, a third electron transporting layer, a third light emitting layer, a fifth hole transporting layer including a fourth sub hole transporting layer covered by the second sub hole transporting layer, a sixth hole transporting layer, and a third hole injecting layer,
- wherein the third subpixel includes the third electron injection layer, the third electron transporting layer, the third light emitting layer, the fifth hole transporting layer including the fourth sub hole transporting layer and the second sub hole transporting layer, the sixth hole transporting layer and the third hole injecting layer of the third organic light emitting layer, and
- wherein the fourth sub hole transporting layer of the third organic light emitting layer covers the third light emitting layer of the third organic light emitting layer between the third light emitting layer of the third organic light emitting layer and the second sub hole transporting layer.

6. The display device of claim 1,
- wherein the first organic light emitting layer includes:
  - a first electron injecting layer and a first electron transporting layer, which are arranged below the first light emitting layer, and
  - a third hole transporting layer and a first hole injecting layer, which are arranged above the second sub hole transporting layer,
- wherein the second organic light emitting layer includes:
  - a second electron injecting layer, a second electron transporting layer, a second light emitting layer, a second hole transporting layer including a third sub hole transporting layer covered by the second sub hole transporting layer, a fourth hole transporting layer and a second hole injecting layer, and
  - wherein the first electron injecting layer, the first electron transporting layer, the second sub hole transporting layer, the second hole transporting layer and the first hole injecting layer of the first organic light emitting layer are respectively connected with the second electron injecting layer, the second electron transporting layer, the second sub hole transporting layer, the fourth hole transporting layer and the second hole injecting layer of the second organic light emitting layer.

7. The display device of claim 6, wherein the first sub hole transporting layer of the first organic light emitting layer is in contact with the first electron transporting layer of the first organic light emitting layer while covering an upper surface and a side of the first organic light emitting layer.

8. The display device of claim 6, wherein the first light emitting layer and the first sub hole transporting layer of the first organic light emitting layer are spaced apart from the second light emitting layer and the third sub hole transporting layer of the second organic light emitting layer.

9. The display device of claim 5, wherein the first sub hole transporting layer of the first organic light emitting layer, the third sub hole transporting layer of the second organic light emitting layer and the fourth sub hole transporting layer of the third organic light emitting layer are respectively provided with their respective thicknesses different from one another.

10. The display device of claim 5, further comprising:
- a first lifetime improvement layer arranged between the first sub hole transporting layer and the second sub hole transporting layer of the first organic light emitting layer;
- a second lifetime improvement layer arranged between the third sub hole transporting layer and the second sub hole transporting layer of the second organic light emitting layer; and
- a third lifetime improvement layer arranged between the fifth sub hole transporting layer and the second sub hole transporting layer of the third organic light emitting layer,
- wherein the first lifetime improvement layer enhances electron withdrawing and hole injection toward the first light emitting layer of the first organic light emitting layer,
- wherein the second lifetime improvement layer enhances electron withdrawing and hole injection toward the second light emitting layer of the second organic light emitting layer, and
- wherein the third lifetime improvement layer enhances electron withdrawing and hole injection toward the third light emitting layer of the third organic light emitting layer.

11. The display device of claim 10, wherein the first lifetime improvement layer is arranged only on an upper surface of the first sub hole transporting layer of the first organic light emitting layer,
- wherein the second lifetime improvement layer is arranged only on an upper surface of the third sub hole transporting layer of the second organic light emitting layer, and wherein the third lifetime improvement layer is arranged only on an upper surface of the fourth sub hole transporting layer of the third organic light emitting layer.

12. The display device of claim 10, wherein each of the first lifetime improvement layer, the second lifetime improvement layer, and the third lifetime improvement layer is polymer that includes F, O and N.

13. The display device of claim 10, wherein each thickness of the first lifetime improvement layer, the second lifetime improvement layer, and the third lifetime improvement layer ranges from 1 nm to 10 nm.

14. The display device of claim 6, further comprising:
a first lifetime improvement layer arranged between the first sub hole transporting layer and the second sub hole transporting layer of the first organic light emitting layer; and
a second lifetime improvement layer arranged between the third sub hole transporting layer and the second sub hole transporting layer of the second organic light emitting layer,
wherein the first lifetime improvement layer enhances electron withdrawing and hole injection toward the first light emitting layer of the first organic light emitting layer, and
wherein the second lifetime improvement layer enhances electron withdrawing and hole injection toward the second light emitting layer of the second organic light emitting layer.

15. The display device of claim 14, wherein the first lifetime improvement layer is arranged on an upper surface and a side of the first sub hole transporting layer of the first organic light emitting layer, and the second lifetime improvement layer is arranged on an upper surface and a side of the third sub hole transporting layer of the second organic light emitting layer.

16. The display device of any one of claim 1, further comprising a lens array spaced apart from the substrate, and a storage case storing the substrate and the lens array.

17. The display device of any one of claim 1, wherein the first electrode is a cathode electrode, the second electrode is an anode electrode, and the first electrode is connected with a source electrode or a drain electrode of a thin film transistor.

18. The display device of any one of claim 1, wherein the first sub hole transporting layer and the second sub hole transporting layer are made of a same material.

19. The display device of claim 2, wherein the second sub hole transporting layer and the second hole transporting layer are made of their respective materials different from each other.

20. The display device of any one of claim 1, wherein a difference between LUMO energy level of the first sub hole transporting layer and LUMO energy level of the second sub hole transporting layer is 0.2 eV or higher and 0.5 eV or lower, and
wherein a difference between HOMO energy level of the first sub hole transporting layer and HOMO energy level of the second sub hole transporting layer is 0.2 eV or higher and 0.5 eV or lower.

\* \* \* \* \*